United States Patent [19]

Itakura et al.

[11] Patent Number: 5,399,992
[45] Date of Patent: Mar. 21, 1995

[54] AMPLIFIER DEVICE CAPABLE OF PERFORMING HIGHLY EFFICIENT OPERATION AT LOW POWER

[75] Inventors: Tetsuro Itakura, Fujisawa; Hiroshi Tanimoto, Kawasaki, both of Japan

[73] Assignee: Kabushiki Kaisha Toshiba, Kawasaki, Japan

[21] Appl. No.: 152,887

[22] Filed: Nov. 16, 1993

Related U.S. Application Data

[63] Continuation of Ser. No. 774,184, Oct. 9, 1991, abandoned.

[30] Foreign Application Priority Data

Oct. 9, 1990 [JP] Japan ................................ 2-271392
Jul. 25, 1991 [JP] Japan ................................ 3-208564

[51] Int. Cl.[6] ........................................... H03F 3/45
[52] U.S. Cl. ................................. 330/257; 330/253
[58] Field of Search ............... 330/257, 253, 261, 252

[56] References Cited

U.S. PATENT DOCUMENTS

| | | | |
|---|---|---|---|
| 4,383,223 | 5/1983 | Ulmer | 330/257 |
| 4,458,212 | 7/1984 | Brehmer et al. | 330/257 |
| 4,502,019 | 2/1985 | VanRoermund | 330/261 |
| 4,829,266 | 5/1989 | Pernici et al. | 330/257 |
| 4,881,045 | 11/1989 | Dillman | 330/257 |
| 4,897,612 | 1/1990 | Carroll | 330/253 |
| 4,912,425 | 3/1990 | Kobayashi et al. | 330/253 |

FOREIGN PATENT DOCUMENTS

635617 1/1983 Japan.

OTHER PUBLICATIONS

DeGrauwe, et al., "Adaptive Biasing CMOS Amplifiers", *IEEE Journal of Solid–State Circuits*, vol. SC–17, No. 3, Jun. 1982.
Saari, V. R., "Low-Power High-Drive CMOS Operational Amplifiers", *IEEE Journal of Solid–State Circuits*, vol. SC–18, No. 1, Feb. 1983.
Callewaert, et al., "Class AB CMOS Amplifiers with High Efficiency", *IEEE Journal of Solid–State Circuits*, vol. 25, No. 3, Jun. 1990.

*Primary Examiner*—Robert J. Pascal
*Assistant Examiner*—Tan Dinh
*Attorney, Agent, or Firm*—Foley & Lardner

[57] ABSTRACT

An amplifier device includes: a current amplifier element for amplifying an output current delivered to a capacitive load, such as, for example, a liquid crystal panel in dependency upon changes of the voltage of an input signal; an element for determining the state of changes in the input signal; and a control element for controlling the current amplifier element depending upon the state of changes in the input signal determined by the determination element in order to improve the output driving capability for the load. This amplifier device is applicable to an amplifier in a narrow sense and a buffer circuit in accordance with the mode of amplification. The former may include the configuration in which a second bias circuit for adding a bias current when the driving capability is required to be enhanced is provided in addition to an elementary bias circuit, and the configuration in which a first output drive element and the second output drive element and a plurality of output drive elements succeeding thereto are provided for additionally carrying out switching between incremental output currents. The latter may be classified into two types depending upon whether or not the potential difference element provided on the output side of the buffer circuit to detect a potential difference between the input and the output to add the output current when the the potential difference thus detected is above the threshold level.

20 Claims, 36 Drawing Sheets

AMPLIFIER DEVICE CAPABLE OF PERFORMING HIGHLY EFFICIENT OPERATION AT LOW POWER

This application is a continuation of application Ser. No. 07/774,184, filed Oct. 9, 1991, now abandoned.

BACKGROUND OF THE INVENTION

This invention relates to an amplifier device such as an amplifier circuit or a buffer circuit, etc. capable of performing an efficient amplifying operation even by a low power consumption, and more particularly to an amplifier device for driving capacitive load, etc. such as, for example, an image display, etc. using a liquid crystal panel.

For the amplifier, the slew rate is one of the significant factors determining the performance of the circuit. Namely, it is very important to provide a high slew rate for the amplifier. While the slew rate can be improved by increasing a bias current delivered to the amplifier stage, the power consumption increases accordingly if a bias current is caused to be increased. Thus, various attempts have been conventionally made in order to solve this problem.

For the amplifier for driving a capacitive load, etc., there are two kinds of amplifiers: one is directed to a signal sampled in time and subject to level changes every fixed period in a switched capacitor network, etc.; the other is directed to a signal completely non-periodically subject to level changes.

For the prior art related to the amplifier of the former type, on pp. 257 (final paragraph) to 259 of 'Analog MOS Integrated Circuits For SIGNAL PROCESSING', Roubik Gregorian, et al., John Wiley & Sons 1986, the operation of an operational amplifier having clock controlled bias means is described and the circuit diagrams thereof are shown in FIG. 4. 129 and FIG. 4 130.

In these conventional circuits, an approach is employed to control the bias current so that the output current driving capability is high at the beginning of the clock period and the operating current is equal to zero at the end of the clock period to increase the output current driving capability only when high response is required because there occurs changes in the signal level, and to allow the operating current to be equal to zero when there is no change in the signal level, thus to advantageously provide both the high slew rate and low power consumption.

However, the fact that the operating current is equal to zero when there is no change in the signal level implies that the output is in a high impedance state. Therefore, such conventional circuits are disadvantageously apt to undergo the influence of disturbance on the load side when the output level is in a high impedance state.

To avoid this drawback, there is proposed in U.S. Pat. No. 4,502,019 a system in which a constant current source is added to allow a small quantity of current to flow even when there is no change in the level of an input signal, thus preventing the output level from being brought into a high impedance state.

Further, an example of the conventional amplifiers similar to the above-mentioned prior art is shown in FIG. 1. This amplifier is provided for delivering a drive power to a liquid crystal panel 20 as a capacitive load, and includes a buffer section of the voltage-follower type using first and second amplifier circuits 21 and 22.

The liquid crystal panel comprises a liquid crystal cell LC as a capacitive load, a MOS type transistor TFT, and a capacitor C100 of a signal line having a value of 40–200 pF. Further, the amplifier includes two switches SWc and SWd turned ON and OFF by an INH signal, and a capacitor C101 for storing a phase compensation capacitance. In addition, the above-mentioned amplifier circuit 22 includes a very small current source I0 and a MOS type transistor M220.

The operation of the amplifier shown in FIG. 1 will now be described. Immediately before an input signal shown in FIG. 2(c) varies, the switches SWc and SWd are closed by an INH signal (see FIG. 2(b)). As a result, the input terminal voltage and the output terminal voltage are once reset to VDD (FIG. 2(d)). Then, the switches SWc and SWd are opened by the INH signal in correspondence with the timing at which the input signal varies. Thus, the buffer section (amplifier circuits 21 and 22) is normally cased to be operative.

As described above, when the input and output terminal voltages are both once reset to VDD, the output voltage is dropped from VDD to a voltage following the input voltage, and is stabilized thereat. The slew rate at this time is determined by the phase compensation capacitance C101 and the output current of the first amplifier circuit 21. The reason therefor is that a sink current of the output transistor M220 of the second amplifier circuit 22 is determined by the gate voltage of the transistor M220. Accordingly, settling time required until the output voltage is brought into a stable state following the input can be shortened.

If the output voltage is not reset to VDD, the change in falling of the output voltage is the same as stated above, but the change in rising of the output voltage becomes dependent upon any slow one of the slew rate determined by the phase compensation capacitance C101 and the output current of the first amplifier circuit and the slew rate determined by the current source I0 of the second amplifier circuit 22 and the capacitance of a load connected to the output side of the current source I0. In order to allow the slew rate determined by the the current source I0 and the load capacitance to be high, it is required to set in advance the current of the current source I0. However, once the output is stabilized, all the currents from the current source I0 flow into the output transistor M220, and are uselessly consumed.

However, in accordance with the amplifier of FIG. 1, an instantaneous current flowing on the VDD line when the switches SWc and SWd are closed by the INH signal becomes extremely large. In an IC for driving a liquid display panel including a large number of buffer sections constructed as above, the power supply voltage undergoes the influence such as voltage drop, etc. based on the resistance component of the VDD line by that large instantaneous current, resulting in bad influence on the circuit operation of the amplifier. This is not preferable for insuring reliability.

Even if a circuit device is made as in disclosed in U.S. Pat. No. 4,502,019, in uses where many amplifiers are mounted on one chip to provide outputs at the same time, e.g., as in a drive IC of a liquid crystal display, an impulse like noise by the voltage drop of the power supply line inside and outside IC, etc. results because of a large instantaneous current at the beginning of the clock period. This results in an erroneous operation or deterioration in reliability due to migration on the power supply line, etc. inside the IC. This is disadvantageous to the implementation of an IC.

For the buffer circuit directed to a signal completely non-periodically subject to level changes, there have been conventionally proposed a variety of circuits which attempt to reduce current consumption. The following references provide examples: a circuit (first prior art embodiment) shown in FIG. 3 of 'Class AB CMOS Operational Amplifier with Very High Efficiency', L., Callewaert, Katholieke Uniivesiteit Leuven, Elec. Eng. Dept. Annual Report-1188; a circuit (second prior art embodiment) shown in FIG. 1 of 'Low-Power High-Drive CMOS Operational Amplifiers', V. R., Saari, IE3 ISSC vol SC-18, No. 1, Feb., 1983; and a circuit (third prior art embodiment) shown in FIG. 3 of 'Adaptive Biasing CMOS Amplifiers', M. G., Degrauweel IE 3 JSSC vol. SC-17, No. 3 June 1982.

These circuits are adapted to control the operating current in the circuit by the magnitude of the differential input amplitude or the magnitude of the differential amplitude in the amplifier. Namely, when the differential input amplitude is large, the output current driving capability is increased, while when the differential input is small, the driving capability is decreased. Thus, the power consumption is reduced.

However, in the case of the first and third prior art embodiment, the number of elements is considerably increased, resulting in large circuit scale. This is also disadvantageous to the implementation of an IC. Further, in the second prior art embodiment, because the number of capacitors is large, a large area is required when the circuit is constructed as an IC. This is also disadvantageous to the implementation of an IC.

As stated above, while the conventional amplifier can provide a high slew rate at a low power consumption, they have circuit configurations which are disadvantageous to the implementation of an IC.

SUMMARY OF THE INVENTION

This invention has been made in view of the above-mentioned problems with the prior arts and its principal object is to provide an amplifier device capable of providing a high slew rate without allowing the circuit configuration to be disadvantageous to the implementation of an IC.

Another object of the this invention is to provide an amplifier device capable of improving a driving performance of an output, specifically a slew rate, by changing an entire bias current.

To achieve the above-mentioned object, an amplifier device according to this invention includes current amplifying means for delivering, to a capacitive load, an output current amplified in accordance with changes in the voltage of an input signal; detection means for detecting how the input signal changes; and control means for controlling the amplifying means in accordance with a detected value so as to allow the driving capability with respect to the load of the output current to be improved.

As a first aspect of this invention, in the case where an amplifier in a broad sense is constituted by an amplifier circuit in a narrow sense, this amplifier circuit includes control means for changing over a bias current having current values of more than two levels depending upon changes in the input signal to thereby control the amplifier means.

As a second aspect of this invention, in the case where an amplifier in a broad sense is constituted by a buffer circuit, this buffer circuit includes: amplifier means whose output signal changes in accordance with changes in the level of an input signal, detection means for judging whether or not a potential difference between the input signal and the output signal exceeds a threshold value; and current compensation means for adding an operating current to an output current of the amplifier means when the potential difference is above the threshold value.

In a configuration embodying the above-mentioned first aspect of the invention, the amplifier circuit includes: amplifier circuit means having an input amplifier stage and an output stage, and such that the output current driving capability can be controlled by a bias current; first bias means for delivering, to the amplifier circuit means, a fixed bias current at all times; and second bias means for intermittently delivering in an ON/OFF manner, to the amplifier circuit means, a bias current by a control signal in a manner in parallel to the first bias means.

More particularly, in another configuration embodying the first aspect of the invention, the amplifier circuit includes: amplifier circuit means including a plurality of the first to the n-th (n is equal to 2 or more) output drive elements driven by the input amplifier stage connected in parallel such that the first output drive element is driven at all times by the input amplifier stage, and the second to the n-th output drive elements are switched in an ON/OFF manner by the input amplifier stage; and output drive element control means for controlling in an ON/OFF manner the second to the n-th output drive elements by a control signal to thereby allow the second output drive element to be operative only when the level of the input signal changes.

Moreover, in the amplifier circuit, there is a feature that the control signal is in synchronism with a periodically varying input signal.

Further, in the amplifier circuit, there is a feature that the control signal is generated by control signal generator means supplied with an output from the input amplifier means as its input.

Furthermore, in the amplifier circuit, there is a feature that at least one of the bias currents delivered by the second bias means is delivered by first bias means, and is controlled by an output from the input amplifier stage.

In addition, in the amplifier circuit, there is a feature that the input amplifier stage includes a differential amplifier circuit.

In a configuration embodying the above-mentioned second aspect of the invention, the buffer circuit includes: amplifier circuit means whose output signal changes in in accordance with the level of an input signal; and a potential difference detection circuit means for detecting whether or not a potential difference between the input signal and the output signal is above the threshold value. When the potential difference is above the threshold value, the potential difference detection circuit means is turned ON to add its operating current to an output current of the amplifier circuit means.

More particularly, in the buffer circuit, the output driving capability control means includes a field effect transistor adapted so as to receive at its gate and to receive an output signal at its source. When a potential difference between the input signal and the output signal is above a threshold value between the gate and the source, the field effect transistor is turned ON to add at least one of the source current and the drain current to an output current from the amplifier circuit means.

In the buffer circuit of the second aspect of the invention, the output driving capability control means includes a bipolar transistor adapted so as to receive an input signal at its base and to receive an output signal at its emitter. When a potential difference between the input signal and the output signal is above a threshold value between the base and the emitter, the bipolar transistor is turned ON to add at least one of its emitter current and its collector current to an output current from the amplifier circuit means.

The buffer circuit of the second aspect of the invention includes potential shift means for shifting a potential of any one of the input signal and the output signal in a direction allowing a potential of the input signal to become close to the threshold value to deliver the potential thus shifted to the potential difference detection means.

In accordance with the above-described amplifier circuit of the first aspect of the invention, since driving capability of the amplifier circuit means is carried out depending upon whether or not a limited current is added to the operating current, the bias current can be smaller than an initial value in the conventional system and an instantaneous current can be reduced. Thus, reliability of the operation is improved. This becomes advantageous to the implementation of an IC.

Namely, first and second bias means, operative as a current source in parallel, are provided as the bias means for the amplifier circuit means to deliver at all times from the first bias means to the amplifier circuit means, and to deliver in an ON/OFF manner a bias current from the second bias means by a control signal. In other words, control of the driving capability of the amplifier circuit means depends upon whether or not a limited current is delivered by the ON/OFF control of the second bias circuit, the bias current can be smaller than an initial value in the conventional system and the value of instantaneous current can also become small.

Particularly, in this amplifier circuit, the first to the n-th (n is equal to 2 or more) output drive elements are provided in parallel as the output drive element driven by the input amplifier stage such that the first output drive element is driven by the input stage amplifier stage at all times and the second to the n-th output drive elements are driven in an ON/OFF manner by the input amplifier stage in accordance with a control signal. Accordingly, while the driving capability for a time period during which all drive elements are operative takes a maximum value, a current value at this time is limited. Thus, that current value can be smaller than an instantaneous current determined by an initial value of a bias current of the conventional system disclosed in U.S. Pat. No. 4,502,019, etc., to improve reliability of the operation. This is advantageous to the implementation of an IC.

Further, in accordance with the amplifier circuit, since the control signal can be easily generated outside the buffer circuit by a clock, etc. in synchronism with a period of a periodically changing input signal, the circuit hardly becomes large. This is advantageous to implementation of IC.

In addition, in accordance with the amplifier circuit, even in the case of a control signal synchronous with the period of a periodically changing input signal, since the magnitude of the bias current delivered from the second bias means is controlled depending upon an output from the input amplifier stage, when a quantity of changes in the input signal level is small, the bias current is not unnecessarily increased by the control signal even for a time period during which the output current driving capability is increased. Thus, power consumption can be further reduced.

In accordance with the buffer circuit of this invention according to the second aspect of the invention, as the means for allowing the operating current to be large only when the level of an input signal varies, there is provided a simple circuit for detecting a potential difference, which is turned ON to add the operating current to the output current from the amplifier circuit. As a result, there is no possibility that the number of elements is increased to a great degree, and that the circuit scale becomes large. This is advantageous to the implementation of an IC.

Particularly, in accordance with the buffer circuit of this invention according to the second aspect of the invention, since an approach is employed to shift one signal potential of any one of the input signal and the output signal in a direction allowing the potential of the input signal to become close to the threshold to deliver that signal potential thus shifted to the potential difference detection circuit means to thereby cause the threshold value to be seemingly small, the time period during which the potential difference between the input and output signals is prolonged accordingly. Thus, a higher slew rate can be provided.

As described above, in accordance with the amplifier circuit of this invention according to the first aspect of the invention, since control of the driving capability of the amplifier circuit means is carried out as to whether or not a limited current is added to the operating current, the bias current can be smaller than an initial value in the conventional system, so the instantaneous current can be small, thus improving reliability of the operation. This is advantageous to the implementation of an IC.

Further, in accordance with the amplifier circuit according to the first aspect of the invention, since the period of the control signal and the bias current from the second bias circuit are controlled depending upon an output from the input amplifier stage, power consumption can be further reduced.

Furthermore, in accordance with the buffer circuit of this invention according to the second aspect of the invention, as the means for allowing the operating current to be large only when the level of an input signal varies, there is provided a simple circuit for detecting a potential difference, which is turned ON to add the operating current to the output current from the amplifier circuit. As a result, there is no possibility that the number of elements is increased to a great degree, and that the circuit scale becomes large. This is advantageous to the implementation of an IC.

In accordance with the buffer circuit of this invention according to the second aspect of the invention, since an approach is employed to shift one signal potential of any one of the input signal and the output signal in a direction allowing the potential of the input signal to become close to the threshold to deliver that signal potential thus shifted to the potential difference detection circuit means to thereby cause the threshold value to be seemingly small, the time period during which the potential difference between the input and output signals is prolonged accordingly. Thus, a higher slew rate can be provided.

BRIEF DESCRIPTION OF THE INVENTION

Figure 44:
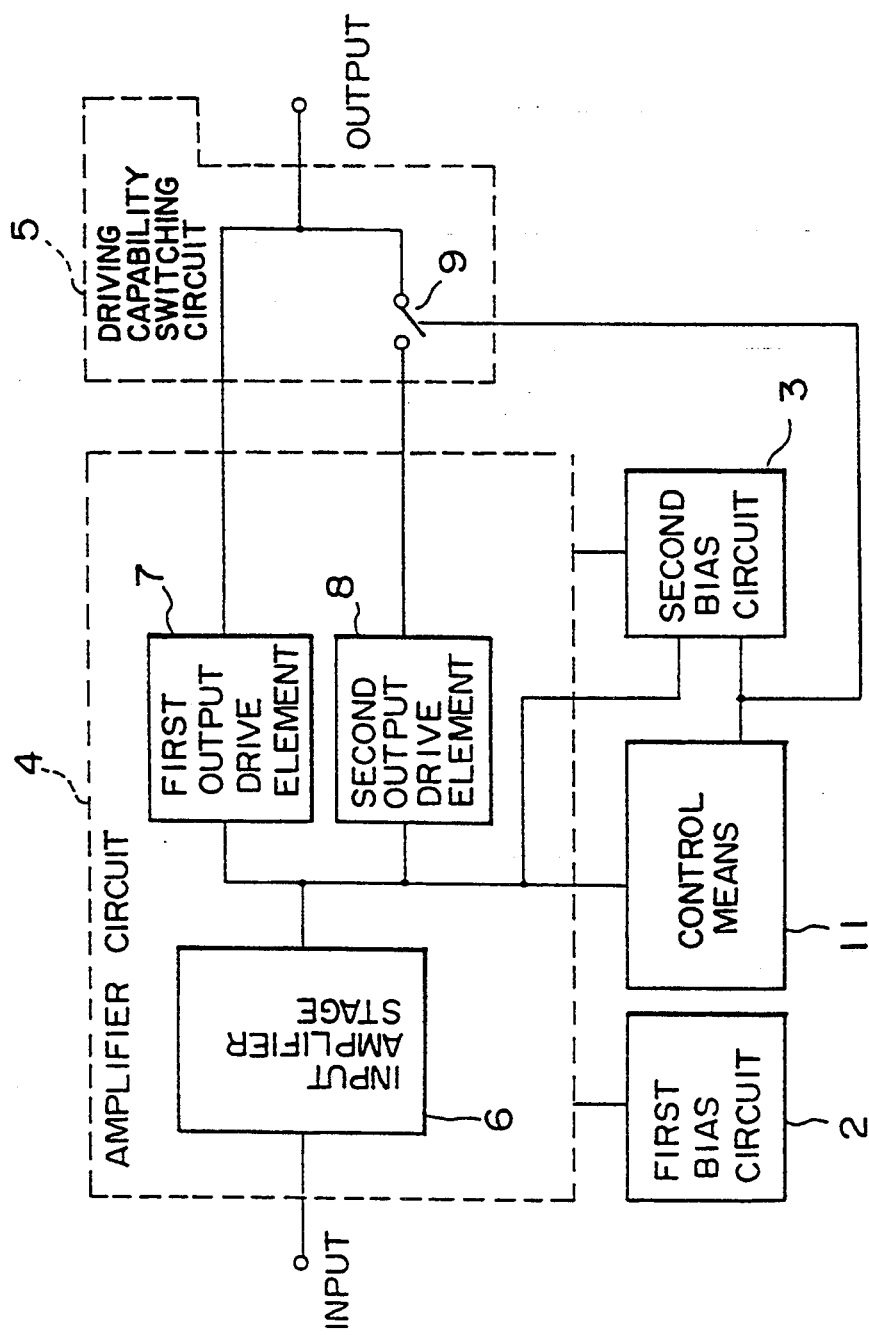
Figure 45:
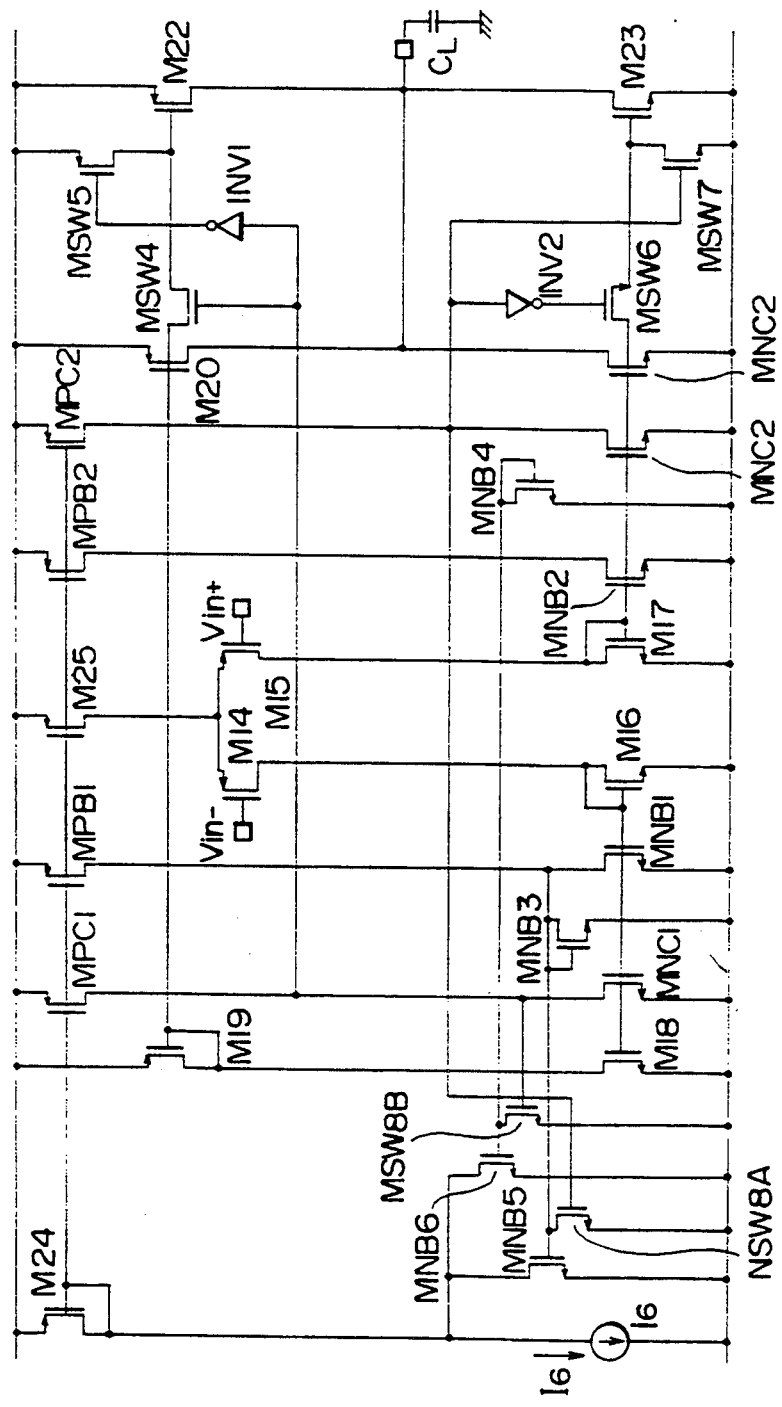
Figure 46:
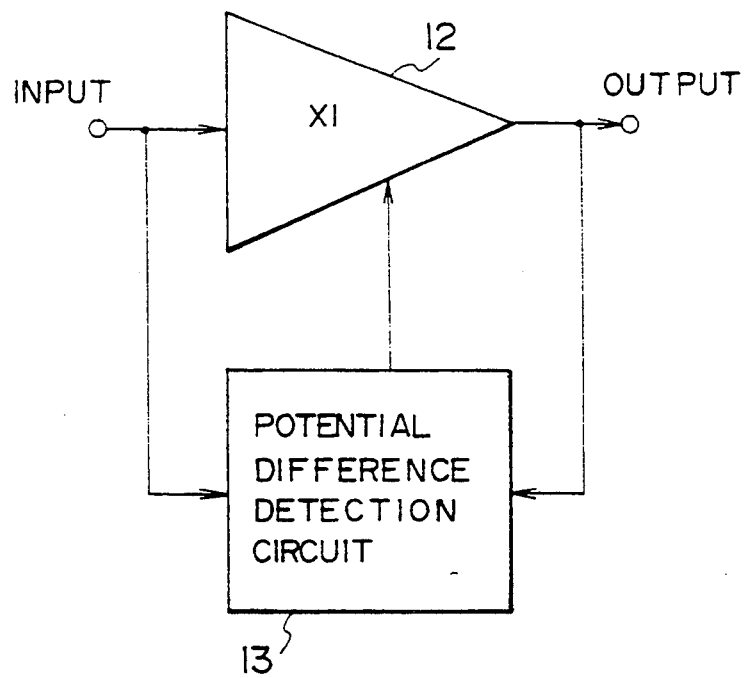
Figure 47:
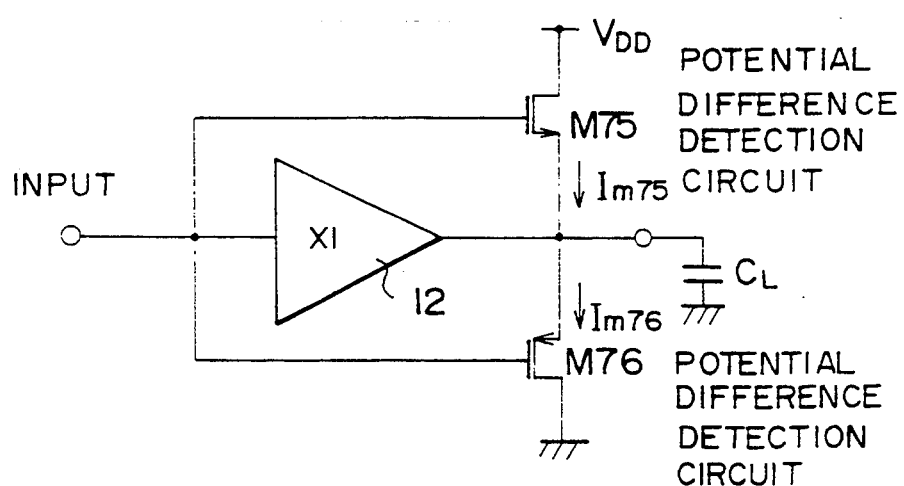
Figure 48:
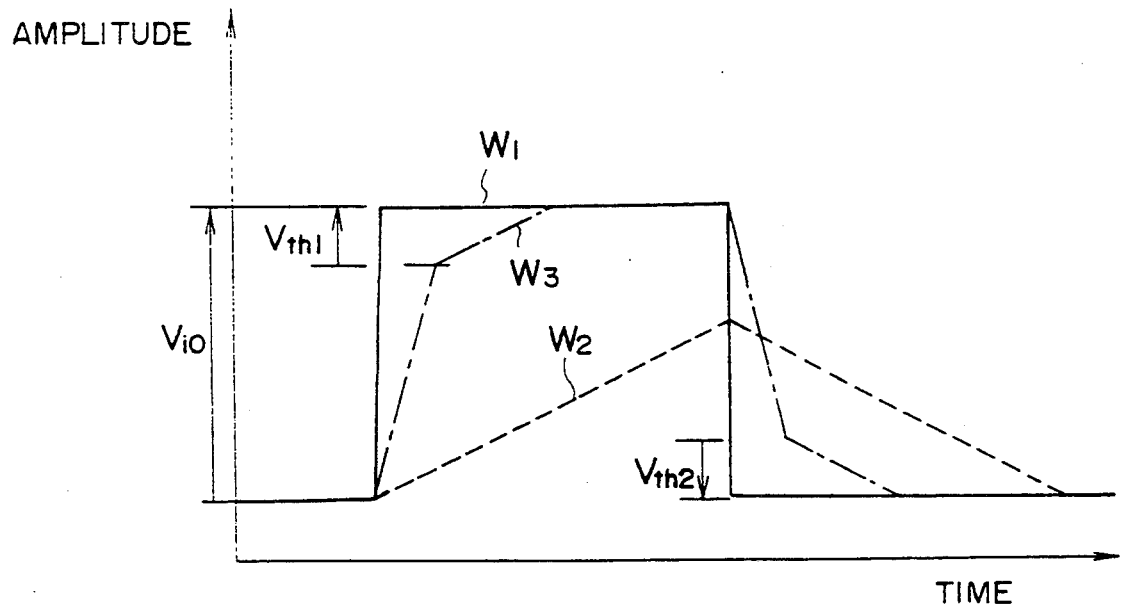
Figure 49:
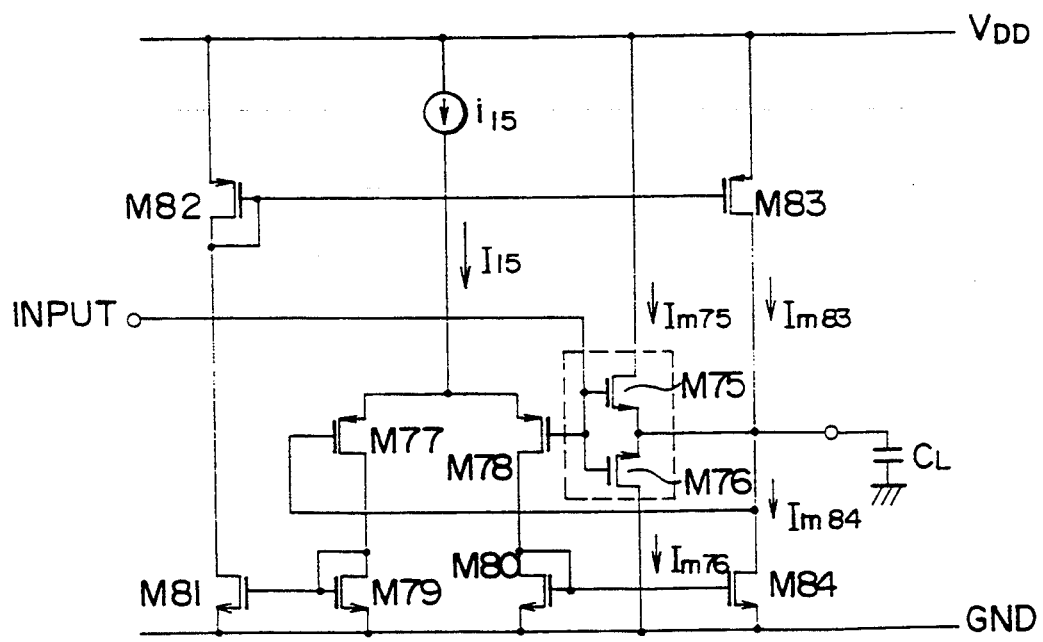
Figure 50:
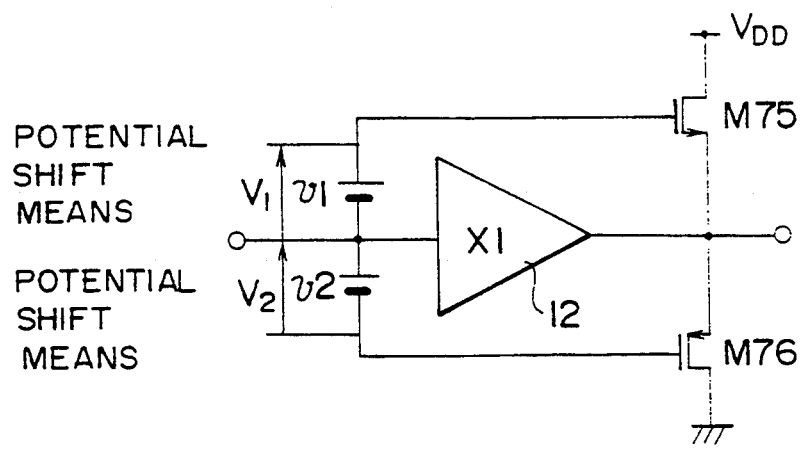
Figure 51:
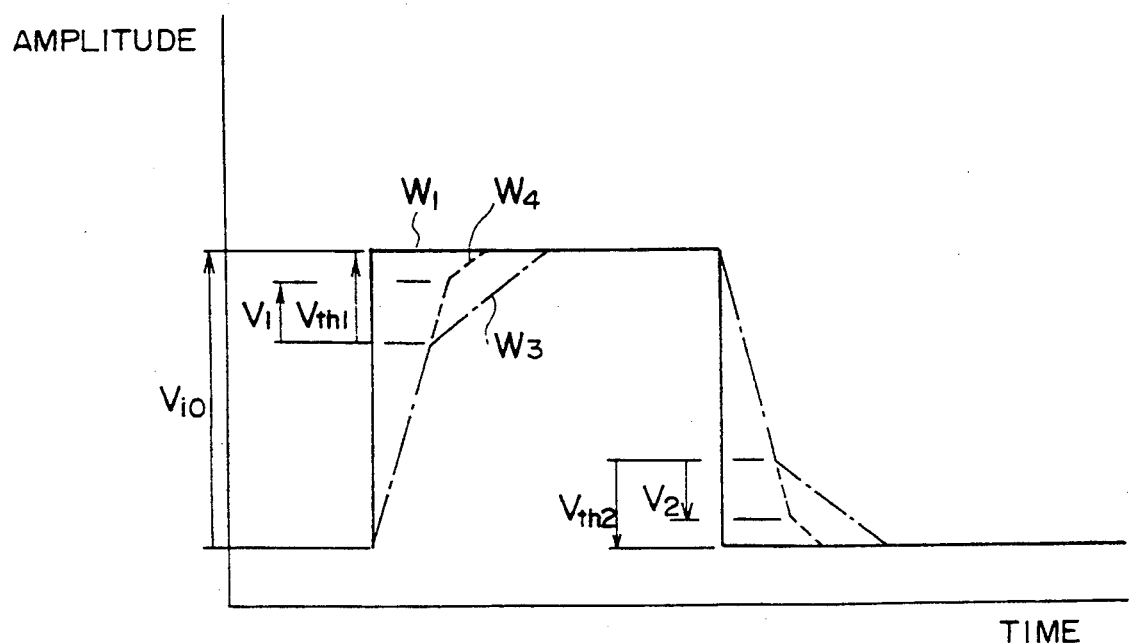
Figure 52:
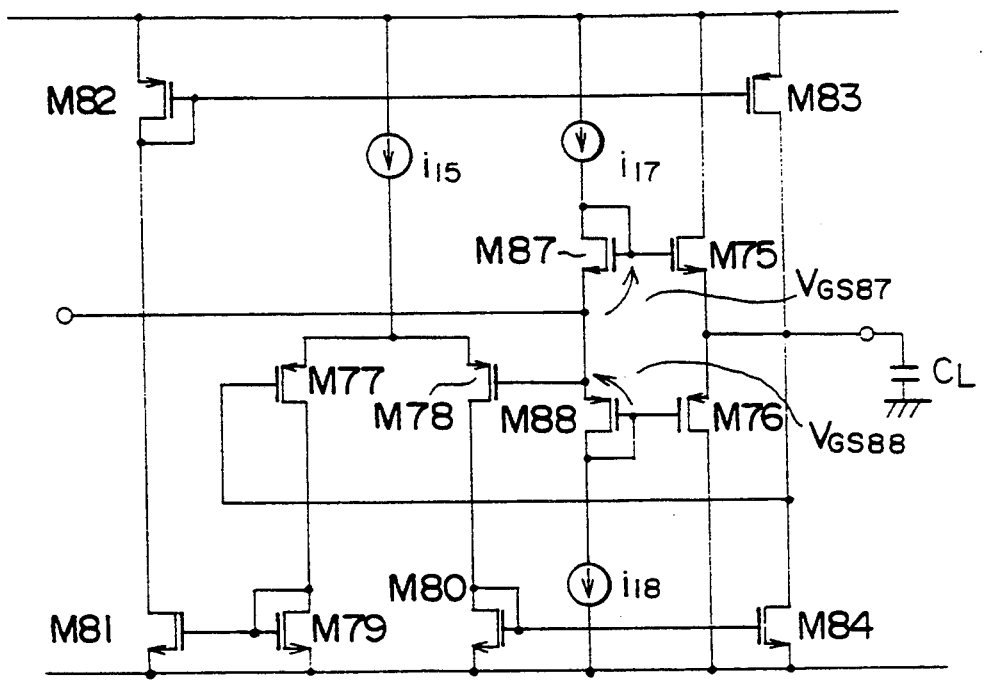
Figure 53:
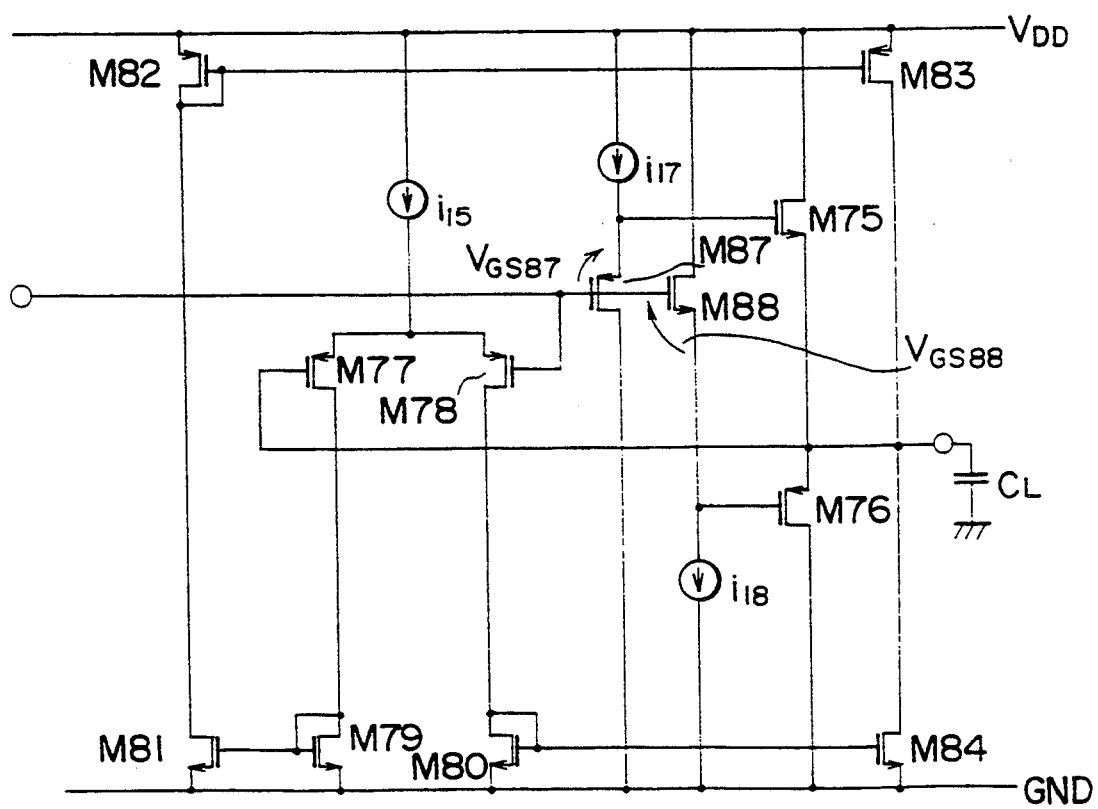
Figure 54:
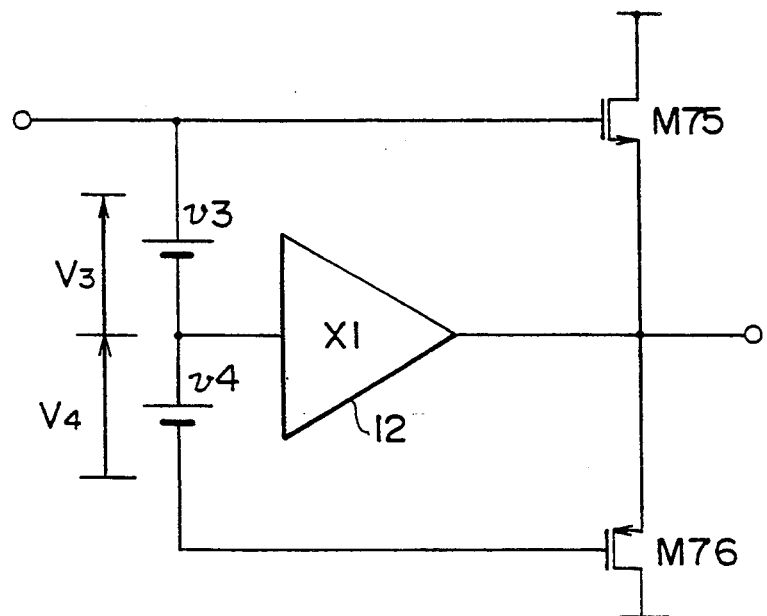
Figure 55:
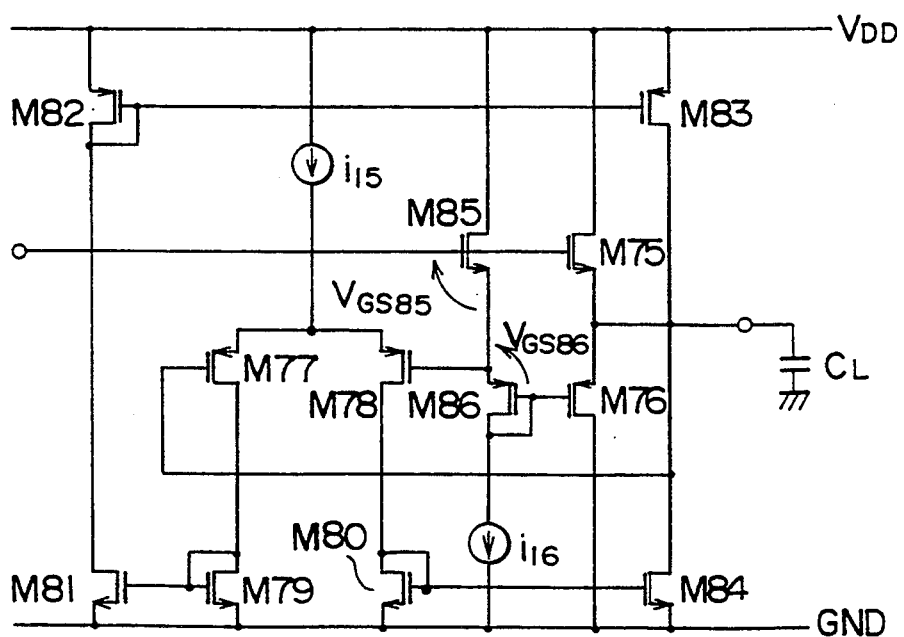
Figure 56:
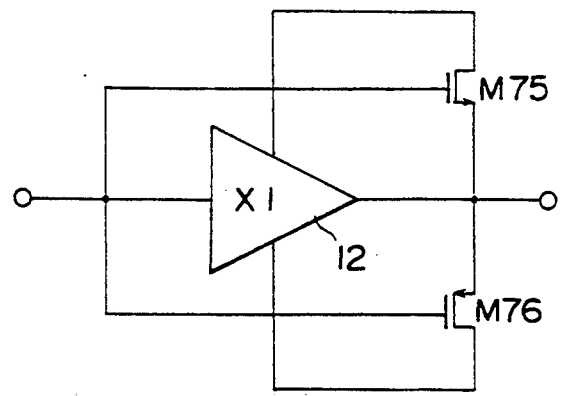
Figure 57:
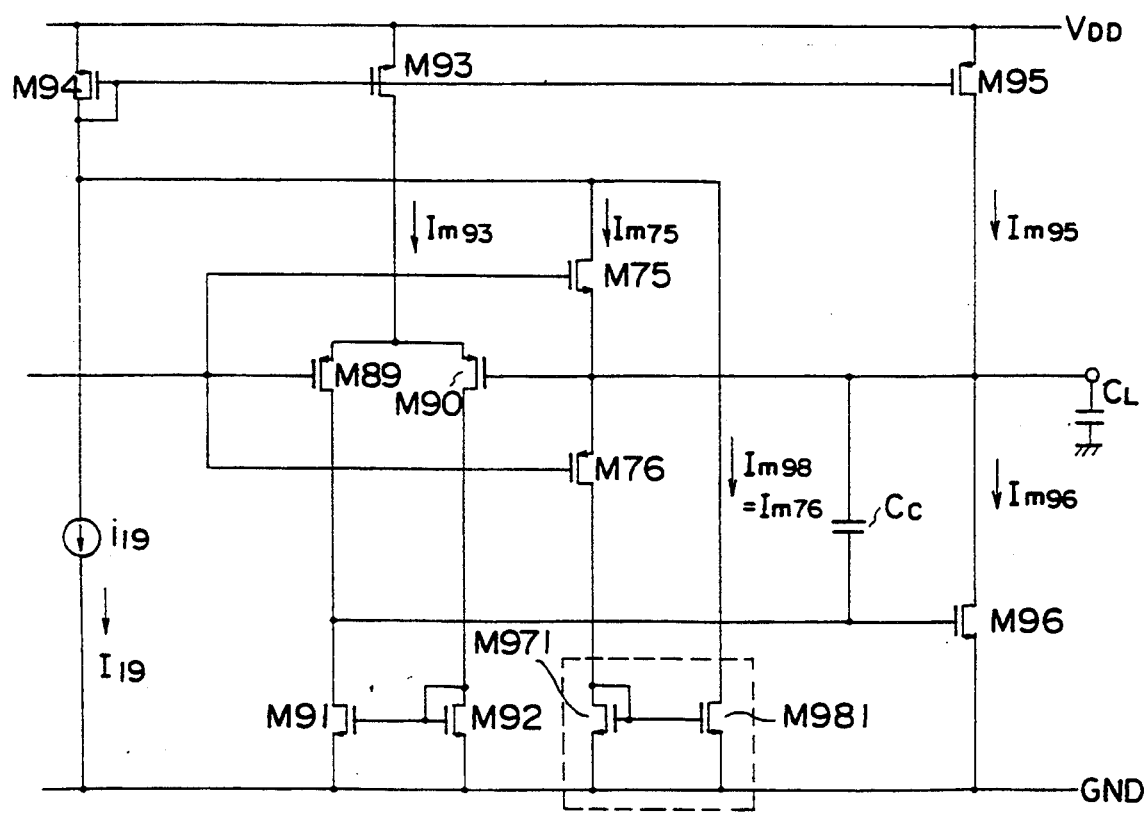
Figure 58:
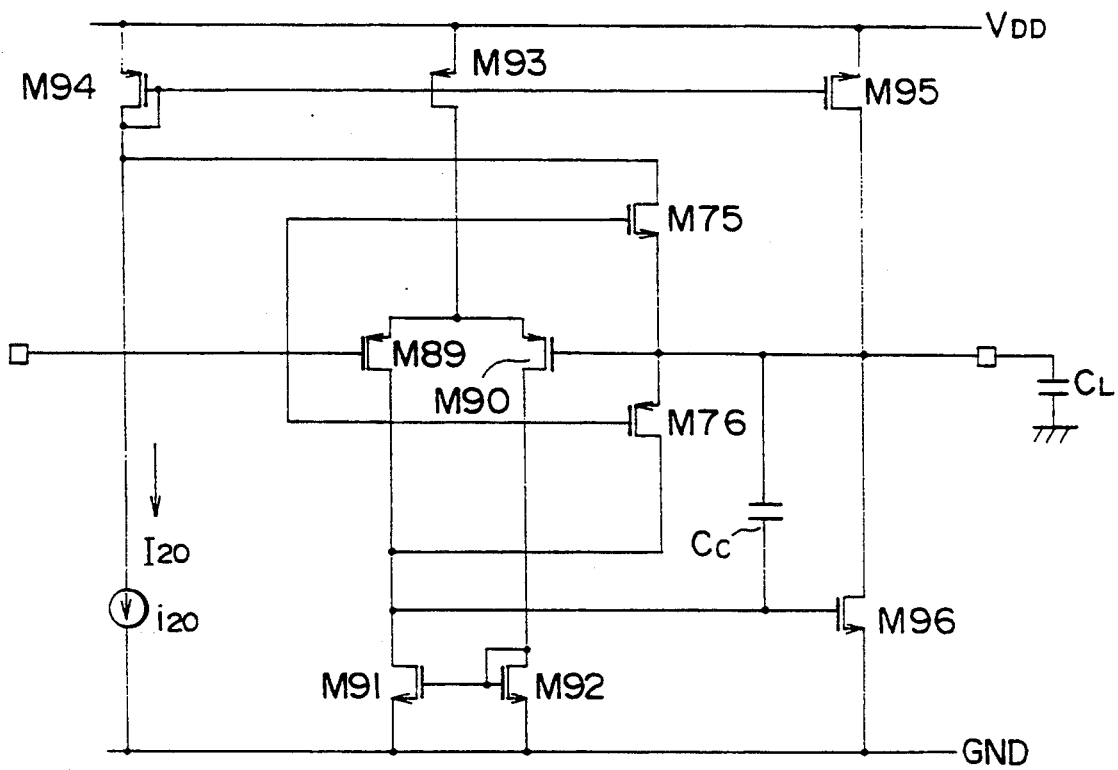
Figure 59:
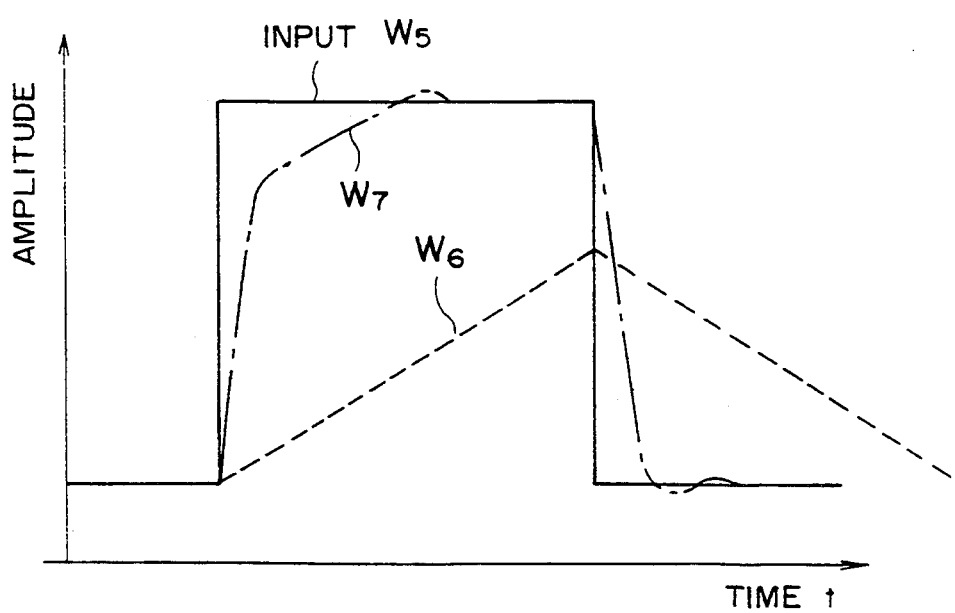
Figure 60:
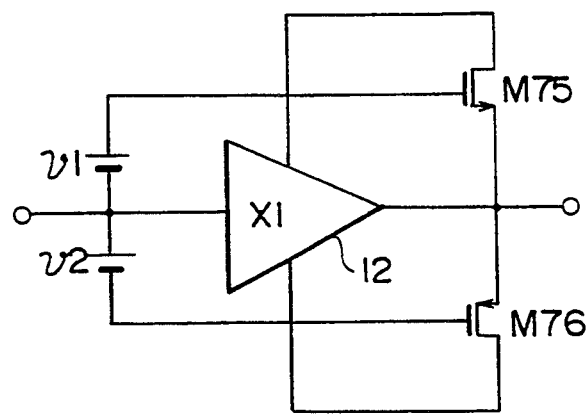
Figure 61:
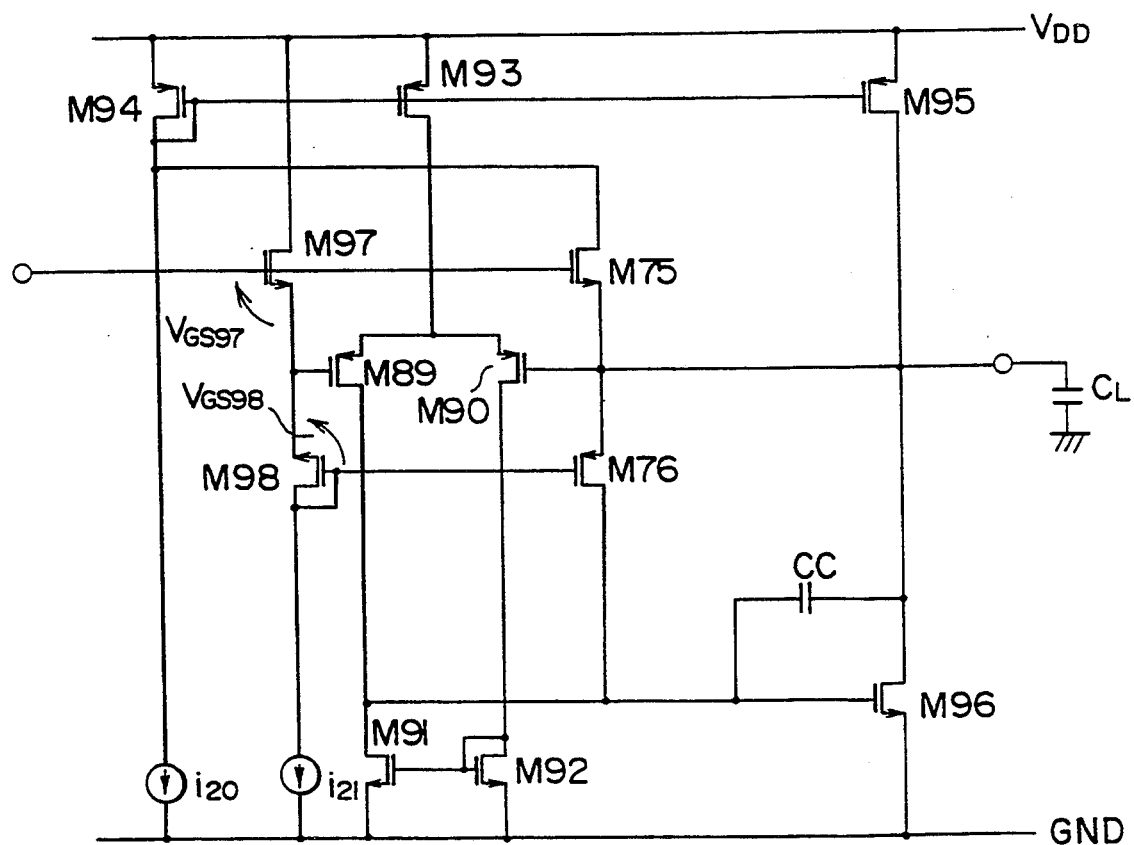
Figure 62:
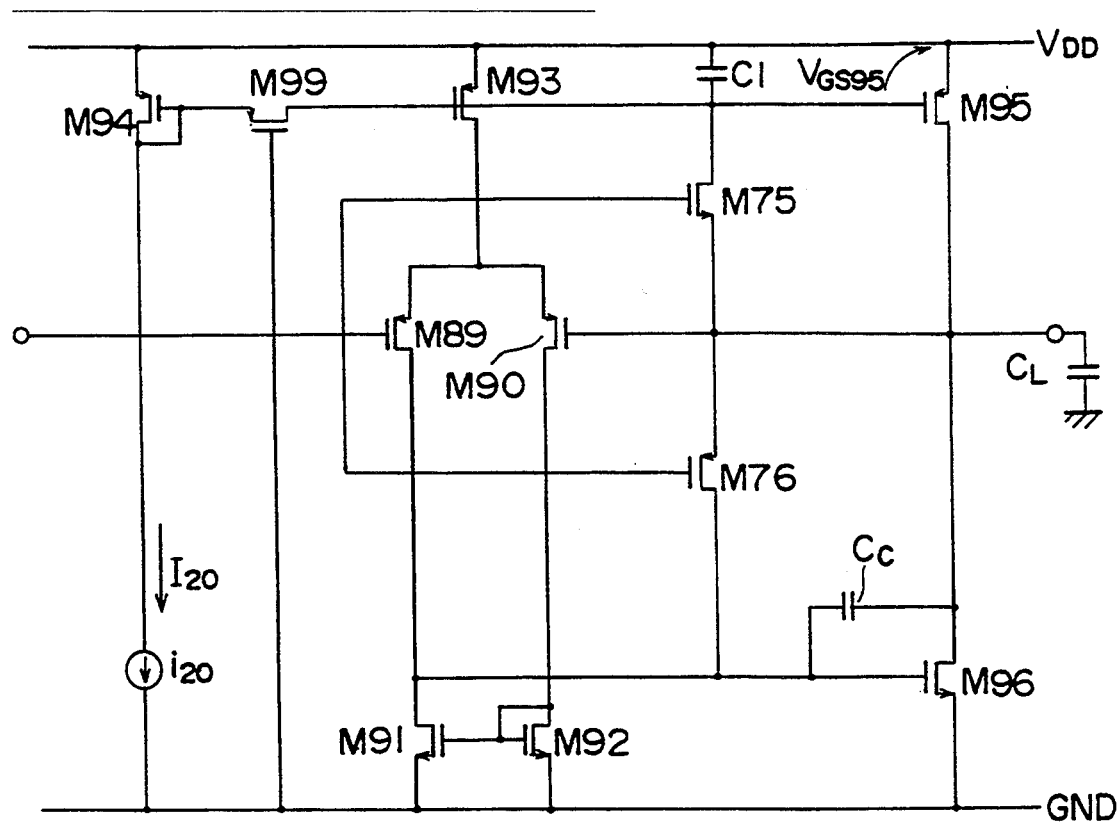
Figure 63:
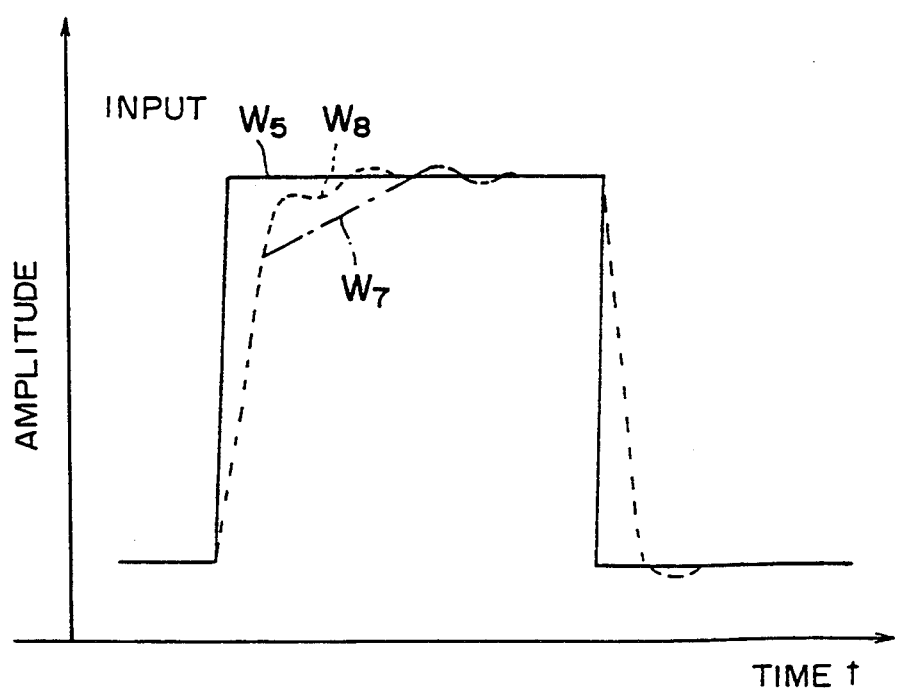
Figure 64:
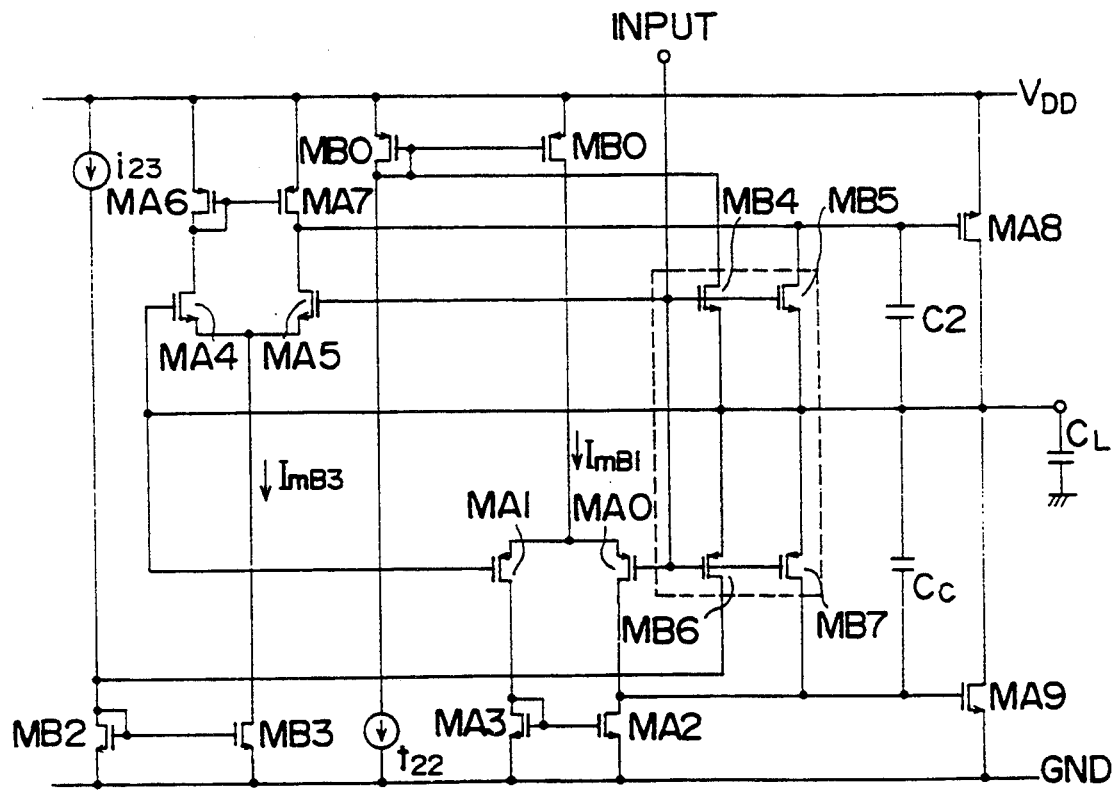
Figure 65:
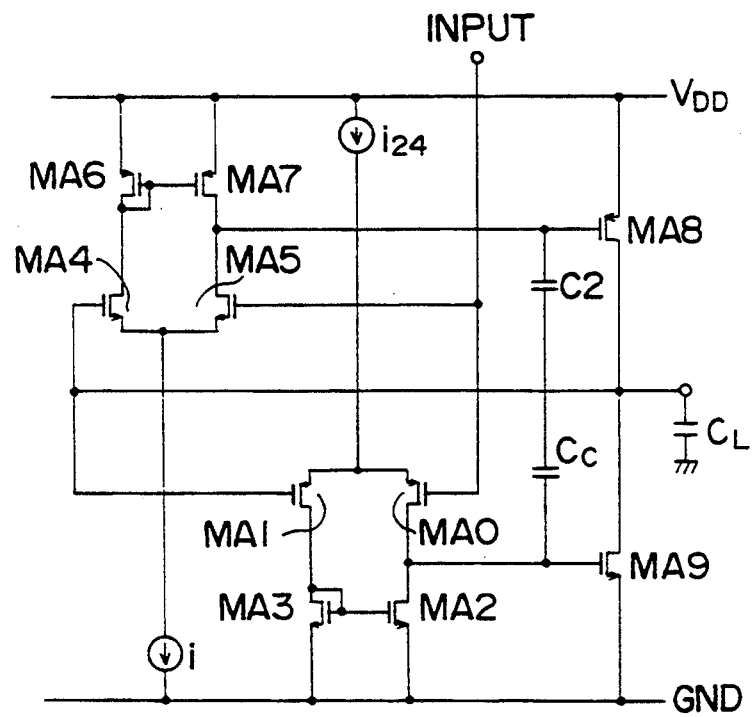
Figure 66:
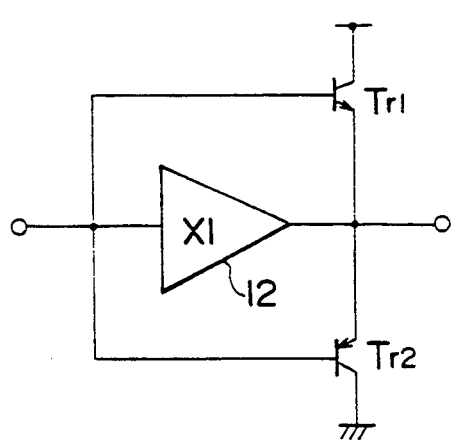
Figure 67:
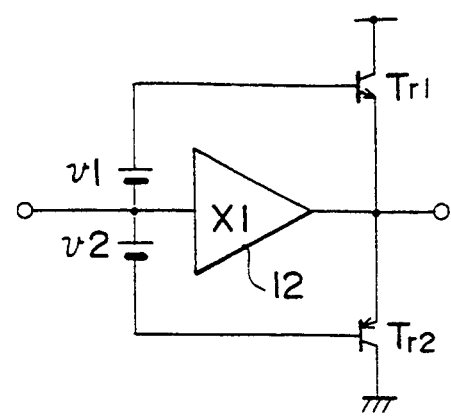
Figure 68:
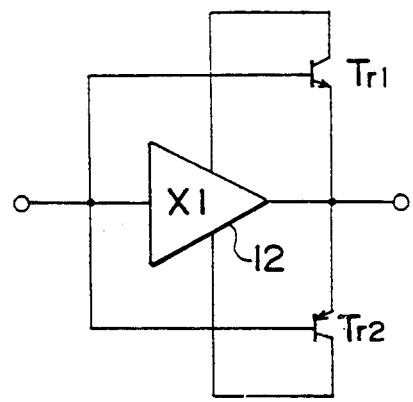
Figure 69:
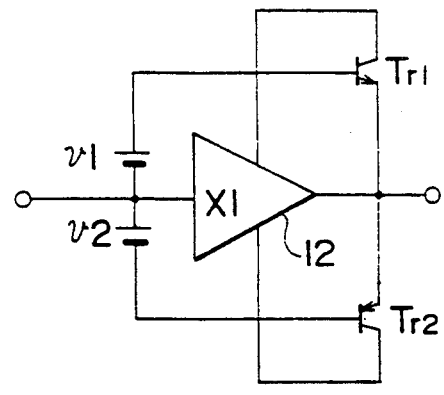
Figure 70:
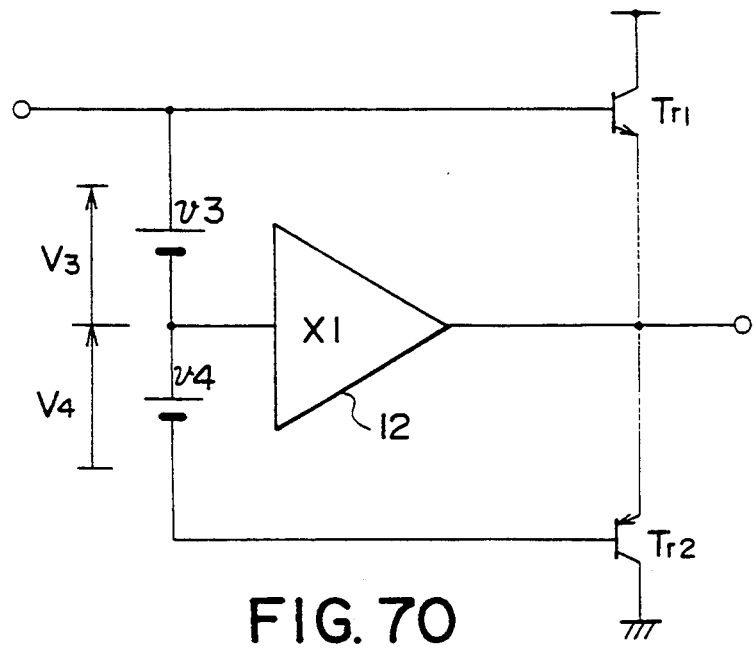

FIG. 44 is a block diagram showing an amplifier circuit according to a tenth embodiment, which is directed to an amplifier device according to the first aspect of this invention to control both the second bias circuit and the driving capability switching circuit by a control signal generated and to determine the bias current from the second bias circuit by using an output from the input amplifier stage;

FIG. 45 is a circuit diagram showing an actual example of an amplifier circuit according to the tenth embodiment shown in the block diagram of FIG. 44;

FIG. 46 is a block diagram showing a buffer circuit according to an amplifier device according to the second aspect of the invention, which is adapted to control the output driving capability by a potential difference detection between the input and the output;

FIG. 47 is a block diagram showing a buffer circuit according to an eleventh embodiment wherein there is shown an actual configuration by field effect transistor of the potential difference detection circuit in the amplifier device according to the second aspect shown in FIG. 46;

FIG. 48 is a waveform diagram showing the slew rate characteristic of the buffer circuit according to the eleventh embodiment;

FIG. 49 is a circuit diagram showing a buffer circuit according to the eleventh embodiment shown in FIG. 49;

FIG. 50 is a block diagram according to a twelfth embodiment, which is directed to the amplifier according to the second aspect of this invention to deliver a level-shifted input signal to the transistor constituting the potential difference circuit;

FIG. 51 is a waveform diagram showing the characteristic of the buffer circuit according to the twelfth embodiment shown in FIG. 50, FIG. 52 is a circuit diagram showing a first actual example of the buffer circuit according to the twelfth embodiment shown in FIG. 50;

FIG. 53 is a circuit diagram showing a second actual example of the buffer circuit according to the twelfth embodiment shown in FIG. 50;

FIG. 54 is a circuit diagram showing a buffer circuit according to a thirteenth embodiment as a modified example of the buffer circuit according to the twelfth embodiment, which is directed to the amplifier device according to the second aspect of this invention;

FIG. 55 is a circuit diagram showing an actual example of the buffer circuit according to the thirteenth embodiment shown in FIG. 54;

FIG. 56 is circuit diagram showing a buffer circuit according to a fourteenth embodiment as another modified example, which is directed to the amplifier device according to the second aspect of this invention to level-shift an input signal of the transistor of the potential difference detection circuit;

FIG. 57 showing a first actual example of the buffer circuit according to the fourteenth embodiment shown in FIG. 56;

FIG. 58 is a circuit diagram showing a second actual example of the buffer circuit according to the fourteenth embodiment shown in FIG. 56;

FIG. 59 is a waveform diagram showing the slew rate characteristic of the buffer circuit shown in FIG. 58;

FIG. 60 is a circuit diagram showing a buffer circuit according to a fifteenth embodiment as a further modified example, which is directed to the amplifier according to the second aspect of this invention to level-shift an input signal of the transistor of the potential difference detection circuit;

FIG. 61 is a circuit diagram showing a first actual example of the buffer circuit according to the fifteenth embodiment shown in FIG. 60;

FIG. 62 is a circuit diagram showing a third actual example of the buffer circuit according to the fourteenth embodiment shown in FIG. 56;

FIG. 63 is a waveform diagram showing the slew rate characteristic of the buffer circuit shown in FIG. 62;

FIG. 64 is a circuit diagram showing a buffer circuit according to a third actual example in which a known push-pull operational amplifier as the amplifying means in the buffer circuit according to the fifteenth embodiment shown in FIG. 60;

FIG. 65 is a circuit diagram showing only the amplifier circuit section of the circuit of the third modified example of the fifteenth embodiment shown in FIG. 64;

FIG. 66 is a block diagram showing a buffer circuit according to a sixteenth embodiment in which the potential difference detection circuit in the amplifier device according to the second aspect shown in FIG. 46 is constituted by the bipolar transistor as an actual configuration;

FIG. 67 is a circuit diagram showing a buffer circuit according to a seventeenth embodiment in which the input signal is level-shifted in the-buffer circuit of the sixteenth embodiment shown in FIG. 66;

FIG. 68 is a circuit diagram showing a buffer circuit according to an eighteenth embodiment in which the most transistor in the buffer circuit of the thirteenth embodiment shown in FIG. 54 is constituted by a bipolar transistor;

FIG. 69 is a circuit diagram showing a buffer circuit according to a nineteenth embodiment in which the most transistor in buffer circuit of the fifteenth embodiment shown in FIG. 60 is constituted by a bipolar transistor; and FIG. 70 is a circuit diagram showing a buffer circuit according to a twentieth embodiment in which a level-shifted input signal is provided in the buffer circuit of the sixteenth embodiment shown in FIG. 66.

DETAILED DESCRIPTION OF THE PREFERRED EMBODIMENTS

Preferred embodiments of this invention will now be described with reference to the attached drawings.

Figure 1:
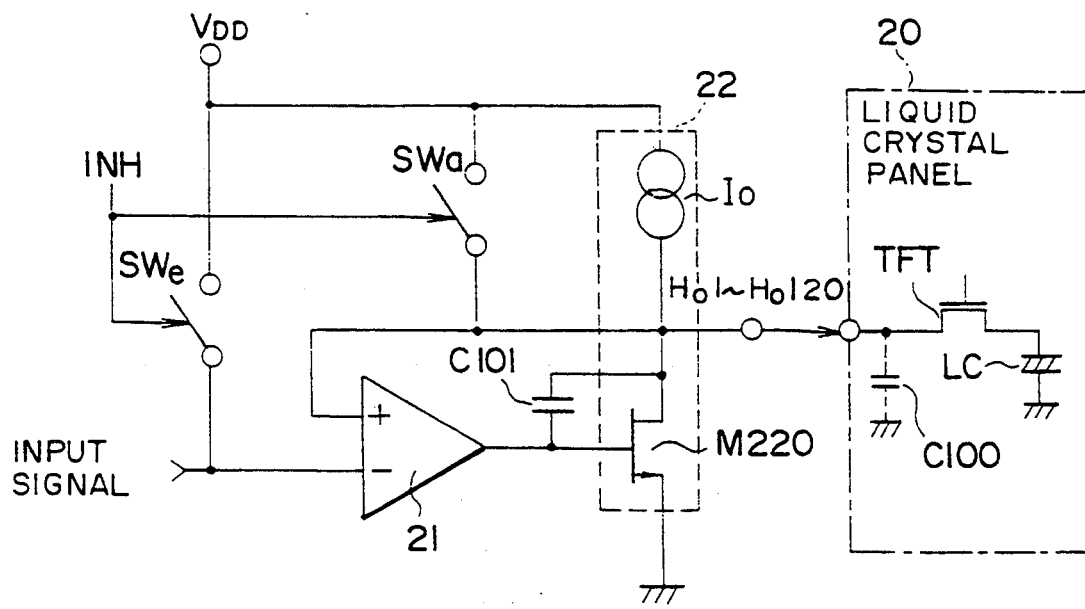
FIG. 1 is a circuit diagram showing an example of a conventional amplifier applied to a liquid crystal display device.
Figure 2:
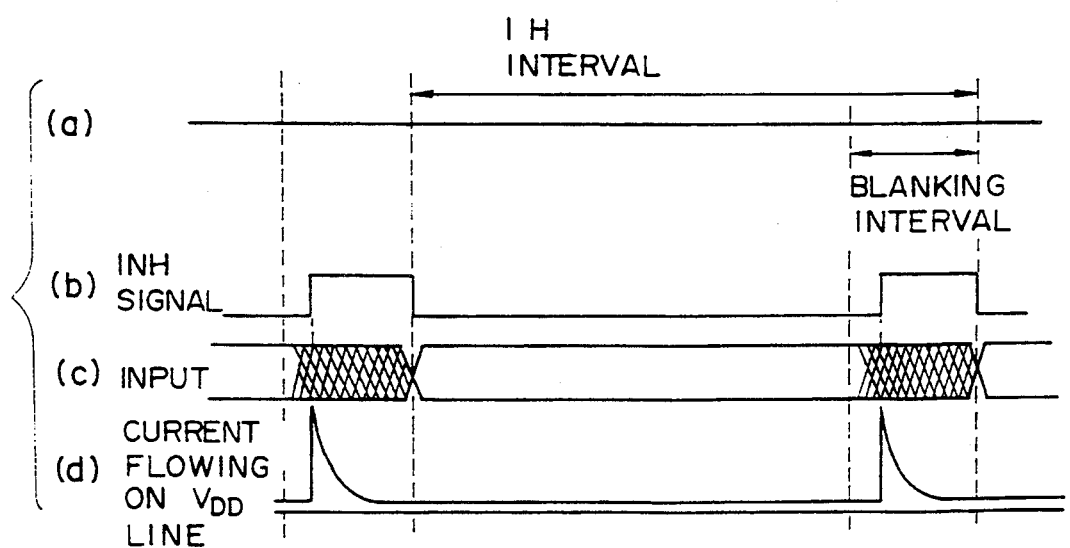
FIG. 2 is a characteristic diagram for explaining the operation of the amplifier shown in FIG. 1.
Figure 3:
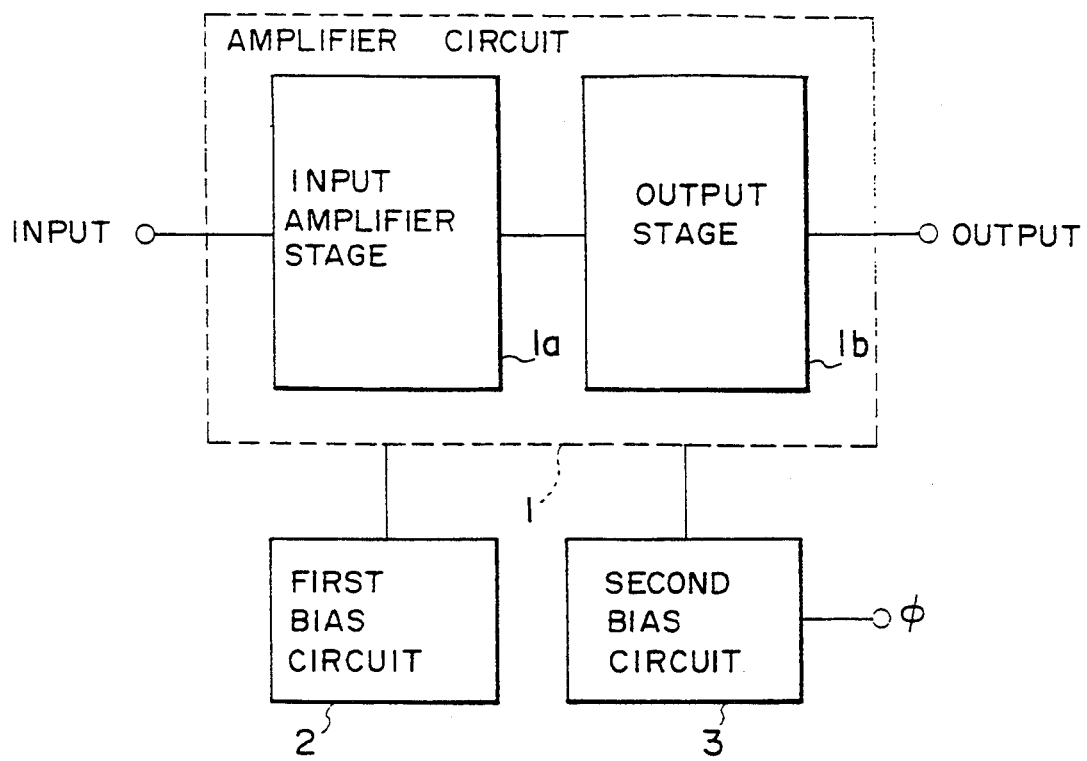
FIG. 3 is a block diagram showing an amplifier device according to a first embodiment for controlling the output driving capability by the bias control according to the first aspect of the invention.

FIG. 3 is a block diagram of an amplifier adapted to control the output current driving capability by the bias control according to this invention.

The amplifier shown in FIG. 3 is directed to a circuit in which a signal whose level periodically changes is used as an input signal, and is composed of an amplifier circuit 1, a first bias circuit 2, and a second bias circuit 3.

The amplifier circuit 1 is capable of controlling the output current driving capability by the bias condition such as a bias current, and is composed of an input amplifier stage 1a and an output stage 1b. The first bias circuit 2 delivers a constant current at all times to the amplifier circuit 1. The second bias circuit 3 is provided in parallel to the first bias circuit 2, and serves to deliver a constant current in an ON/OFF manner to the amplifier circuit 1, wherein $\phi$ is a control signal for carrying the ON/OFF control. This control signal $\phi$ has the same period as the level change period of the input signal, and allows the second bias circuit 3 to be in an ON state only for a fixed period shorter than the time period during which the level of the input signal is maintained, and to allow it to be in an OFF state for the other period in accordance with the input signal, thus to deliver a bias current to the amplifier circuit 1. Thus, the output driving capability of amplifier circuit 1 is enhanced, resulting in an improved slew rate.

In accordance with the first embodiment, even if the second bias circuit 3 does not contribute to the operation of the amplifier circuit 1, the amplifier circuit 1 is placed in an operating state at all times by the first bias circuit, so the output is not placed in a high impedance state. For this reason, the output voltage is stabilized without undergoing disturbance. It is to be noted that when the value of a current delivered from the first bias circuit 2 is selected so as to reduce power consumption of the amplifier circuit 1 determined by the bias delivered from the first bias circuit 2, it is possible to prevent the power consumption from being increased to a great degree.

Hitherto, an approach was employed in the prior art such that the bias current becomes small with lapse of time to allow the driving capability at the beginning of the amplifier circuit to be maximum, thus to improve the slew rate. On the contrary, in accordance with this embodiment, control of the driving capability of the amplifier circuit 1 is carried out depending upon whether or not a limited current is delivered by the ON/OFF control of the second bias circuit 3. For this reason, the bias current can be smaller than the initial value in the above-mentioned prior system. Thus, the instantaneous current can become small, resulting in improved reliability of the operation.

Figure 4:
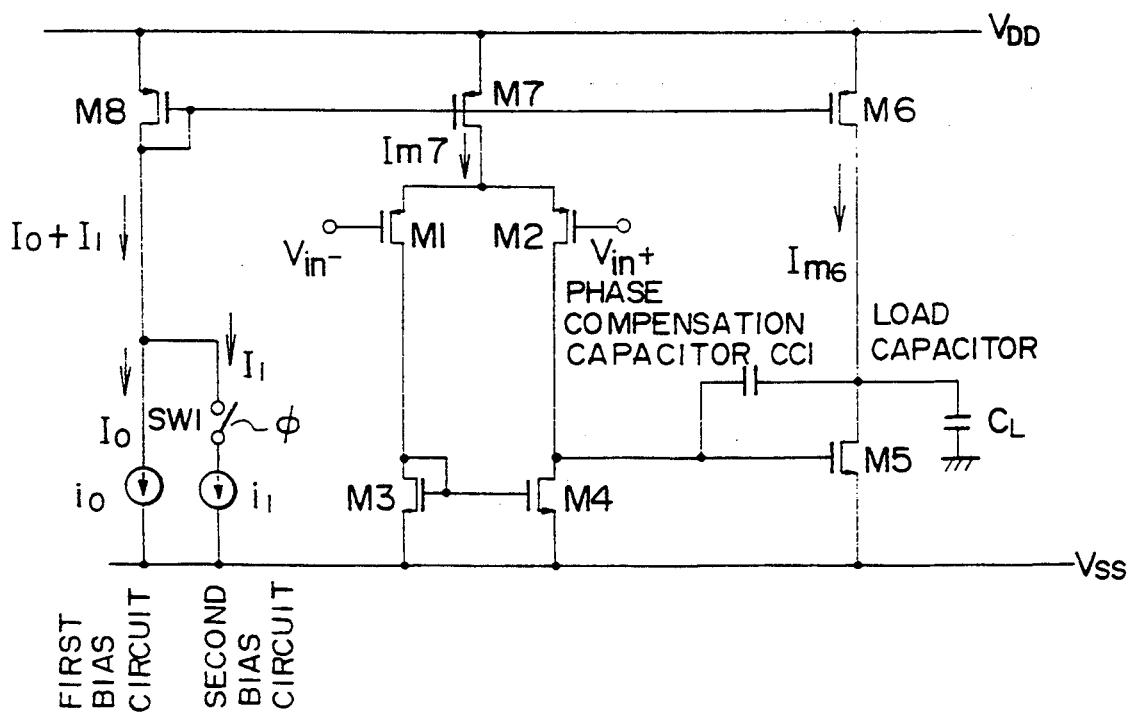
FIG. 4 is a circuit diagram showing a first actual example of the amplifier according to the first embodiment.

FIG. 4 shows a first actual example of the amplifier circuit of the first embodiment shown in FIG. 3.

In FIG. 4, transistors M1 to M8 and a capacitor CC1 constitute a two-stage operational amplifier, which corresponds to the amplifier circuit 1.

The transistors M1 and M2 are comprised of a p-channel FET, and transistors M3 and M4 are comprised of an n-channel FET. The transistors M1 and M2 constitute a differential input, and the transistors M3 and M4 constitute an active load using a current mirror. These transistors M1 to M4 constitute a first amplifier stage (input amplifier stage 1a).

The transistor M5 is comprised of an n-channel, and its gate is connected to the drain of the transistor M4 to constitute a second amplifier stage (output stage 1b).

Further, transistors M6 and M7 are comprised of a p-channel FET. These transistors M6 and M7 deliver bias currents to the first and the second amplifier stages, respectively.

Here, when the potential Vin− of an input signal to the transistor M1 and the potential Vin+ of an input signal to the transistor M2 have the relationship expressed as Vin+ = Vin−, there is a balanced state as follows. Namely, the transistors M1 to M4 constituting the first amplifier stage are all turned ON, so one half of a bias current Im7 from the transistor M7 flows into the M1 and the other half thereof flows into the transistor M2. At this time, the transistor is in an ON state. As a result, a current Im6 from the transistor M6 flows into the transistor M5, but does not flow into the capacitive load connected to the drain thereof.

When the relationship expressed as Vin+ > Vin− holds, the transistor M1 is turned ON and the transistor M2 is turned OFF. As a result, a bias current Im7 from the transistor M7 all flows into the transistors M1 and M3, but does not flow into the transistor M2.

Since the current mirror circuit is constituted by the transistors M3 and M4, a current continues to flow into the transistor M4 until the potential on the drain thereof becomes equal to zero.

Thus, the transistor M5 is turned OFF. As a result, a current from the transistor M6 flows into the capacitive load CL, so the potential thereon rises.

When the state where the relationship expressed as Vin+ < Vin− holds, the transistor M2 is turned ON and the transistor M1 is turned OFF. As a result, a bias current from the transistor M7 all flows into the transistor M2, but does not flow into the transistors M1, M3 and M4.

Thus, the potential on the gate of the transistor M5 rises, so the transistor M5 is turned ON. Accordingly, a current larger than the current Im6 from the transistor M6 flows into the transistor M5, thus promoting the capacitive load to be discharged. As a result, the potential thereon falls.

The constant current source circuit i0 corresponds to the first bias circuit 2, and the series circuit, including constant current source circuit i1 and the switch SW1, corresponds to the second bias circuit 3, and is connected in parallel with the constant current source circuit i0.

A transistor M8 is comprised of a p-channel FET. This transistor M8 serves as a reference current input terminal and the above-mentioned transistors M6 and M7 serve as the output terminal thus to constitute a current mirror circuit. A bias current from the constant current source io and i1 is delivered to the transistor MS, and currents corresponding to a ratio of W/L with respect to the transistor M8 flow into the transistors M6 and M7, respectively.

Thus, when the switch SW1 is in an OFF state, a current determined by the current I0 from the constant current source circuit i0 flows into the transistors M6 and M7. In contrast, when the switch SW1 is in an ON state, a current determined by a synthetic current of the current I0 from the constant current source circuit i0 and the current I1 from the constant current source circuit i1 flows into the transistors M6 and M7.

In accordance with this embodiment, by the ON/-OFF control of the switch SW1, a bias current in the case where the switch SW1 is in ON state is increased by a value corresponding to the current I1 as compared to the case where the switch is in OFF state. As a result, the output current driving capability is enhanced, and the slew rate is improved. On the other hand, in the case where the switch SW1 is in OFF state, while the current I1 is decreased, it does not become equal to zero because of existence of the current I0. Thus, there is no possibility that the output is placed in a high impedance state.

In addition, since the value of a current flowing when the switch SW1 is turned ON is suppressed by the constant current source i1, there is no possibility that the instantaneous current becomes excessive. Thus, high reliability can be provided under the state where power of the transistor is greater than that in the prior art is not so required. This is advantageous to the implementation of an IC.

Figure 5:
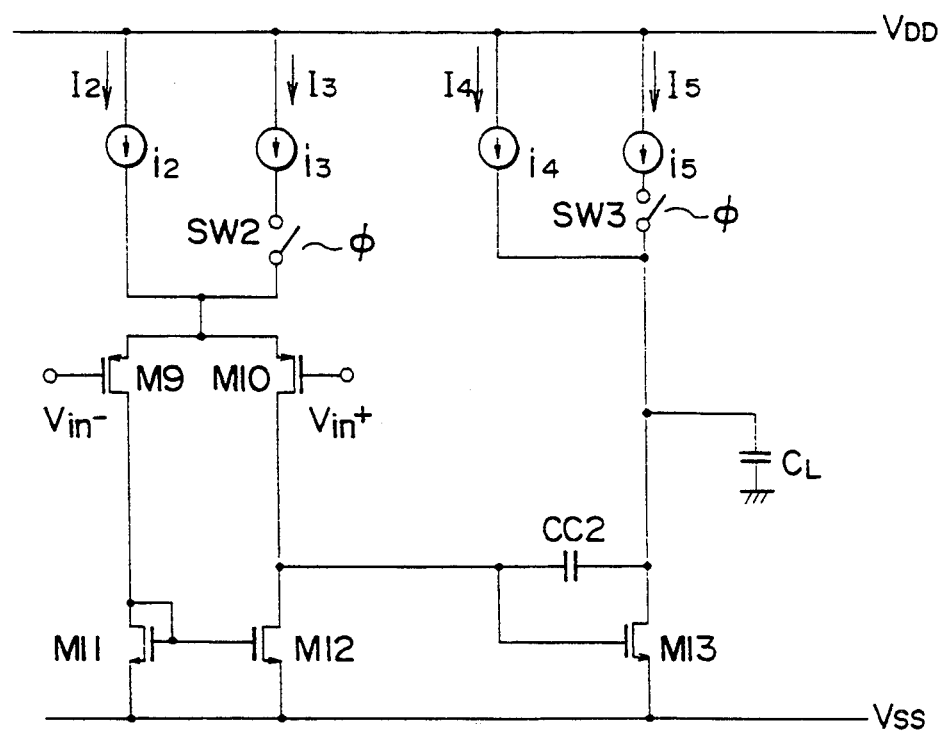
FIG. 5 is a circuit diagram showing a second actual example of the amplifier according to the first embodiment.

FIG. 5 shows a second actual example of the first embodiment shown in FIG. 3.

In FIG. 5, transistors M9 to M13 and a capacitor CC2 constitute a two-stage operational amplifier, and this amplifier corresponds to the amplifier circuit 1.

The transistors M9 and M10 are comprised of a p-channel FET, and the transistors M11 and M12 are comprised of an n-channel FET. The transistors M9 and M10 constitute the differential input and the transistors M11 and M12 constitute an active load using a current mirror circuit. In addition, the transistors M9 to M12 constitute the first amplifier stage (input amplifier stage 1a).

The transistor M13 is comprised of an n-channel FET. The gate of the transistor M13 is connected to the drain of the transistor M12 to constitute a second amplifier stage (output stage 1b).

Constant current source circuits i2 and i4 correspond to the first bias circuit 2. The series circuit of a constant current source circuit i3 and a switch SW2 and the series circuit of a constant current source circuit i5 and a switch SW3 correspond to the second bias circuit 3. The former series circuit is provided in parallel to the constant current source circuit i2 and the latter is connected in parallel to the constant current source circuit i4. Each current from the constant current source circuit i2 and i4 biases the first amplifier stage, and each current from the constant current source circuit i3 and i5 biases the second amplifier stage.

In accordance with the circuit according to the second actual example of the first embodiment, first and second bias circuits are provided in the first amplifier stage (input amplifier stage 1a) and the second amplifier stage (output stage 1b) of the operational amplifier, respectively. The switches SW2 and SW3 are synchronously subjected to ON/OFF control.

The circuit thus constructed operates in the same manner as that in the circuit of the first actual example shown in FIG. 4, except that the section of the operational amplifier is directly supplied with a bias current from the current source circuit.

Thus, when the switches SW2 and SW3 are in OFF states, a current I2 from the constant current source circuit i2 is delivered to the first amplifier stage (input amplifier stage 1a), and a current I4 from the constant current source circuit i4 is delivered to the second amplifier stage (output stage 1b).

In contrast, when the switches SW2 and SW3 are in ON states, a synthetic current of a current I2 from the constant current source circuit i2 and a current I3 from the constant current source circuit i3 is delivered to the first amplifier stage (input amplifier stage 1a), and a synthetic current of a current I4 from the constant current source circuit i4 and a current I5 from the constant current source circuit i5 is delivered to the second amplifier stage (input amplifier stage 1a).

Thus, in accordance with this embodiment, by the ON/OFF control of the switches SW2 and SW3, bias currents when the switches SW2 and SW3 are in ON state are increased by the currents I3 and I5 as compared to those when they are in OFF state, respectively. As a result, the output driving capability is enhanced. On the other hand, when the switches SW2 and SW3 are in OFF state, the current I3 or I5 is decreased, but does not become equal to zero because of existence of the current I2 or I4, resulting in no possibility that the output is placed in a high impedance state.

Further, since the values of currents flowing when the switch SW2 or SW3 is turned ON are suppressed by the constant current sources i3 and i5, there is no possibility that the instantaneous current becomes excessive.

Namely, the same effects similar to those of the first actual example shown in FIG. 4 can be provided by the second actual example as well.

Furthermore, in accordance with the first embodiment, since first and second bias circuits are provided in the first amplifier stage (input amplifier stage 1a) and the second amplifier stage (output stage 1b), respectively, a set value of the current at the pair of the constant current circuits i2 and i3 and at the pair of the constant current source circuits i4 and i5 can be independently adjusted. Thus, freedom in setting the operating current is improved.

Figure 6:
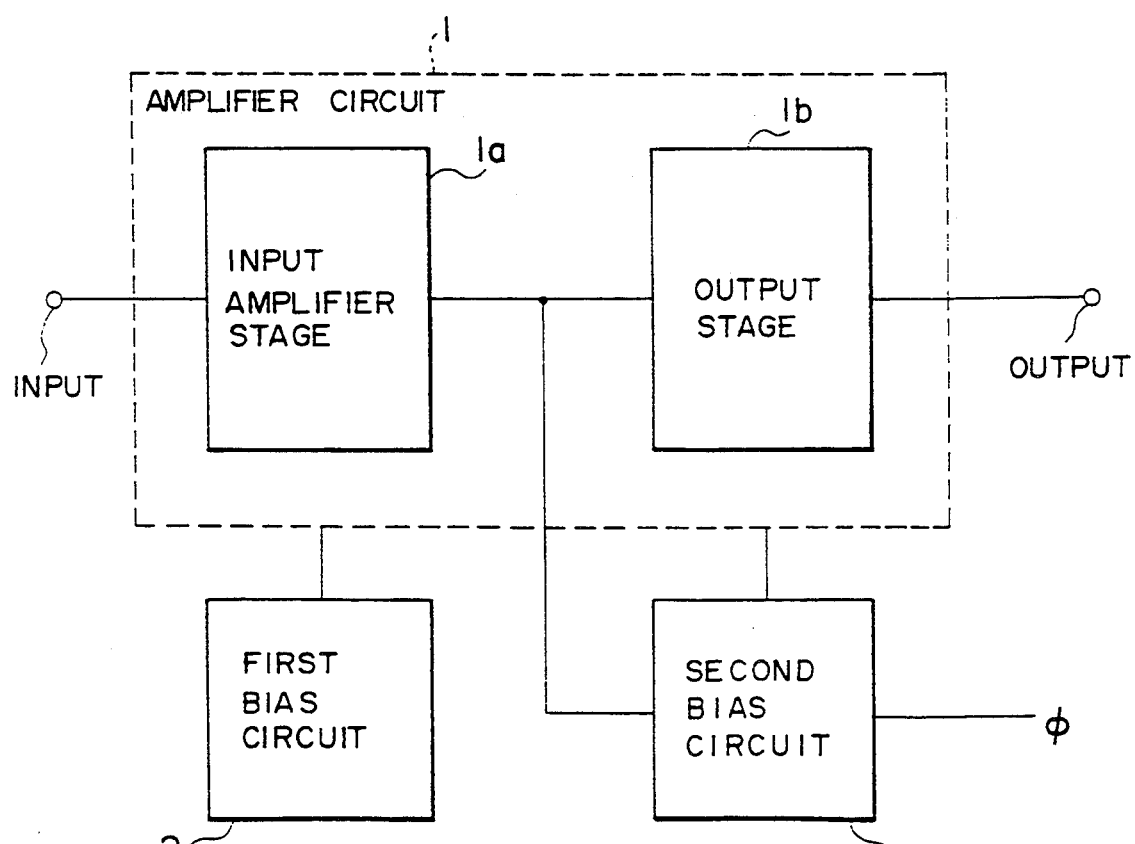
FIG. 6 is a block diagram of the circuit of a second embodiment according to this invention related to the first aspect of the invention, which is adapted to control the second bias circuit by a control signal from the external and to by an output from the input amplifier stage determine a bias current output from the second bias circuit.

FIG. 6 is a block diagram of an amplifier circuit according to a second embodiment to control the output current driving capability by the bias control, which is directed to the amplifier according to the first aspect of this invention.

The amplifier circuit shown in this figure is directed to an amplifier in which a periodically changing signal is used as an input signal, and is composed of an amplifier circuit 1, a first bias circuit 2, and a second bias circuit 3 adapted so that the bias current is determined by the input amplifier stage 1a in the amplifier circuit 1 and the connection to the amplifier circuit 1 is controlled in an ON/OFF manner by an external control signal.

In FIG. 3, since the control signal is given, e.g., at the timing where a periodically changing input signal varies by a periodic pulse synchronized with the input signal, even when the potential change of the input signal is small and it is, therefore, not necessary to enhance the output driving capability, the output driving capability was unnecessarily enhanced.

In the circuit shown in FIG. 6, since the bias current of the second bias circuit 3 is determined depending upon the output potential of the input amplifier stage 1a or the change rate of the output current, even in the case where the potential change is small and it is therefore not necessary to enhance the output current driving capability over the entire period of the external control signal, the bias current becomes small. Thus, a lower power consumption is realized without unnecessarily enhancing the output current driving capability.

Figure 7:
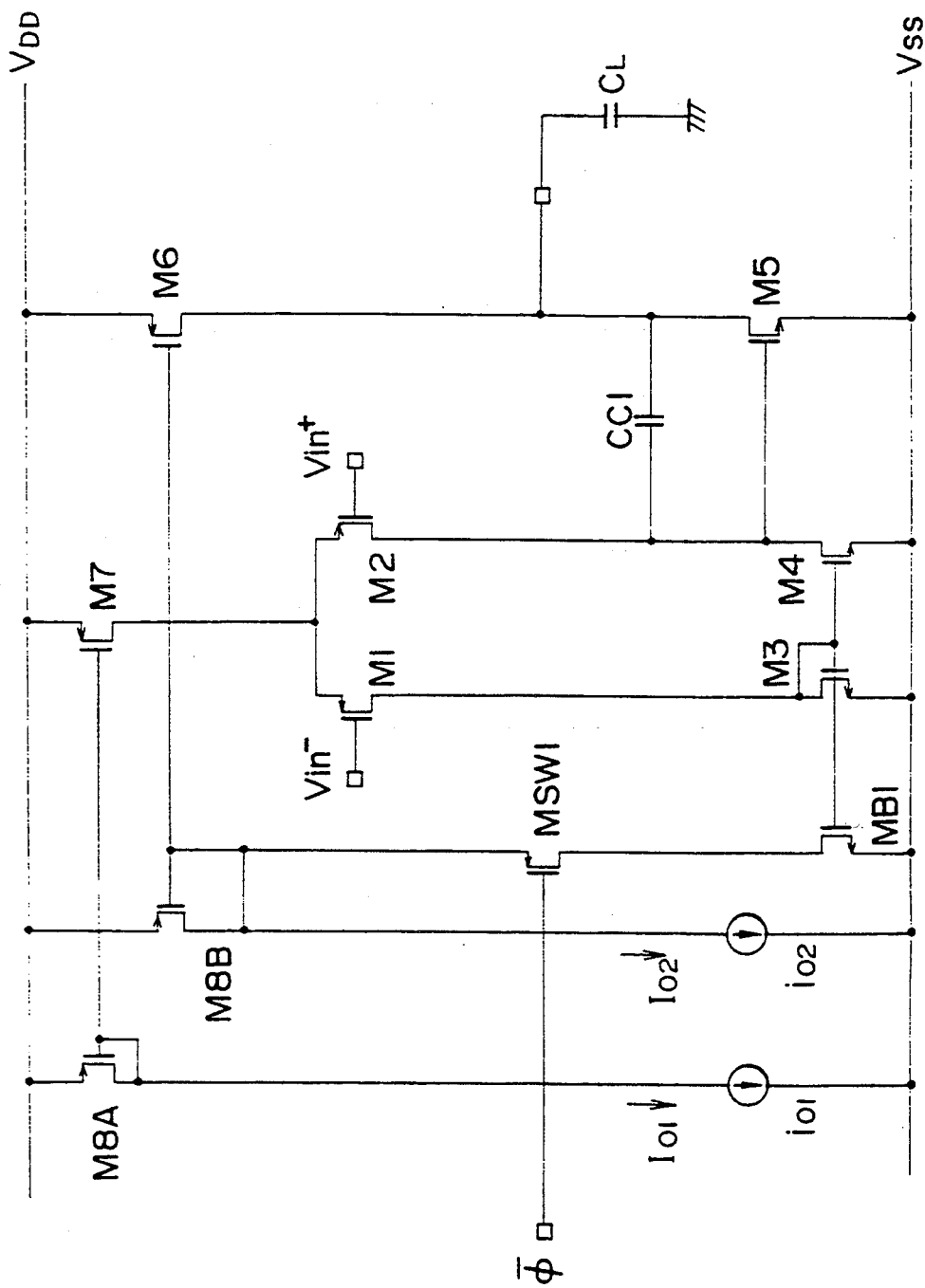
FIG. 7 is a circuit diagram showing an actual example of the amplifier according to the second embodiment shown in the block diagram of FIG. 6.

FIG. 7 shows an actual example of the circuit shown in FIG. 6.

The circuit shown in FIG. 7 is discussed below. By dividing the transistor in the circuit shown in FIG. 4 into transistors M8A and M8B, the path for delivering a bias current to the input amplifier stage 1a and the path for delivering a bias current to the output stage 1b are separately provided. Further, the bias current delivered to the input amplifier stage 1a is caused to be only a bias current delivered from the first bias circuit, and the rate determined by the bias current and the phase compensation capacitor CC1 is set so that it is high at all times. In addition, only the bias current delivered from the second bias circuit flowing into the output stage 1b, which is considered to be most closely related to power consumption, is controlled. In such a modified example, the bias current delivered from the second bias circuit is determined depending upon the output of the input amplifier stage 1a.

The switch SW1 of FIG. 4 now includes a transistor MSW1, and the ON/OFF operation thereof is controlled by a control signal $\phi$. The current source section of the second bias circuit includes a transistor MB1. The bias current value is determined as follows. By using, as a potential on the gate of the transistor M81, an output of the drain terminal side of the transistor M3 of the input amplifier stage 1a comprised of transistors M1 to M4, the bias current is determined so that when Vin+ is higher than Vin− in potential, the bias current increases, and when Vin+ is lower than Vin+, the bias current decreases. As stated above, since the output current of the output stage is determined depending upon the magnitude of the input differential signal without uniformly enhancing the output current driving capability over the entire period of the control signal $\phi$, a lower power consumption can be realized.

While the circuits in the first and second embodiments which have been described are both comprised of MOSFET, a buffer circuit which can provide the functions similar to those above may be constituted by using a bipolar transistor.

Figure 8:
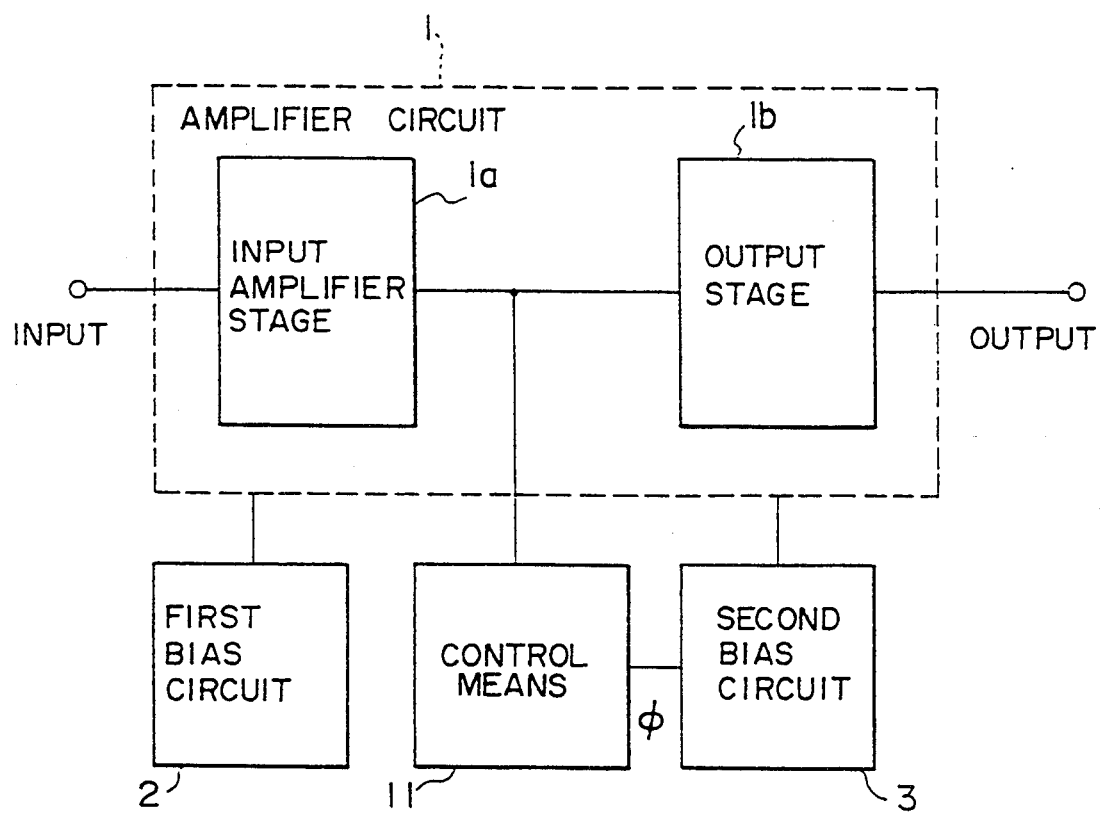
FIG. 8 is a block diagram showing an amplifier circuit according to a third embodiment, which is directed to the amplifier device according to the first aspect of the invention to control the second bias circuit by a control signal generated by using an output from the input amplifier stage.

FIG. 8 is a block diagram of an amplifier circuit according to a third embodiment adapted to control the output current driving capability by a control signal generated by using an output from the input amplifier stage 1a. This circuit corresponds to the circuit in which control means 11 using an output from the input amplifier stage 1a is added in the block diagram of the first embodiment shown in FIG. 3.

In FIG. 3, since the control signal is given, e.g., at the timing where a periodically changing input signal varies by a periodic pulse synchronized with the input signal, even in the case where the potential change is small and it is therefore not necessary to enhance the output current driving capability, the output driving capability was enhanced only for a fixed period controlled by the control signal.

On the contrary, in the buffer circuit shown in FIG. 8, a control signal is generated only when the potential change or the current change of the output of the input amplifier stage 1a is large. In the case where the potential change of the input signal is small and it is therefore not necessary to enhance the output current driving capability, the potential change or the current change of the output of the input amplifier stage 1a is small. Accordingly, this buffer circuit does not produce a control signal in such a case. Thus, a lower power consumption is realized without unnecessarily enhancing the output current driving capability.

Figure 9:
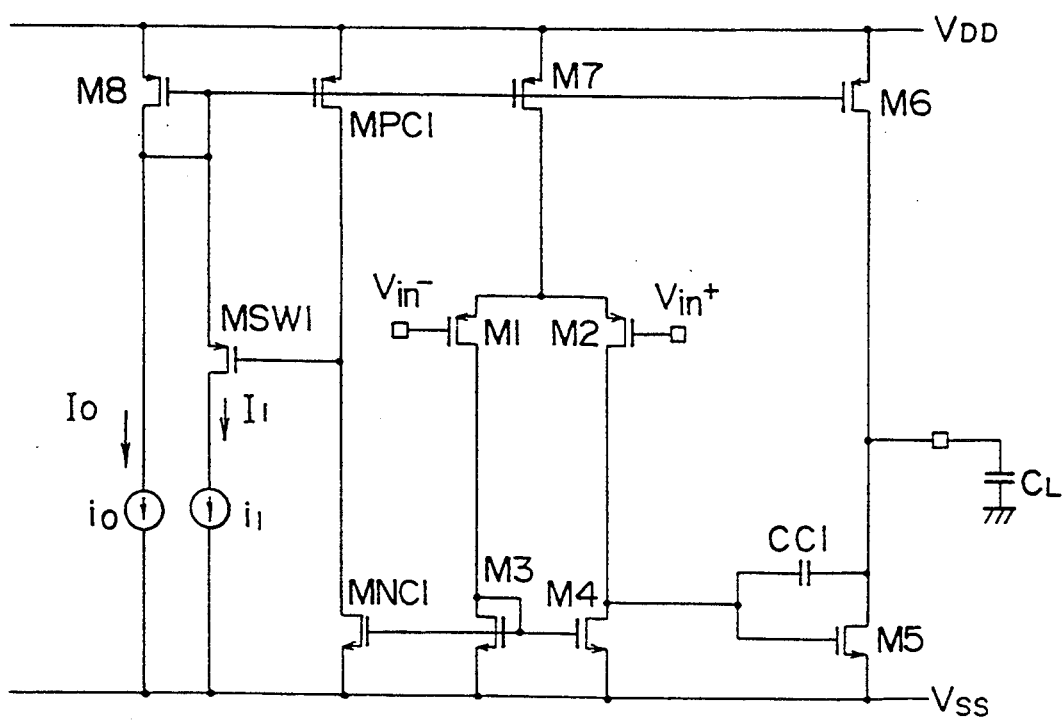
FIG. 9 is a circuit diagram showing a first actual example of the amplifier device according to the third embodiment shown in the block diagram of FIG. 8.

FIG. 9 shows a first actual example of the amplifier circuit of the third embodiment shown in FIG. 8, and the circuit shown in this figure corresponds to the circuit in which the control signal generation means is added in the circuit shown in FIG. 4.

As previously described, the transistors M1 to M8 constitute a two-stage operational amplifier, and correspond to the amplifier circuit 1. The transistors M1 to M4 of these transistors constitute the input amplifier stage 1a and the transistor thereof constitutes the output stage. Further, the transistors M6 and M7 deliver bias currents to the input amplifier stage 1a and the output stage 1b, respectively. In addition, the switch SW1 is realized with the transistor MSW1.

In the amplifier circuit of such a structure, the slew rate at the rising time is in correspondence with a lower one of a rate determined by the bias current delivered to the input amplifier stage 1a and the capacitance of the phase compensation capacitor CC1 and a rate determined by the current delivered from the transistor M6 and the capacitance of the capacitive load CL of the output. Further, the slew rate at the falling time is determined by the bias current delivered to the input amplifier stage 1a and the the phase compensation capacitor CC1. Accordingly, when Vin+ is lower than Vin− in potential, there results such an operation to sink a current by the transistor M5 to lower the output potential. Accordingly, since if the current delivered by the transistor M6 is increased, it is all sunk by the transistor M5, it is not necessary to enhance the output current driving capability. By drawing attention to this point, the control signal generation means is formed as described later.

This control signal generation means includes transistors MPC1 and MNC1. When the relationship expressed as
$(W/L)_{MPC1}/(W/L)_{M7} > [(W/L)_{MNC1}/(W/L)_{M4}]/2$,
i.e., Vin− and Vin+ are equal to each other in potential, a setting is made such that a current delivered from the drain of the transistor MPC1 is larger than a current sunk into the drain of the transistor MNC1. Thus, the control signal generation means performs an operation such that only when Vin+ is larger than Vin− to some extent in potential, the drain current flowing in the transistor MNC1 becomes larger than the drain current flowing in the transistor MPC1 to lower the gate potential of the transistor MSW1 to allow it to be turned ON, thus to enhance the output current driving capability of the transistor M6.

As stated above, since the control signal generation means performs an operation such that only when Vin+ is larger than Vin− to some extent in potential, the transistor MSW1 is turned ON, thus making it possible to enhance the output current driving capability of the transistor M6.

Figure 10:
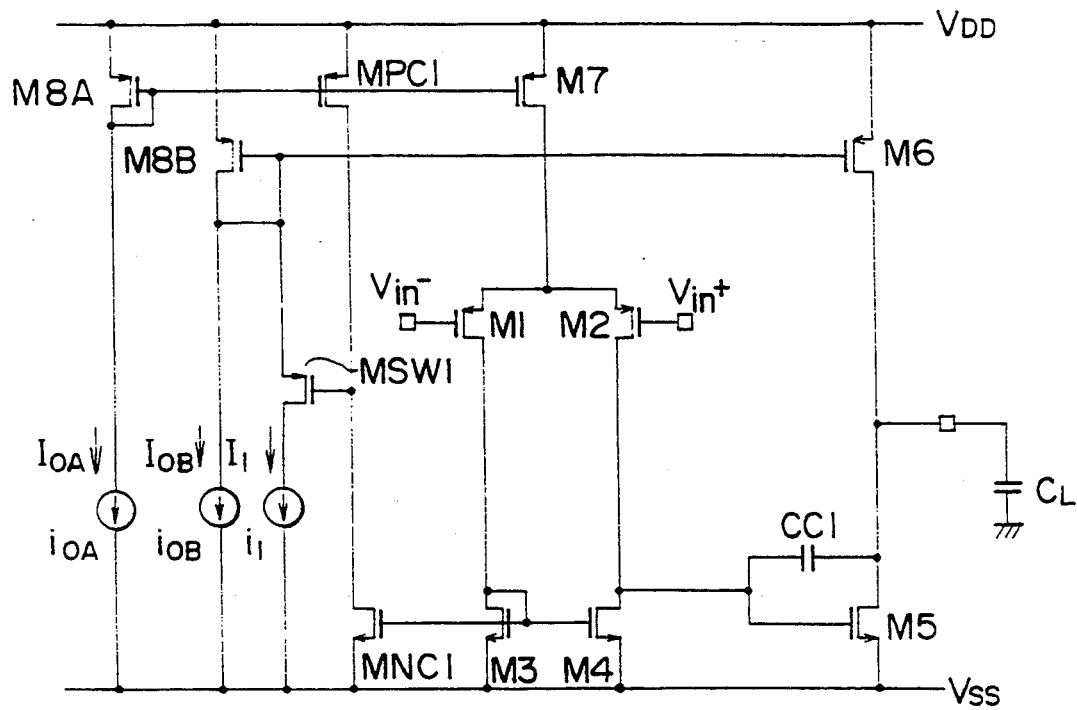
FIG. 10 is a circuit diagram showing a second actual example of the amplifier device according to the third embodiment shown in the block diagram of FIG. 8.

FIG. 10 shows a second actual example of the amplifier circuit of the third embodiment shown in FIG. 8.

The circuit shown in FIG. 10 is discussed below. By dividing the transistor in the circuit shown in FIG. 4 into transistors M8A and M8B, the path for delivering a bias current to the input amplifier stage 1a and the path for delivering a bias current to the output stage 1b are separately provided. Further, the bias current delivered to the input amplifier stage 1a is set so that the rate determined by the bias current and the phase compensation capacitor CC1 is high at all times. In addition, the bias current flowing into the output stage 1b, which is considered to be most closely related to power consumption, is only controlled. In accordance with such a modified example thus obtained, effects and/or advantages similar to those in the circuit shown in FIG. 9 can be provided.

Figure 11:
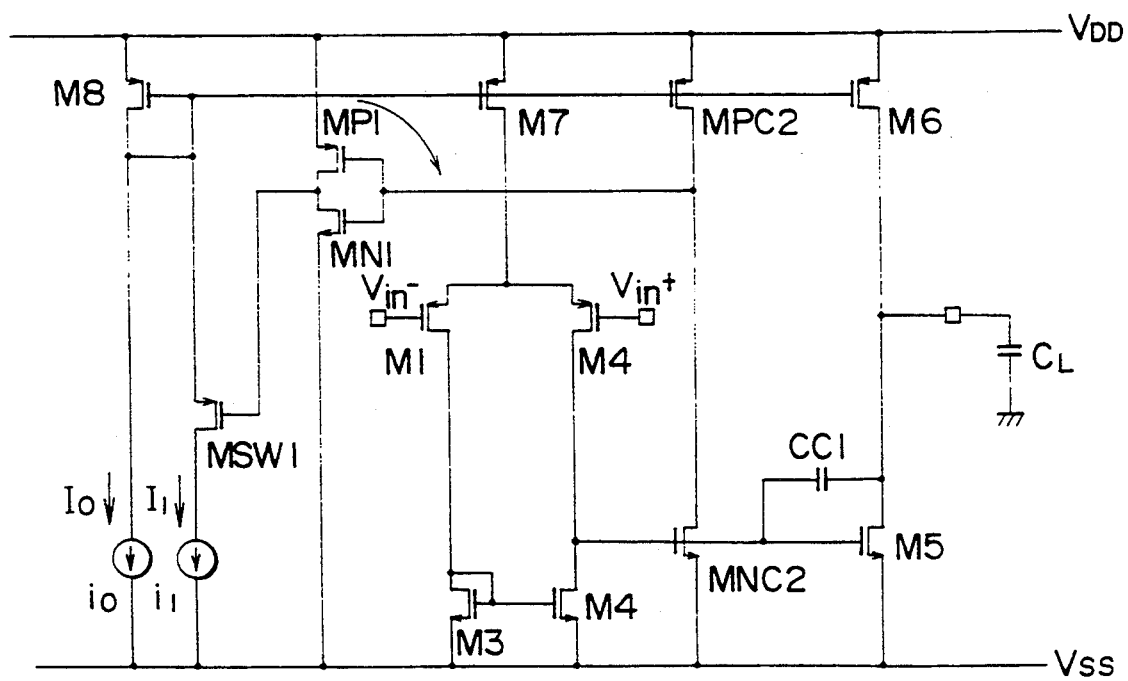
FIG. 11 is a circuit diagram showing a third actual example of the amplifier device according to the third embodiment shown in the block diagram of FIG. 8.

FIG. 11 shows a third actual example of the amplifier circuit according to the third embodiment shown in FIG. 8.

The circuit shown in this figure corresponds to a modified example of the configuration of the control signal generation means in the first example circuit shown in FIG. 9. While, in the circuit shown in FIG. 9, the drain potential of the transistor M3 is used as an output from the input amplifier stage 1a serving as an input to the control signal generation means, the drain potential of the transistor M3 is used for this purpose in the circuit shown in FIG. 11. The control signal generation means is composed of inverting circuits comprised of transistors MPC2 and MNC2 and transistors MP1 and MN1. When the relationship expressed as $(W/L)_{MPC2}/(W/L)_{M7} < [(W/L)_{MNC2}/(W/L)_{M4}]/2$, i.e., Vin− and Vin+ are equal to each other in potential, a setting is made such that a current sunk into the transistor MNC2 is larger than the current delivered from the transistor MPC2. Thus, the control signal generation means performs an operation such that only when Vin+ becomes equal to a potential higher than Vin− to some extent, the drain current flowing in the transistor MPC2 becomes larger than the drain current flowing in the transistor MNC2 to lower the output potential of the inverting circuit comprised of the transistor MP1 and MN1 to allow the transistor MSW1 to be turned ON, thus to enhance the output current driving capability of the transistor M5. As a result, effects and/or advantages similar to the above can be provided.

Figure 12:
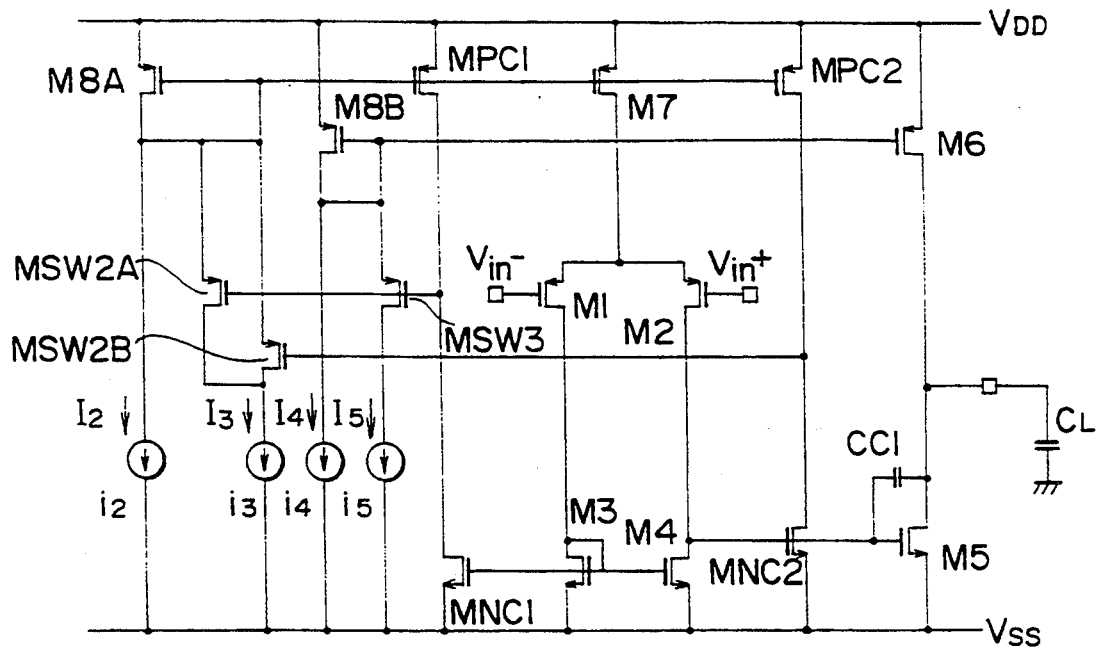
FIG. 12 is a circuit diagram showing a fourth actual example of the amplifier device according to the third embodiment shown in the block diagram of FIG. 8.

FIG. 12 shows a fourth actual example of the amplifier circuit according to the third embodiment shown in FIG. 8.

The circuit shown in this figure is directed to the modified example where the bias current of the input amplifier stage 1a is also controlled by a control signal generated by the control signal generation means in the circuit of the second actual example of the third embodiment of FIG. 3. The control signal generation means is comprised of transistors MPC1, MNC1, MPC2 and MNC2, and the control of the bias current to the output stage 1b is conducted in the manner as described in the second actual example of FIG. 10. Since the bias current to the input amplifier stage 1a is one of the factors for determining the slew rate, this control is carried out so that when Vin+ becomes equal to a potential higher than Vin− in potential to some extent, and when Vin− becomes equal to a potential higher than Vin+ to some extent, the bias current of the input amplifier stage 1a becomes large. For this reason, a control is conducted such that when Vin+ becomes equal to a potential higher than Vin− to some extent by the transistors MPC1 and MNC1, the transistor is caused to be turned ON to add a current I3 from the constant current source i3, and when Vin− becomes equal to a potential higher than Vin+ to some extent by the transistors MPC2 and MNC2, the transistor MSW2B is caused to be turned ON to add a current I3 from the constant current source i3. Thus, a current is prevented from being unnecessarily consumed at the input amplifier stage 1a although its value is small.

Here, (W/L) of the transistors MPC2 and MNC2 is set so that the relationship expressed as $(W/L)_{MPC2}/(W/L)_{M7} > [(W/L)_{MNC2}/(W/L)_{M4}]/2$. This relationship is different from that in the case of the circuit shown in FIG. 11.

Figure 13:
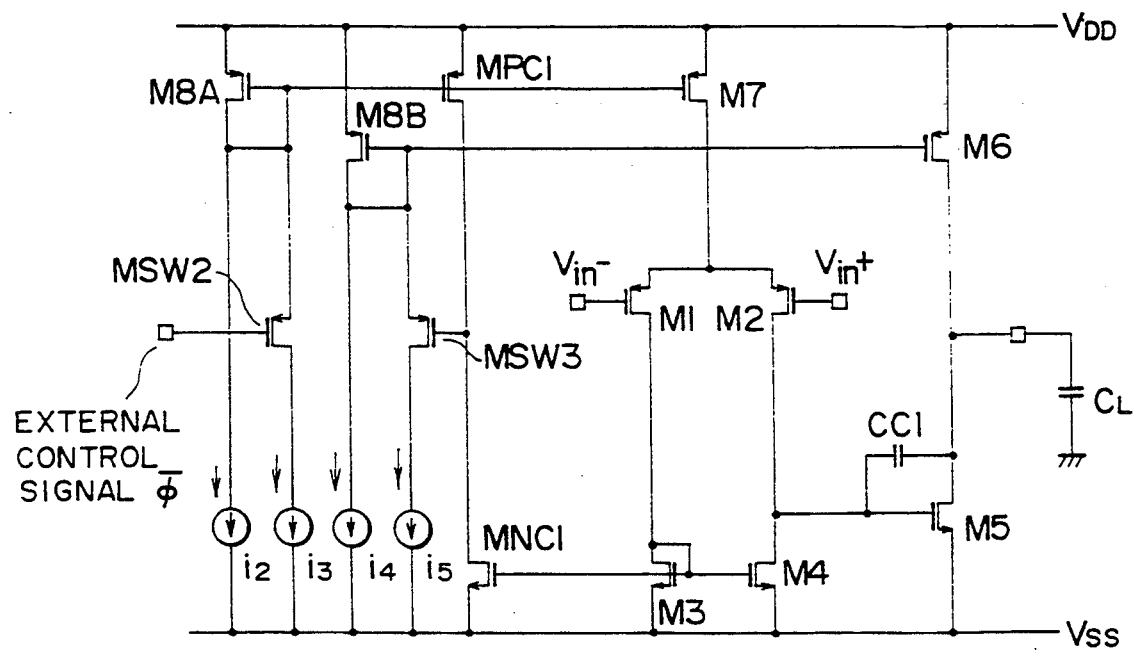
FIG. 13 is a circuit diagram showing a fifth actual example of the amplifier device according to the third embodiment shown in the block diagram of FIG. 8.

FIG. 13 shows a fifth actual example of the amplifier circuit of the third embodiment circuit shown in FIG. 11.

The circuit shown in this figure is characterized in that the bias current control of the input amplifier stage 1a is carried out by a periodical pulse φ synchronized with a periodically changing input signal as shown in FIG. 5 in the circuit of the fourth actual example shown in FIG. 12. Effects or advantages similar to those in the case of the circuit shown in FIG. 12 can be provided.

Figure 14:
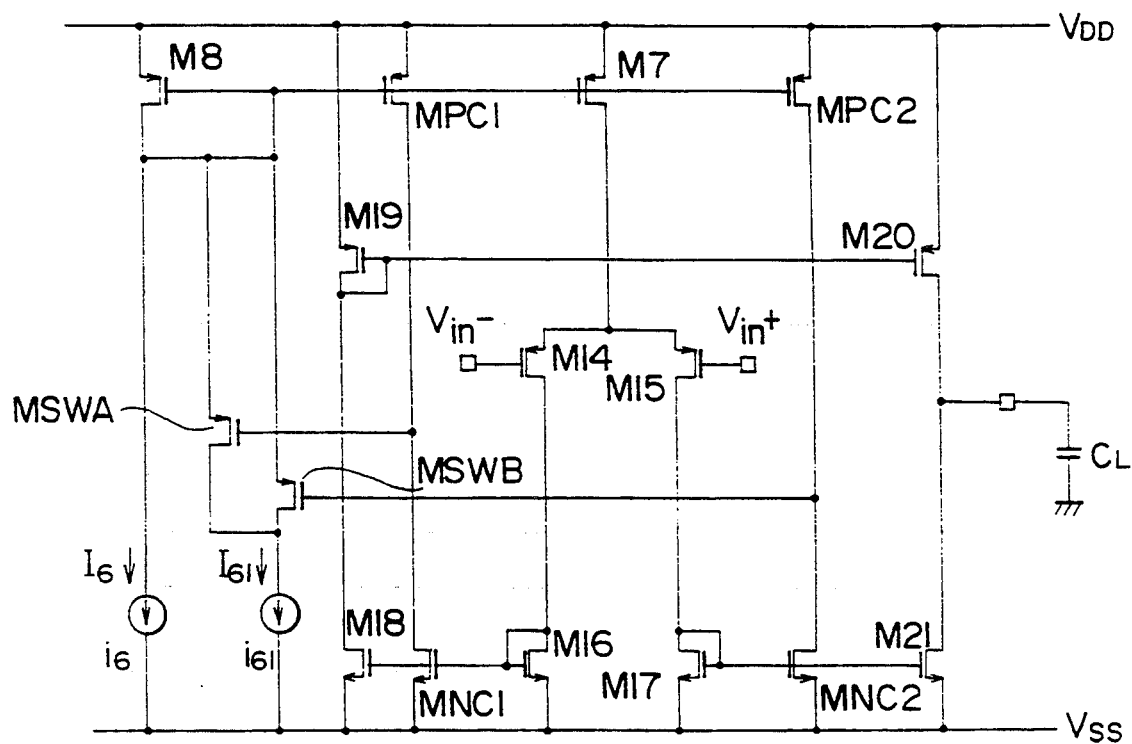
FIG. 14 is a circuit diagram showing a sixth actual example of the amplifier device according to the third embodiment shown in the block diagram of FIG. 8.

FIG. 14 shows a sixth actual example of the amplifier circuit of the third embodiment shown in FIG. 8.

The circuit shown in this figure is directed to the example where control signal generation means is added in the amplifier circuit comprised of transistors M14 to M21 shown in FIGS. 29 to 31 which will be described later. The transistors M14 to M19 constitute the input amplifier stage, the transistors M20 and M21 constitute the output stage, and control signal generation means (which will be considered as a first output stage drive element in FIG. 29, etc.) is composed of transistors MPC1, MNC1, MPC2 and MNC2. The relationship of respective (W/L) factors of the transistors MPC1, MNC1, MPC2 and MNC2 is as described with reference to FIG. 12. Namely, by allowing respective (W/L) to have a predetermined relationship, such a control is conducted to allow the transistor MSWB to be turned ON when Vin+ becomes equal to a potential higher than Vin− to some extent. Thus, when Vin+ becomes equal to a potential higher than Vin− to some extent, and when Vin− becomes equal to a potential higher than Vin+ to some extent, the control signal generation means allows the transistors MSWA or MSWB to be turned ON to increase a bias current delivered to the amplifier circuit from I6 to I6+I61, thus to improve the slew rate.

Figure 15:
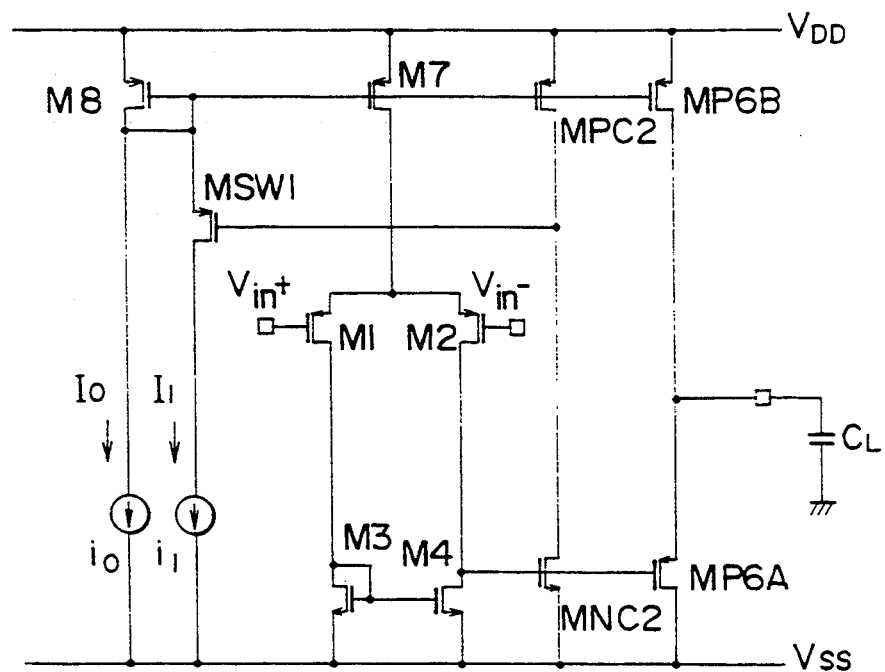
FIG. 15 is a circuit diagram showing a seventh actual example of the amplifier device according to the third embodiment shown in the block diagram of FIG. 8.

FIG. 15 shows a seventh actual example of the amplifier circuit of the third embodiment shown in FIG. 8.

In FIG. 15, transistors M1 to M4 constitute the input amplifier stage 1a, and transistor M7 delivers a bias current to the input amplifier stage 1a. In the amplifier circuit constituted by source-follower comprised of transistors MP6A and MP6B, the slewing at the rising time is substantially determined by a current delivered by the transistor MP6B, and the slew rate at the falling time is dependent upon (W/L) of the transistor MP6B.

The control signal generation means is comprised of transistors MPC2 and MNC2, and (W/L) factors of respective transistors have the relationship expressed as $(W/L)_{MPC2}/(W/L)_{M7} > [(W/L)_{MNC2}/(W/L)_{M4}]/2$. Namely, a setting is made such that when Vin+ becomes equal to a potential higher than Vin− to some extent, the transistor MSW1 is turned ON to add a current I1 of the current source i1 to a current Io of the current source io. Thus, only when Vin becomes equal to a potential higher than Vin− to some extent, a current delivered from the transistor MP6B is increased, thus enhancing the output current driving capability.

Figure 16:
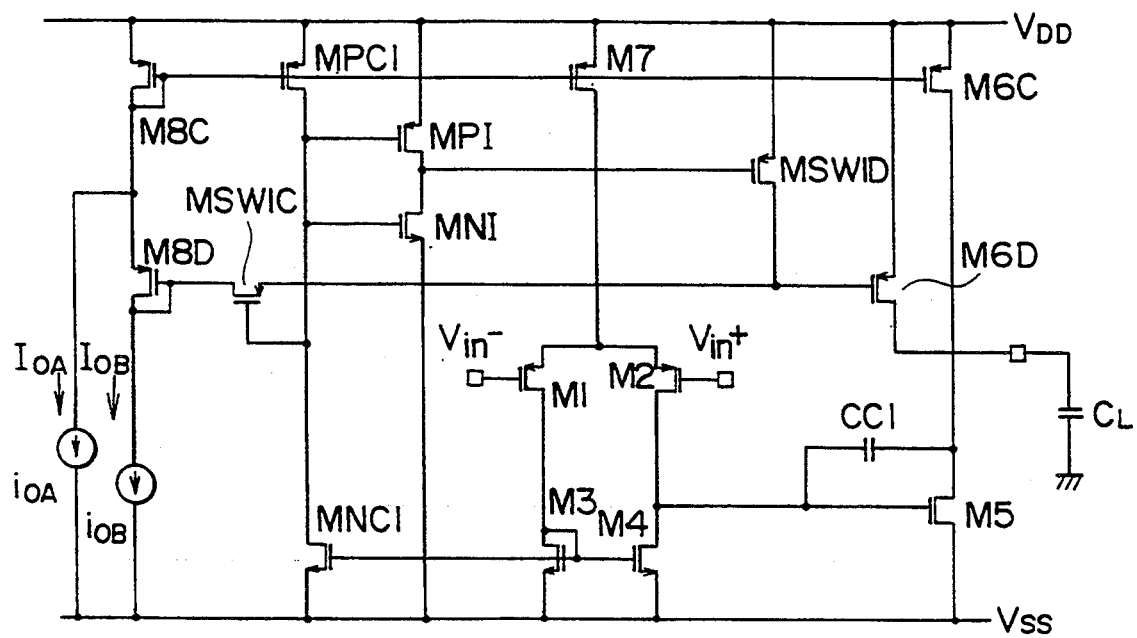
FIG. 16 is a circuit diagram showing an eighth example of the amplifier device according to the third embodiment shown in the block diagram of FIG. 8.

FIG. 16 shows an eighth actual example of the amplifier circuit of the third embodiment shown in FIG. 8.

The circuit shown in FIG. 16 is directed to the modified example where the actual example of the bias circuit shown in FIGS. 38 and 39 are applied in the circuit shown in FIG. 9. As previously described, the transistors M1 to M4 constitute the input amplifier stage 1a and the transistor M5 constitutes the output stage 1b. Further, the transistor delivers a bias current to the input amplifier stage 1a and the transistors M6C and M6D deliver a bias current to the output stage 1b. The control signal generation means is comprised of transistors MPC1 and MNC1 and the relationship of (W/L) is the same as that in the description of the circuit shown in FIG. 9. In addition, the transistors MP1 and MN1 constitute the inverting circuit to generate an inverted signal of the control signal.

In this configuration, a control signal generated when Vin+ becomes equal to a potential higher than Vin— to some extent, turns off the transistor MSW1D, and turns on the transistor MSW1C to apply the gate potential of the transistor M8D to the gate of the transistor M6D to thereby enhance the output current driving capability. At this time, since the sum of the gate-source voltage of the transistor M8D and the gate-source voltage MSW1C is applied to the gate of the transistor M6D, the (W/L) of the transistor M6D for delivering a current necessary for enhancing the output current driving capability can be reduced, i.e., the area there can be reduced.

Figure 17:
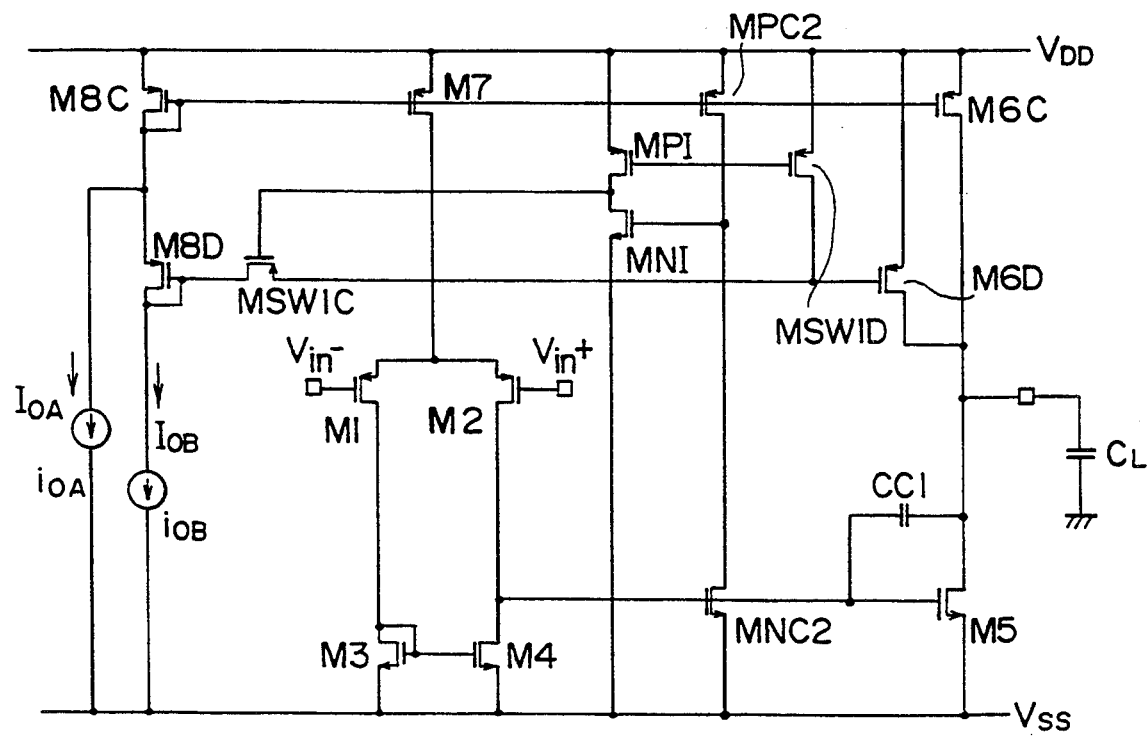
FIG. 17 is a circuit diagram showing a ninth actual example of the amplifier device according to the third embodiment shown in the block diagram of FIG. 8.

FIG. 17 shows a ninth actual example of the amplifier circuit of the third embodiment shown in FIG. 8.

The circuit shown in this figure is directed to the modified example of the control signal generation means in-the circuit of the circuit of the eighth actual example shown in FIG. 16, wherein the other output of the input amplifier stage 1a is used in the same manner as in the case of the circuit shown in FIG. 11. The relationship of respective (W/L) factors of the transistors MPC2 and MNC2 constituting the control signal generation means is the same as that in the description of the circuit shown in FIG. 11.

Figure 18:
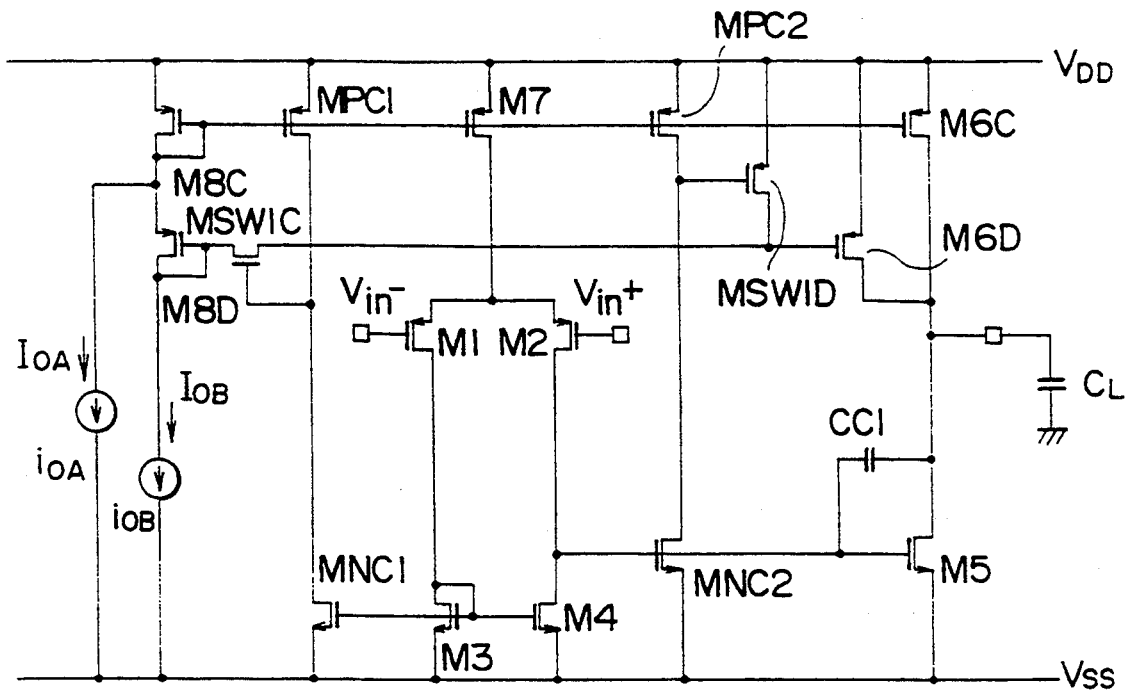
FIG. 18 is a circuit diagram showing a tenth actual example of the amplifier device according to the third embodiment shown in the block diagram of FIG. 8.

FIG. 18 is a circuit diagram showing a tenth actual example of the amplifier circuit according to the third embodiment shown in FIG. 8.

The circuit shown in this figure is directed to the other modified example of the control signal generation means in the circuit shown in FIG. 16 wherein, in place of the inverting circuit for the control circuit, the control signal generation means is comprised of transistors MPC1, MNC1, MPC2 and MNC2, and positive and negative outputs from the input amplifier means 1a are used. The relationship of respective (W/L) of the transistors MPC1, MNC1, MPC2 and MNC2 is the same as that in the circuit shown in FIGS. 9 and 11.

Figure 19:
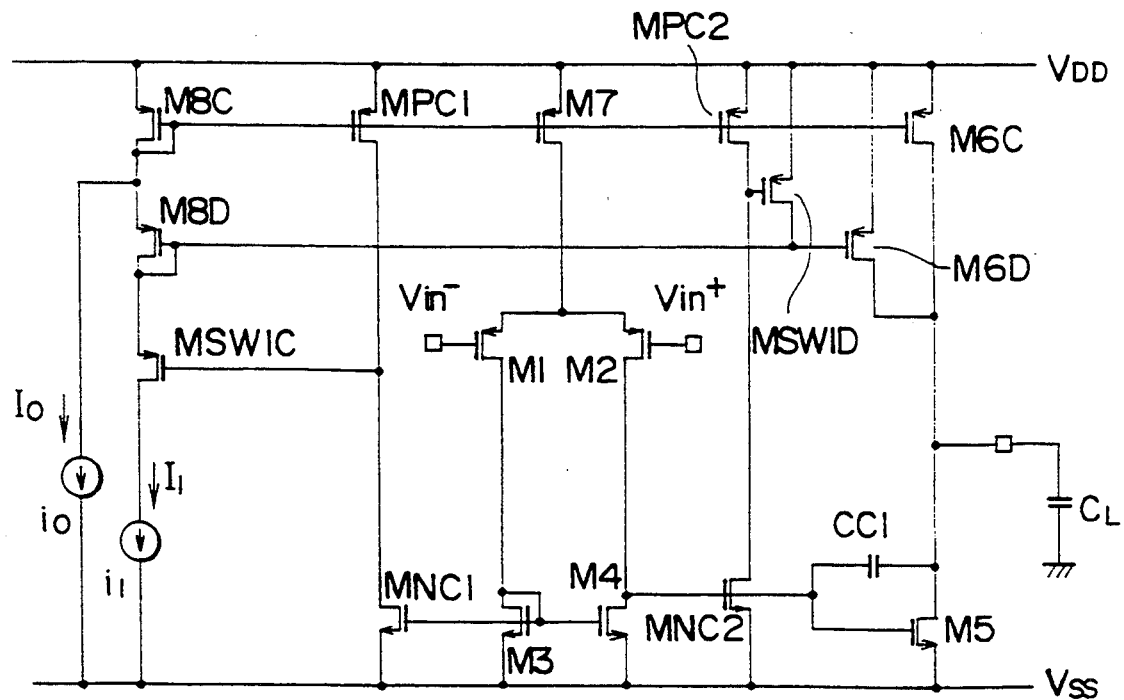
FIG. 19 is a circuit diagram showing an eleventh actual example of the amplifier device according to the third embodiment shown in the block diagram of FIG. 8.

FIG. 19 shows an eleventh actual example of the amplifier circuit of the third embodiment shown in FIG. 8.

The circuit shown in this figure is directed to the modified example of the circuit shown in FIG. 8 wherein connection of the transistor MSW1C used as a switch is altered, i.e., connection of its gate is the same as above, but the source/drain are connected in series with the drain of the transistor M8D. Effects and/or advantages similar to those in the circuit shown in FIG. 18 can be provided.

A fourth embodiment of an amplifier device according to the first aspect of this invention, and several actual examples thereof, will now be described in detail with reference to FIGS. 20 to 27.

Figure 20:
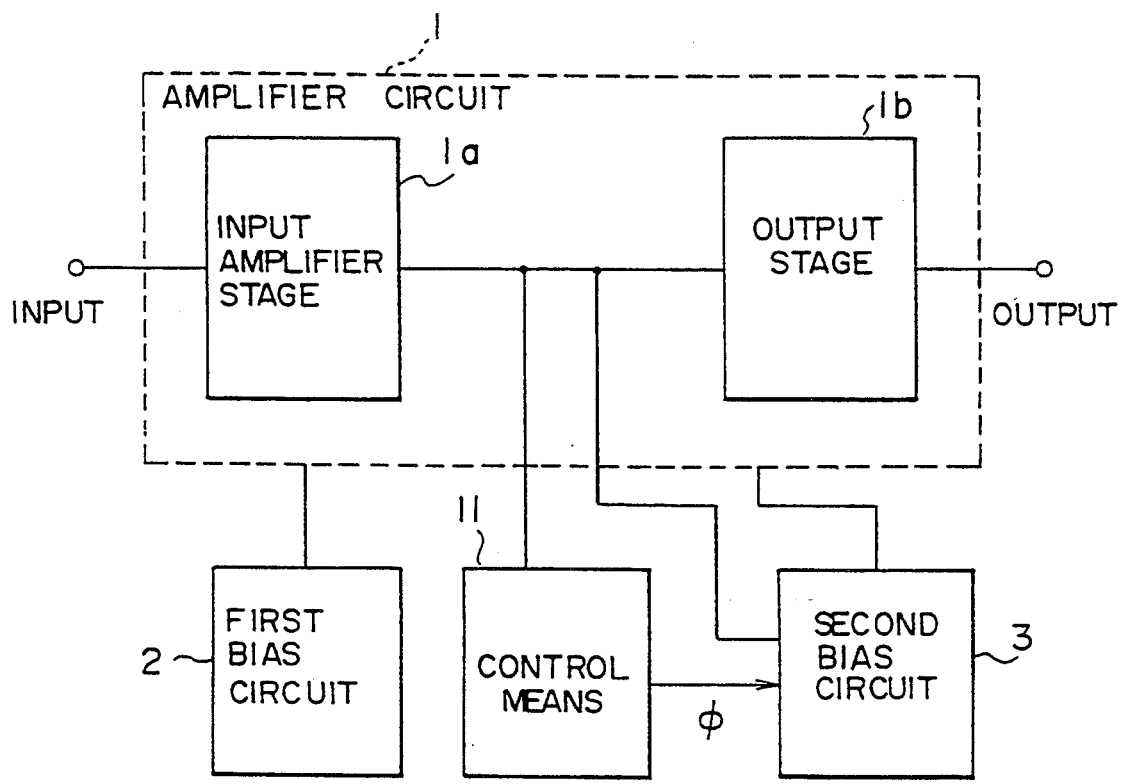
FIG. 20 is a block diagram showing an amplifier circuit according to a fourth embodiment, which is directed to the amplifier device according to the first aspect of the invention to control the second bias circuit by a control signal generated by using an output from the input amplifier stage.

FIG. 20 is a block diagram of a circuit of the fourth embodiment in which the second bias circuit 3 is constructed to determine a bias current by an output from the input amplifier stage 1a in a manner as shown in the second embodiment shown in FIG. 6 and in the third embodiment shown in FIG. 8.

Since the circuit shown in this figure commonly has the elements of the circuit of the third embodiment shown in FIG. 8 and the elements of the circuit of the second embodiment shown in FIG. 6, a lower power consumption can be realized.

Figure 21:
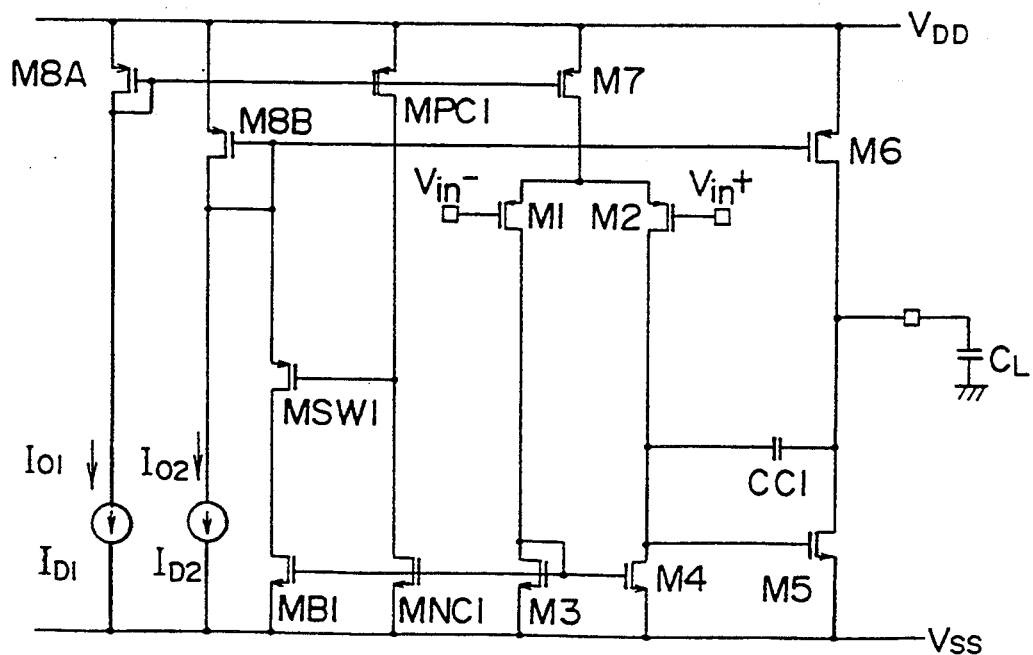
FIG. 21 is a circuit diagram showing a first example of an amplifier according to a fourth embodiment shown in the block diagram of FIG. 20.

FIG. 21 shows a first actual example of the amplifier circuit according to the fourth embodiment shown in FIG. 20.

The circuit shown in this figure is characterized in that a current source of which current value is determined by an output from the input amplifier stage 1a comprised of transistors M1 to M4 is used in place of the constant current source i1 of the second bias circuit in the circuit shown in FIG. 10 disclosed as the second actual example of the circuit of the third embodiment shown in FIG. 8. The current source of this second bias circuit is comprised of a transistor MB1, and an output potential on the drain terminal side of the transistor M3 of the input amplifier stage 1a is applied to the gate of the transistor MB1 to thereby determine a current value in accordance with an output from the input amplifier stage 1a. Thus, since this circuit commonly has the element of the circuit of the second actual example of the third embodiment shown in FIG. 10 and the element of the circuit of the actual example of the second embodiment shown in FIG. 7, a lower power consumption can be realized.

Figure 22:
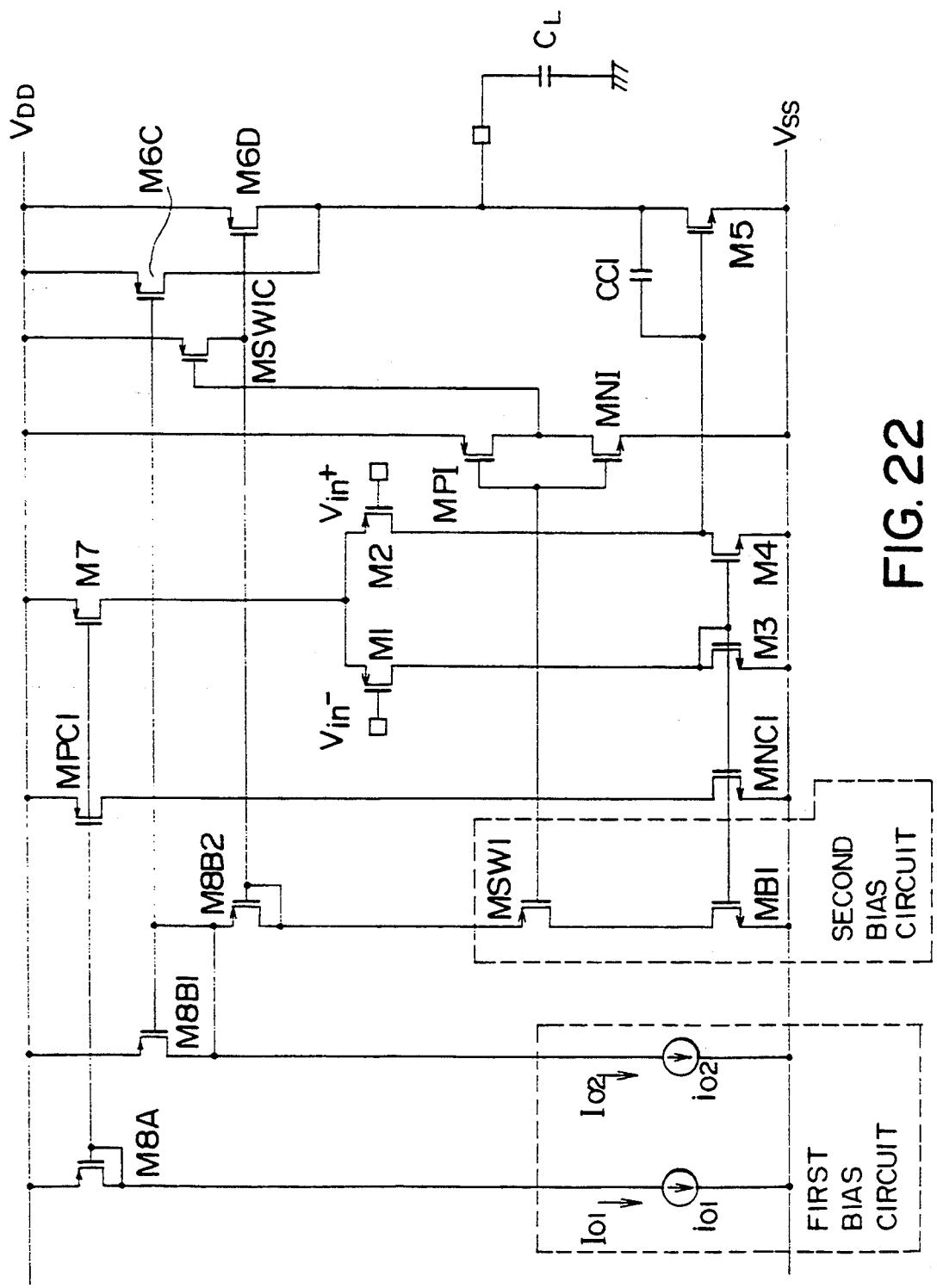
FIG. 22 is a circuit diagram showing a second example of an amplifier according to a fourth embodiment shown in the block diagram of FIG. 20.

FIG. 22 shows a second actual example of circuit of forth embodiment shown in FIG. 20.

The circuit shown in this figure is directed to the actual example discussed below. In the circuit of the first actual example of the fourth embodiment shown in FIG. 21, the transistor M6 for delivering a bias current to the transistor M5 constituting the output stage 1b is divided into two transistors, M6C and M6D. The transistor M8B serving as the input section for delivering a bias current to the output stage 1b is also divided into two transistors, M8B1 and M8B2, connected in series. In addition, a gate potential of the transistor M8B1 is applied to the gate of the transistor M6C, and a gate potential of the transistor M8B2 is applied to the gate of the transistor M6D. By this configuration, (W/L) of the transistor M6D for delivering a current necessary for enhancing the output current driving capability can be reduced, i.e., the area thereof can be reduced.

In addition, an approach may be employed to connect the source of the transistor MSW1C to the gate of the transistor M8B1 in place of VDD thus to make a setting such that the transistor M6D is not completely turned OFF even when the output current driving capability is not enhanced.

Figure 23:
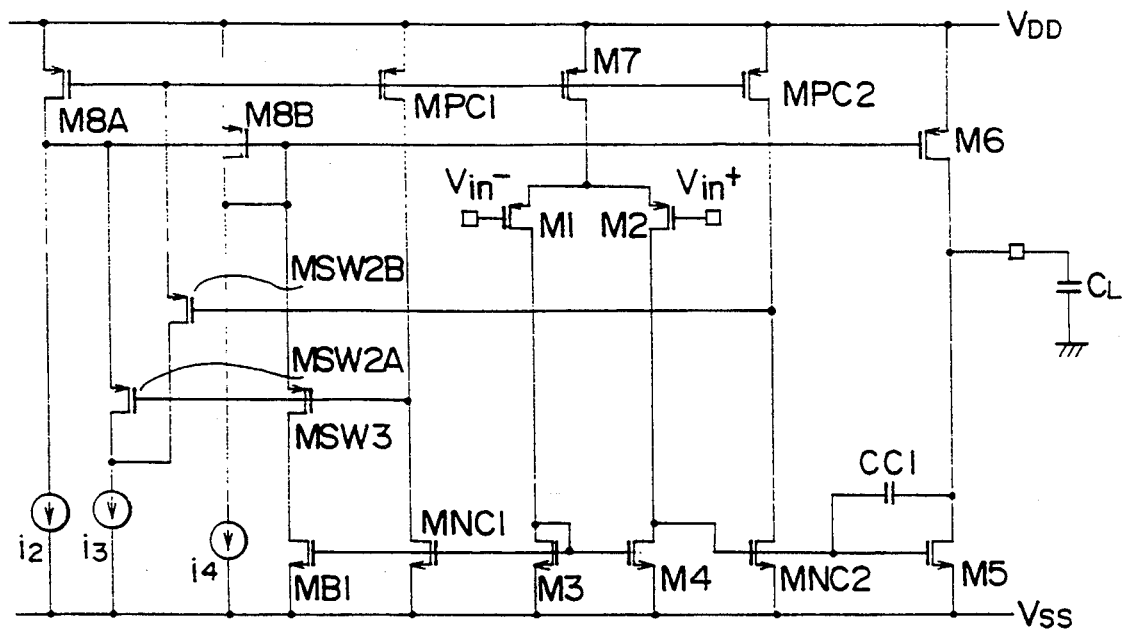
FIG. 23 is a circuit diagram showing a third example of an amplifier according to a fourth embodiment shown in the block diagram of FIG. 20.

FIG. 23 shows a third actual example of the circuit of the fourth embodiment shown in FIG. 20.

The circuit shown in this figure is directed to the actual example discussed below. In the circuit shown in FIG. 12 taken as the forth actual example of the circuit of the third embodiment shown in FIG. 8, a current source is used whose current value is determined by an output from input amplifier stage 1a comprised of transistors M1 to M4 in place of the constant current source i5 of the second bias circuit. The current source of the second bias circuit is comprised of a transistor MB1, and an output potential on the drain terminal side of the transistor M3 of the input amplifier stage 1a is applied to the gate of the transistor MB1 to thereby determine a current value in accordance with an output from the input amplifier stage 1a. Thus, since this circuit commonly has the elements of the circuit shown in FIG. 12 and the elements of the circuit shown in FIG. 7, a lower power consumption can be realized.

Figure 24:
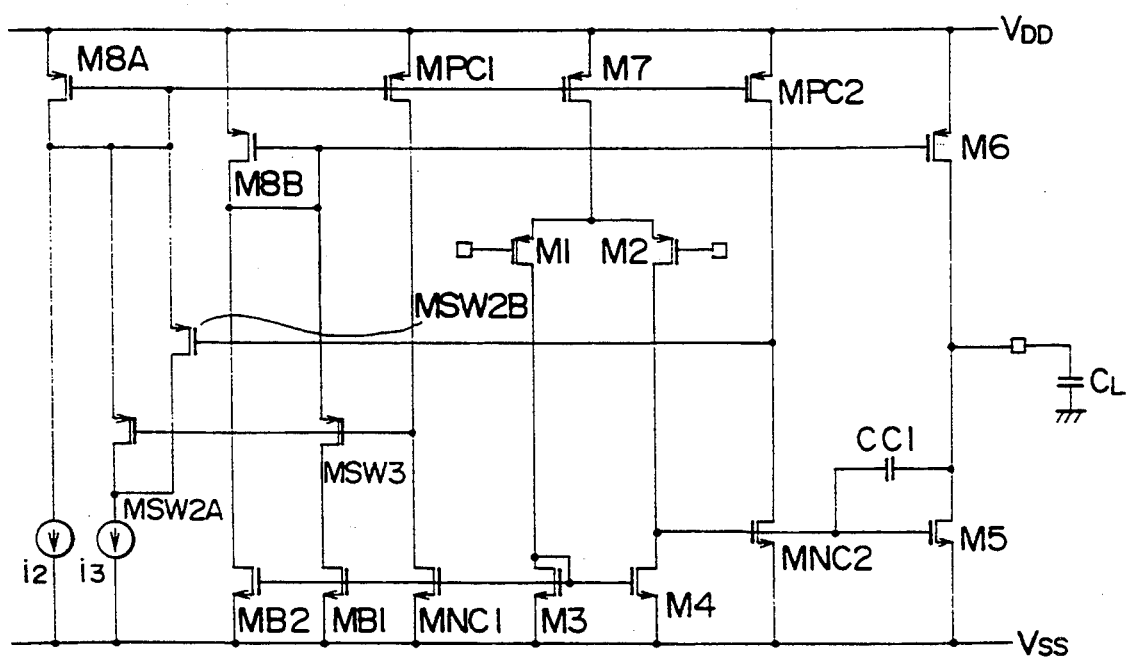
FIG. 24 is a circuit diagram showing a fourth example of an amplifier according to a fourth embodiment shown in the block diagram of FIG. 20.

FIG. 24 shows a fourth actual example of the circuit of fourth embodiment shown in FIG. 20.

The circuit shown in this figure is characterized in that the current value of the current source i4 for biasing the output stage of the first bias circuit in the circuit of the third actual example of the fourth embodiment shown in FIG. 23 is determined by an output from the input amplifier stage 1a in the same manner as in the current source of the second bias circuit. In this circuit, current source i4 is comprised of a transistor MB2. Thus, since the output current is controlled depending upon a difference between input potentials Vin+ and Vin− even when the output current driving capability is not enhanced because potentials Vin+ and Vin− are substantially equal to each other, a lower power consumption can be realized.

Figure 25:
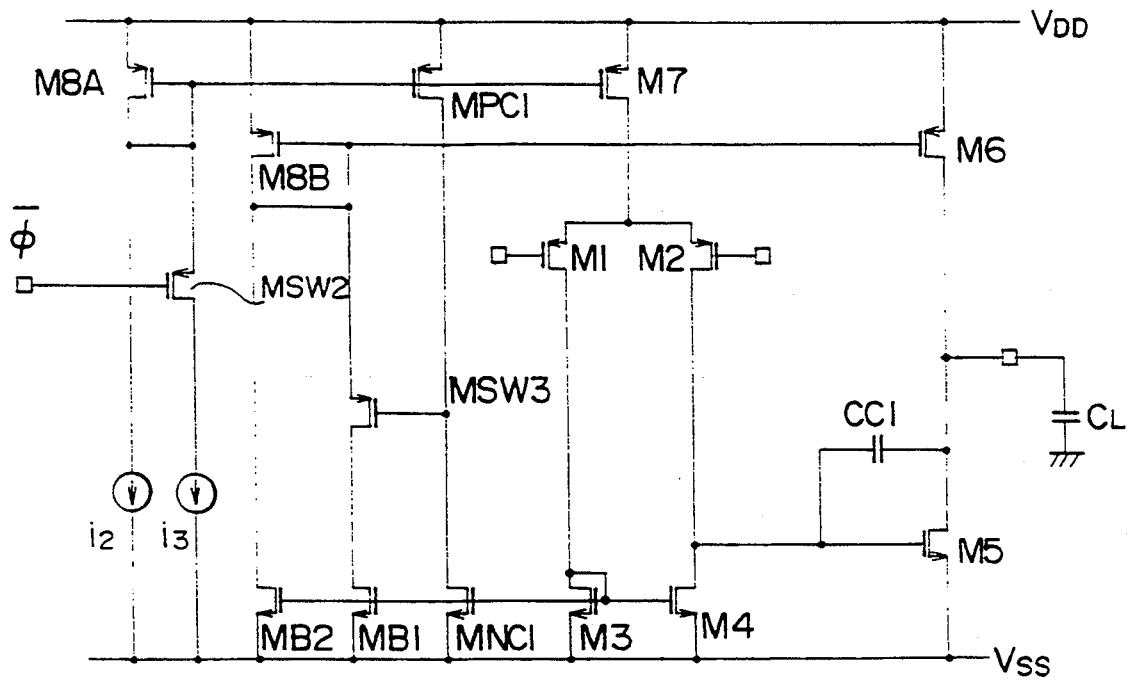
FIG. 25 is a circuit diagram showing a fifth example of an amplifier according to a fourth embodiment shown in the block diagram of FIG. 20.

FIG. 25 shows a fifth actual example of the circuit of the fourth embodiment shown in FIG. 20.

The circuit shown in FIG. 25 is directed to the example where a constant current source of which current value is determined by an output from the input amplifier stage 1a comprised of transistors M1 to M4 is used in place of the constant current source i5 of the second bias circuit in the circuit shown in FIG. 13 taken as the fifth actual example of the third embodiment shown in FIG. 8. The current source of the second bias circuit is comprised of a transistor MB1, and an output potential on the drain terminal side of the transistor M3 of the input amplifier stage 1a is applied to the gate of the transistor MB1 to thereby determine a current value depending upon an output from the input amplifier stage 1a. Thus, since this circuit commonly has the elements of the circuit of the fifth actual example of the third embodiment shown in FIG. 13 and the elements of the circuit of the actual example of the second embodiment shown in FIG. 7, a lower power consumption can be realized.

Figure 26:
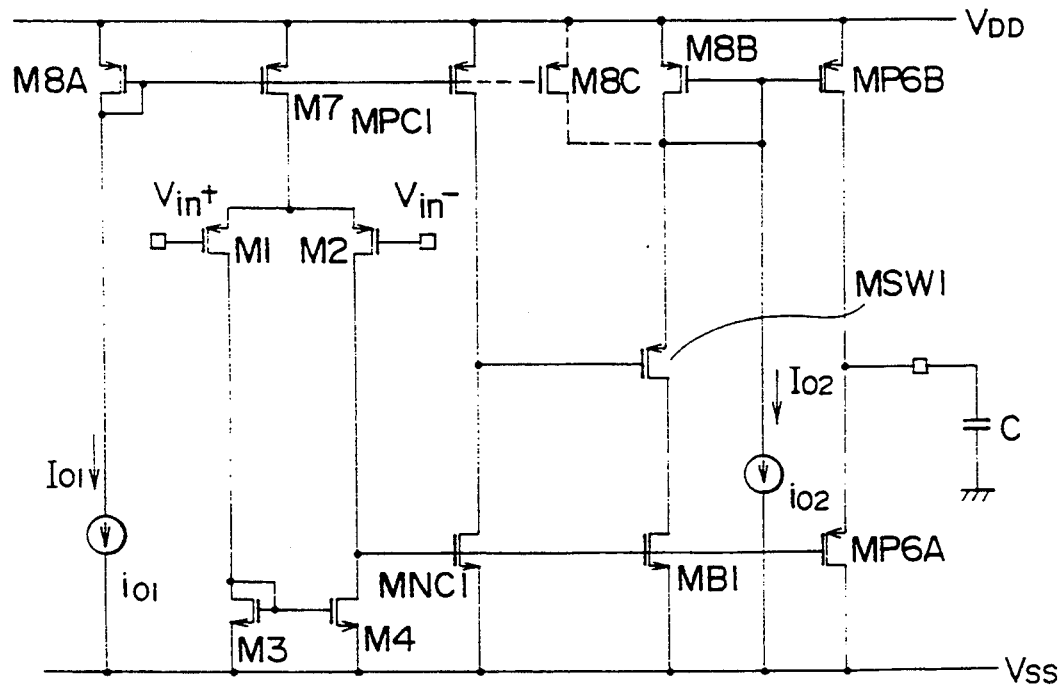
FIG. 26 is a circuit diagram showing a sixth example of an amplifier according to a fourth embodiment shown in the block diagram of FIG. 20.

FIG. 26 shows a sixth actual example of the circuit of the fourth embodiment shown in FIG. 20.

The circuit shown in FIG. 26 is directed to the actual example discussed below. In the circuit shown in FIG. 15 taken as the seventh actual example of the third embodiment shown in FIG. 8, by dividing the transistor M8 into transistors M8A and M8B, the path for delivering the bias current to the input amplifier stage 1a and the output stage 1b comprised of source follower is divided to allow the bias current delivered to the input amplifier stage 1a to be only the bias current I01 delivered from the first bias circuit, and to determine, in accordance with an output from the input amplifier stage 1a, a bias current delivered from the second bias circuit to the output stage 1b which is most closely related to the slew rate and power consumption. The current source of the second bias circuit is comprised of a transistor MB1, and its gate is connected to the output terminal of the input amplifier stage 1a. The bias current delivered from the transistor MB1 is determined by output level of the input amplifier stage 1a. Namely, when Vin+ becomes equal to a potential higher than Vin− to some extent, the transistor MSW1 is turned ON as described with reference to FIG. 15. As a result, a bias current corresponding to a difference between Vin+ and Vin− to the output stage to increase a current delivered from the transistor MP6B constituting the current source of the source follower, thus to enhance the output current driving capability.

Further, as indicated by the wiring of dotted lines in FIG. 26, an approach may be employed to sink a current flowing in the transistor MB1 by the transistor M8C when potentials of Vin+ and Vin− are equal to each other to reduce changes in the bias current of the source follower of the output stage 1b when the operating state shifts from the state where output current driving capability is enhanced to the state where the output current driving capability is not enhanced to thereby reduce changes in the gate-source voltage of the transistor MP6A, thus making it possible to shorten the following time of the gate-source voltage change of the transistor MP6A.

Figure 27:
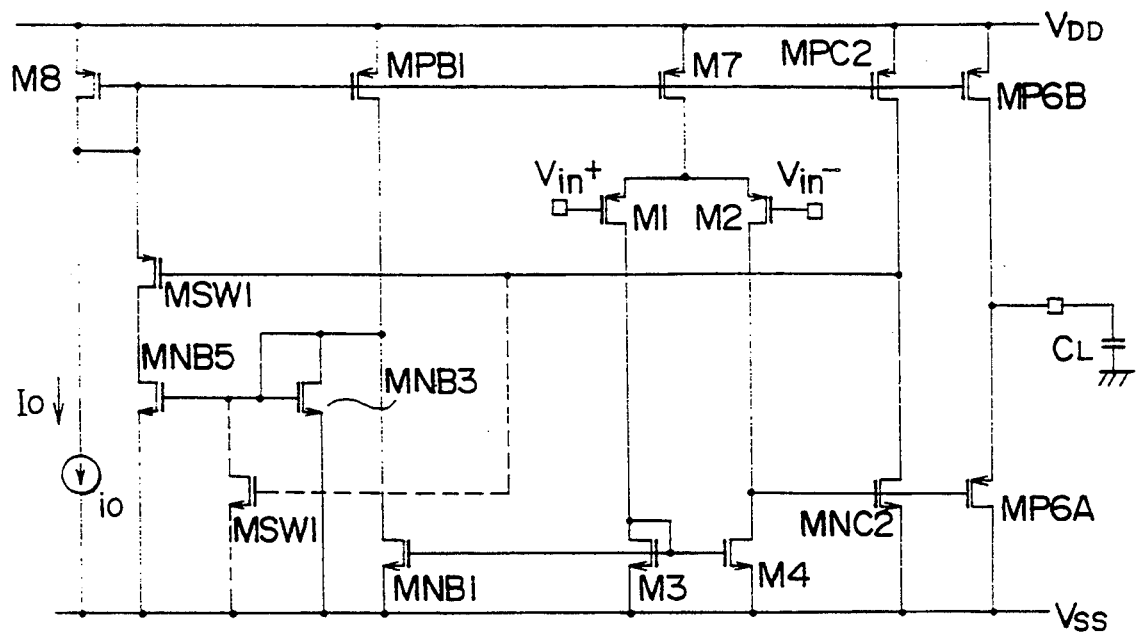
FIG. 27 is a circuit diagram showing a seventh example of an amplifier according to a fourth embodiment shown in the block diagram of FIG. 20.

FIG. 27 shows a seventh actual example of the circuit of the fourth embodiment shown in FIG. 20.

The circuit shown in this figure is directed to the example where the current value of the current source i1 of the second bias circuit is determined by using an output from the input amplifier stage 1a in the circuit shown in FIG. 15 taken as the actual example of the third embodiment shown in FIG. 8. In this example, the current source of the second bias circuit is comprised of transistors MNB1, MNB3, MNB5 and MPB1 and the intermittent switch for bias current from the current source of the second bias circuit is comprised of a transistor MSW1. As described with reference to, when the potential Vin+ is not higher than potential Vin− to some extent, the transistor MSW1 is turned OFF by a control signal generated from the control signal generation means comprised of transistors MPC2 and MNC2. As a result, the bias current of the second bias circuit is cut off. In contrast, when the potential Vin+ is higher than the potential Vin− to some extent, the transistor MSW1 is turned ON by a control signal generated from the control signal generation means to add a bias current of the second bias circuit to a bias current I0 of the first bias circuit. The circuit of the seventh actual example operates as follows. When the potential Vin+ is higher than potential Vin−, a current flowing in the transistor M3 is smaller than that when the potentials Vin+ and Vin− are equal to each other, the drain potential of the transistor M3 is lowered, and a current flowing in the transistor MNB1 is decreased. Since a current flowing in the transistor MNB8 is a the difference between a current delivered from the transistor MPB1 and a current flowing in the transistor MNB1, it is increased. Thus, the bias current of the second bias circuit, i.e., the current flowing in the transistor MNB5, is increased. As stated above, the magnitude of the current flowing in the transistor MNB5 is determined by the drain potential of the transistor M3 serving as an output from the input amplifier stage 1a.

In order to reduce changes in the bias current of the source follower of the output stage 1b when the operating state shifts from the state where the output current driving capability is enhanced to the state where the output current driving capability is not enhanced, changes are reduced in the gate-source voltage of the transistor MP6A, thus shortening the following time of changes in the gate-source voltage of the transistor MP6A, it is sufficient to allow a current flowing in the transistor MNB1, e.g., when the potentials Vin+ and Vin− are equal to each other to be equal to a current delivered from the transistor MPB1.

Further, the ON/OFF operation of the bias current of the second bias circuit may be conducted by using a transistor of the NMOS type as indicated by dotted lines in FIG. 27.

A fifth embodiment of an amplifier device according to the first aspect of this invention and three actual examples thereof will now be described with reference to FIGS. 28 to 31.

Figure 28:
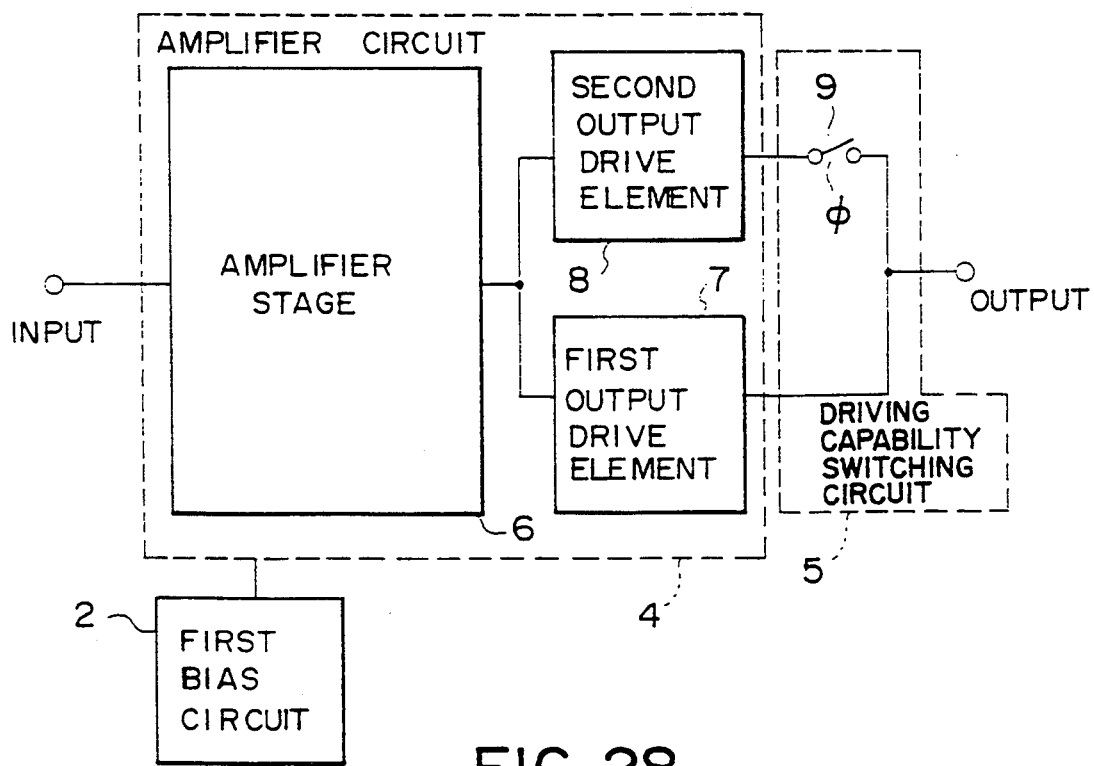
FIG. 28 is a block diagram showing an amplifier circuit according to a fifth embodiment, which is directed to an amplifier device according to the first aspect of this invention to control the output driving capability by an intermittent control of the output drive element.

FIG. 28 is a block diagram of an amplifier circuit according to the fifth embodiment of this invention adapted to control the output driving capability by the ON/OFF control of the output stage drive element.

The buffer circuit shown in FIG. 28 is directed to a signal of which level periodically changes as an input signal in the same manner as in the case of the first embodiment shown in FIGS. 3 to 5. This buffer circuit includes only the first bias circuit 2 for delivering a constant current shown in FIG. 3, but does not include means turned ON and OFF in time. Furthermore, the amplifier circuit constituting the essential part of the fifth embodiment is roughly composed of an amplifier section 4 and a driving capability switching circuit 5.

The amplifier circuit section 4 comprises an input amplifier stage 6 and two output drive elements 7 and 8, and the driving capability switching circuit comprises a switch 9. This switch is inserted in series between one output drive element 8 and the output terminal.

Thus, the output drive element 7 is driven at all times, and the output drive element 8 is driven only when the switch 9 is turned ON. This switch 9 is subjected to ON/OFF control by a control signal $\phi$.

The output driving capability is determined only by the output drive element 7 when the switch 9 is turned OFF. The output driving capability is determined by the two output drive elements 7 and 8, and the output driving capability is enhanced only for a period during which the switch 9 is turned ON by the ON/OFF control of the switch 9. Thus, the slew rate is improved.

Further, since the amplifier circuit is brought into an operating state at all times by the output drive element 7 even if the output drive element 8 does not contribute to the operation of the amplifier circuit, resulting in no possibility that the output is in a high impedance state, the output voltage is stabilized without undergoing the influence of disturbance. It is to be noted that if the output element 7 is selected so that the power consumption determined by the output drive element 7 is reduced, it is possible to prevent the power consumption being increased to a great degree.

In addition, in accordance with the fifth embodiment, the control of the driving capability is carried out by ON/OFF control of the output drive element 8 and the driving capability for a time period during which the circuit is driven by the both drive elements 7 and 8 is fixed. For this reason, the current value at this time can be smaller than the instantaneous current determined by the initial value of the bias current of the conventional system.

It is to be noted that while the switch 9 is provided on the output side of the output stage drive element 8 in the circuit of FIG. 28, if such a switch is provided on the input side of the output drive element 8, effects and/or advantages similar to the above can be provided.

Figure 29:
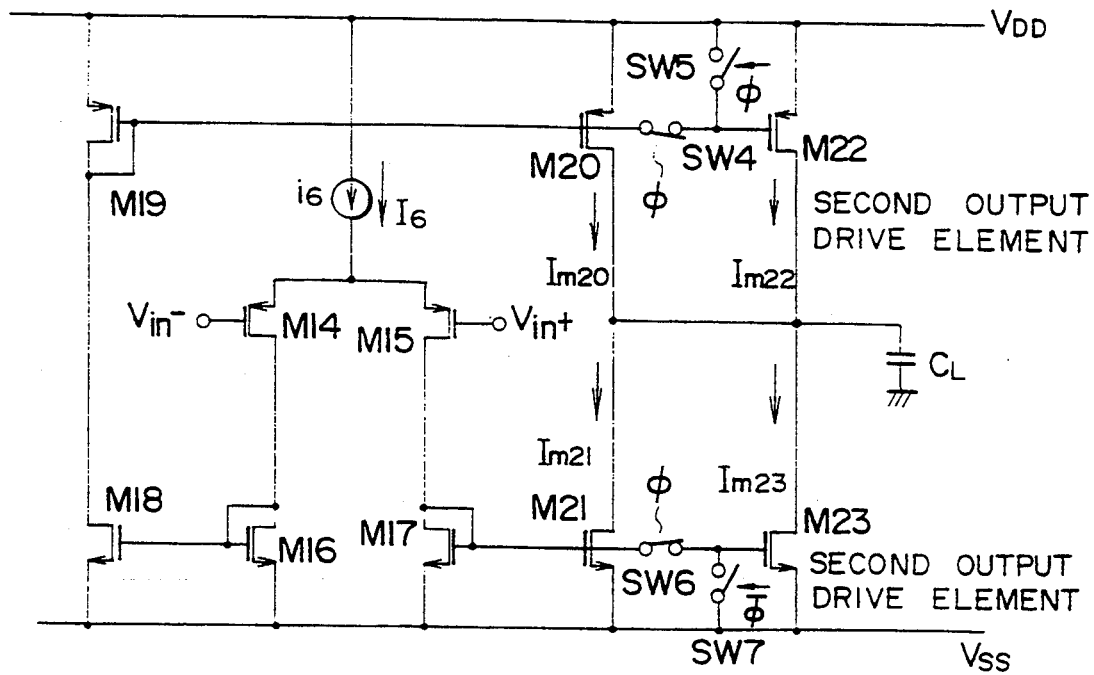
FIG. 29 is a circuit diagram showing a first actual example of an amplifier device according to a fifth embodiment shown in the block diagram of FIG. 28.

FIG. 29 shows a first actual example of the circuit of the fifth embodiment shown in FIG. 28.

In this figure, transistors M14 to M19 correspond to the input amplifier stage 6, transistors M20 and M21 correspond to the output drive element 7, and transistors M22 and M23 correspond to the output stage element 8. Thus, an operational amplifier of a single stage structure is formed.

The switch SW4 is connected to the gate of the transistor 22, and the switch SW6 is connected to the gate of the transistor 23. These switches SW4 and SW6 correspond to the switch 9.

The transistors M14 and M15 are comprised of a p-channel FET to constitute the differential input terminal. When the potential Vin− of an input signal to the transistor M14 and the potential Vin+ have the relationship expressed as Vin+=Vin−, both transistors are turned ON; when they have the relationship expressed as Vin+>Vin−, only the transistor M14 is turned ON; and when they have the relationship expressed as Vin+<Vin−, only the transistor M15 is turned ON.

The transistors M16 and M18 are comprised of an n-channel FET. These transistors constitute a current mirror circuit in which the transistor M16 serves as the reference current input terminal and the transistor M18 serves as the output terminal. A current from the transistor M14 is input to the transistor M16 as a reference current.

The transistors M19, M20 and M22 are comprised of a p-channel FET, and a current mirror circuit is formed in which the transistor 19 serves as the reference current input terminal and the transistors M20 and M22 serve as the output terminal. An output current from the transistor M18 is given as a reference current to the transistor M19.

The transistors M17, M21 and M23 are comprised of an n-channel FET. These transistors constitute a current mirror circuit in which the transistor M17 serves as the reference current input terminal and the transistors serve as the output terminal.

A switch SW5 is connected between the gate and the source of the transistor M22, and a switch SW7 is connected between the gate and the source of the transistor M23. When the switches SW4 and SW6 are in the ON state, these switches SW5 and SW7 are turned OFF, while when the switches SW4 and SW6 are in OFF state, they are turned ON. By this operation, the transistors M22 and M23 are completely turned OFF.

In the circuit of the first actual example of the fifth embodiment thus constructed, the output driving capability is determined by the transistors M20 and M21 when the switches SW4 and SW6 are in the OFF state in accordance with the relationship in magnitude between Vin− and Vin+ of the input signal, and the transistors M20 and M21 are operative at all times. Thus, there is no possibility that the output is placed in a high impedance state. Further, when the switches SW4 and SW6 are in the ON state, the driving capability of the circuit is determined by not only the transistors M20 and M21, but also by the transistors M22 and M23.

Furthermore, since the value of a current flowing in the output when the switch is turned ON is suppressed by the constant current source i6, there is no possibility that the instantaneous current becomes excessive.

Here, the maximum output driving capability when the switches SW4 and SW6 are in the OFF state is given by the following equation:

$$I6 \cdot (W/L)_{M21}/(W/L)_{M17} = I6 \cdot (W/L)_{M18} \cdot (W/L)_{M20}/(W/L)_{M16} \cdot (W/L)_{M19} \quad (1)$$

In the above equation, W represents gate widths of respective transistors, L represents a gate length, and suffix corresponds to reference numeral of each transistor.

Further, the maximum output current driving capability when the switches SW4 and SW5 are in the ON state is given by the following equation:

$$I6 \cdot \{(W/L)_{M21} + (W/L)_{M23}\}/(W/L)_{M17} = I6 \cdot \{(W/L)_{M18} \cdot \{(W/L)_{M20} + (W/L)_{M22}\}/\{(W/L)_{M16} \cdot (W/L)_{M19}\} \quad (2)$$

Thus, when the ratio between $(W/L)_{M21}$ and $(W/L)_{M23}$ and the ratio between $(W/L)_{M20}$ and $(W/L)_{M22}$ are selected so that the equation (1) is sufficiently grater than the equation (2), there is no possibility that the power consumption increases to much degree.

In accordance with the first actual example of the fifth embodiment, in addition to the above operation, when the transistors M22 and M23 SW4 and SW6 are turned ON, the switches are turned ON. As a result, the gate potential of the transistor M22 is caused to be the power supply potential, and the gate potential of the transistor M23 is caused to be the ground potential. Thus, charges due to parasitic capacitance of the gates of the respective transistors M22 and M23 are discharged. Accordingly, the respective transistors M22 and M23 are securely turned OFF when the switches are turned OFF.

Figure 30:
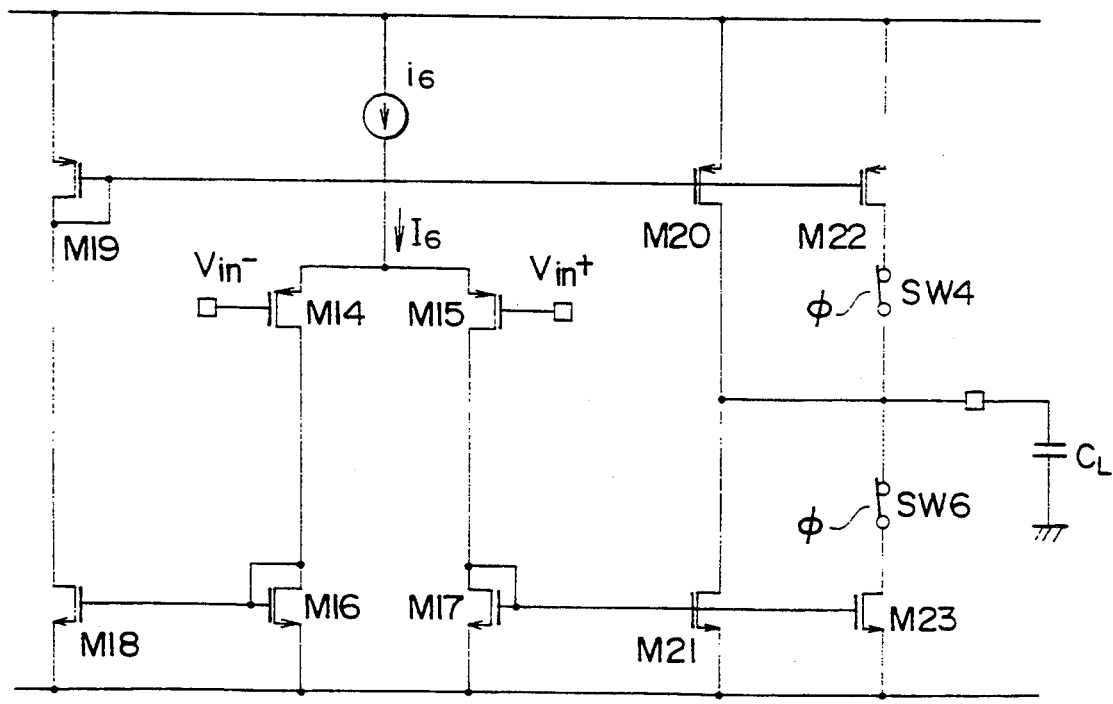
FIG. 30 is a circuit diagram showing a second actual example of the amplifier device according to the fifth embodiment shown in the block diagram.

FIG. 30 is a circuit diagram showing a second actual example of the circuit of the fifth embodiment shown in FIG. 28, which corresponds to a modified example of the circuit of the first actual example of the fifth embodiment of FIG. 29.

As shown in FIG. 30, if the second output drive element and the switch section are inserted in series with the drains of the transistors M22 and M23 serving as the second output drive element, effects and/or advantages equivalent to those of the circuit of the first actual example shown in FIG. 29.

Further, in accordance with the second actual example, since there is employed an arrangement such that the switches SW4 and SW6 interrupt respective current paths of the transistors M22 and M23, if these switches SW4 and SW6 are turned OFF, the influence of currents from the transistors M22 and M23 can be securely eliminated. As a result, switches SW5 and SW7 as shown in FIG. 29 of the first actual example become unnecessary.

Figure 31:
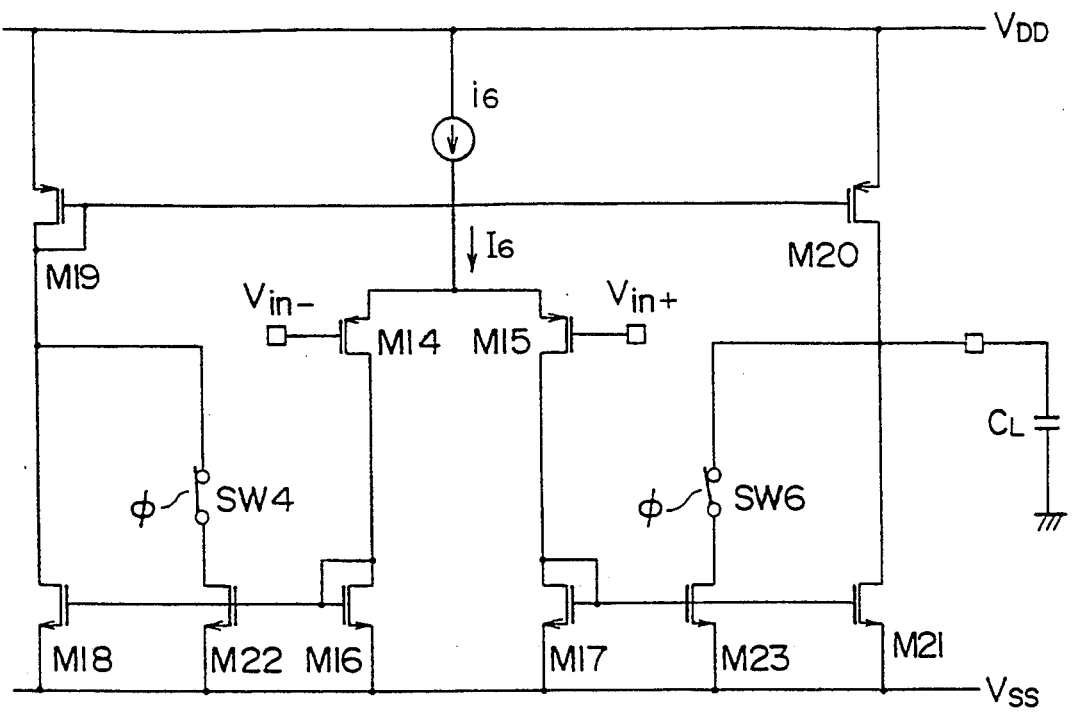
FIG. 31 is a circuit diagram showing a third actual example of an amplifier device according to a fifth embodiment shown in the block diagram of FIG. 28.

FIG. 31 is a circuit diagram showing a third actual example of the circuit of the fifth embodiment shown in FIG. 28, which corresponds to another modified example of the circuit of the first actual example of FIG. 30.

As shown in FIG. 31, also in the case where there is employed an arrangement such that the second output drive element is not directly connected in parallel with the output to connect the transistor M22 as the second output drive element in parallel with the transistor M18 thus to effect current amplification, similar effects and/or advantages can be provided.

Namely, when the switch is in OFF state, only a current from the transistor M18 is subjected to amplifying operation through the transistors M19 and M20, whereas when the switch SW4 is in ON state, not only a current from the transistor M18, but also a current from the transistor M22, flow in the transistor M19, so the output driving capability is increased.

A sixth embodiment of an amplifier device according to the first aspect of this invention and actual examples thereof will now be described in detail with reference to FIGS. 32 and 33.

Figure 32:
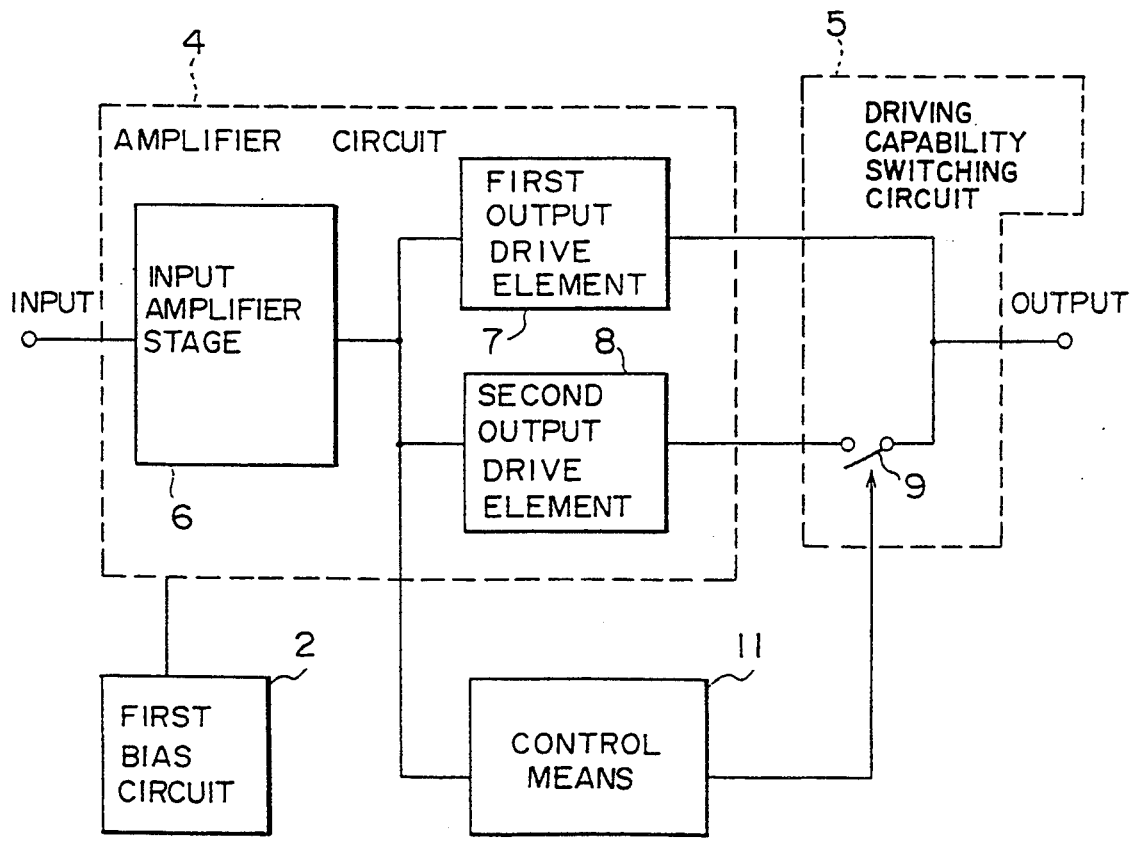
FIG. 32 is a block diagram showing an amplifier circuit according to a sixth embodiment, which is directed to an amplifier device according to the first aspect of this invention to control the output driving capability by an intermittent control of the output drive element.

FIG. 32 is a block diagram showing an amplifier circuit of the sixth embodiment constructed so as to control the output driving capability by a control signal generated by using an output from the input amplifier stage 6 according to this invention control means 11 using an output from the input amplifier stage 6 is added in the amplifier circuit of the fifth embodiment of this invention shown in FIG. 28.

As described in connection with the circuit of FIG. 8, in the case where the potential change of an input signal is small and it is therefore not necessary to enhance the output current driving capability, the potential change or the current change of an output from the input amplifier stage 6 is small. Accordingly, this amplification circuit does not produce a control signal. Thus, lower power consumption is realized without unnecessarily enhancing the current driving capability.

Figure 33:
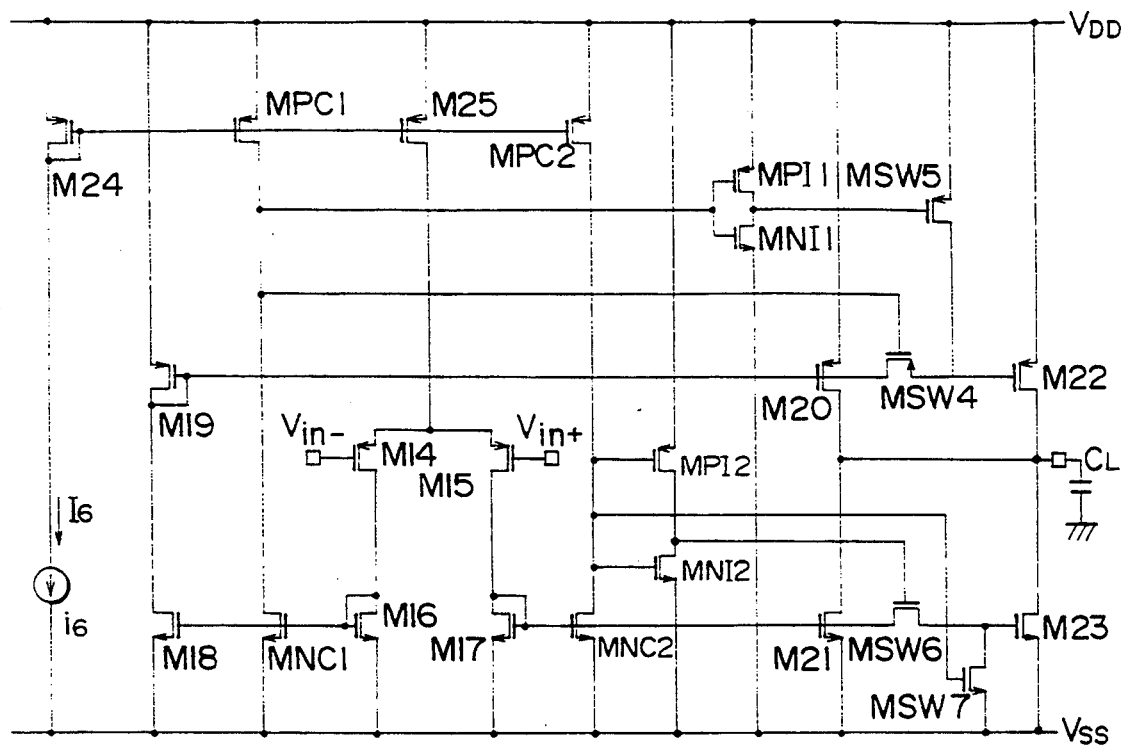
FIG. 33 is a circuit diagram showing an actual example of the sixth embodiment shown in the block diagram of FIG. 32.

FIG. 33 is a circuit diagram showing an actual example of the circuit shown in FIG. 32. In the circuit of the actual example of the sixth embodiment shown in FIG. 33, control signal generation means using an output from the input amplifier stage is added in the first actual example of the fifth embodiment shown in FIG. 5, and switches SW4 to SW7 comprise transistors MSW4 to MSW7, respectively. The control signal generation means is composed of transistors MPC1, MNC1, MPC2 and MNC2, and respective (W/L) factors of the transistors is set as follows:

$$(W/L)_{MPC1}/(W/L)_{M25} > [(W/L)_{MNC1}/(W/L)_{M16}]/2, \text{ or}$$

$$(W/L)_{MPC2}/(W/L)_{M25} > [(W/L)_{MNC2}/(W/L)_{M17}]/2$$

Namely, when Vin+ becomes equal to a potential higher than Vin− to some extent, the transistor MSW4 is turned ON and the transistor MSW5 is turned OFF by control signals generated at the transistors MPC1 and MNC1 to also allow the transistor M22 serving as the second output stage drive element to be operative, thus to enhance the output current driving capability. Further, when Vin− becomes equal to a potential higher than Vin+ to some extent, the transistor MSW6 is turned ON and the transistor MSW7 is turned OFF by control signals generated at the transistors MPC2 and MNC2 to also allow the transistor M23 serving as the transistor M23 to be operative, thus to enhance the output current driving capability. Thus, in the case where the potential change of an input signal is small and it is therefore not necessary to enhance the output current driving capability, this amplification circuit does not produce a control signal. Thus, lower power consumption is realized without unnecessarily enhancing the current driving capability.

A seventh embodiment of an amplifier device according to the first aspect of this invention and several actual examples thereof will now be described in detail with reference to FIGS. 34 to 39C.

Figure 34:
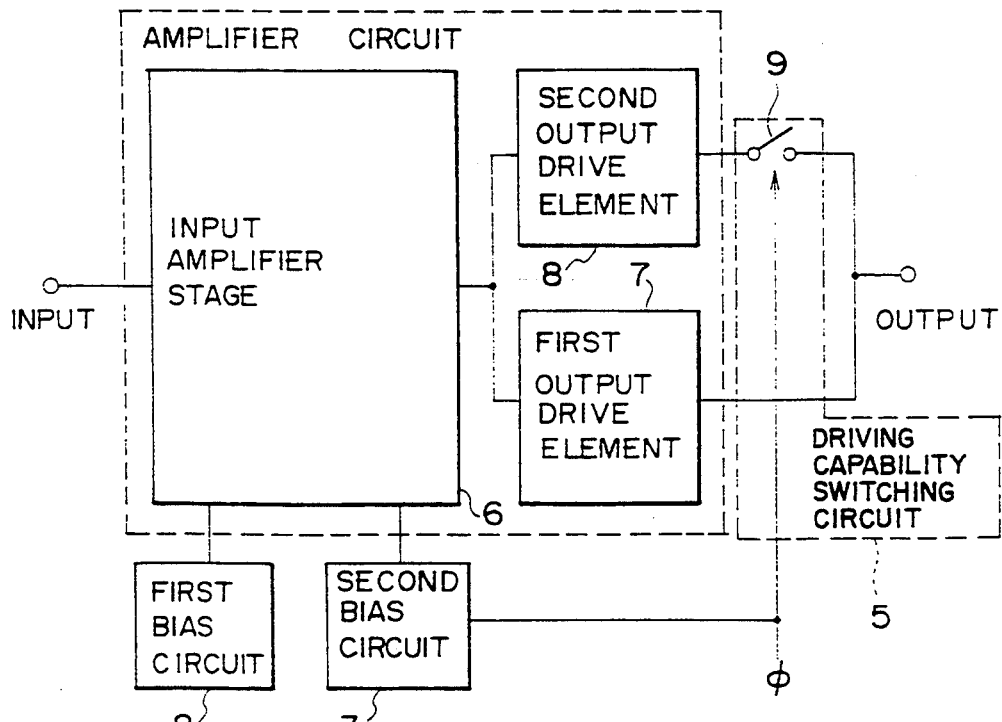
FIG. 34 is a block diagram showing an amplifier circuit according to a seventh embodiment of a structure in which the first embodiment shown in FIG. 3 and the fifth embodiment shown in FIG. 28 are combined to control the output driving capability by both the bias and the drive element.

FIG. 34 is a block diagram of the amplifier circuit of the seventh embodiment constructed so that the driving capability by the bias shown in FIG. 3 and the driving capability by the drive elements shown in FIG. 28 are combined to control the output driving capability.

The circuit of the seventh embodiment includes, as the bias circuit, a first bias circuit 2 and a second bias circuit 3 in the circuit of the first embodiment shown in FIG. 3, and includes, as the drive element, a first drive element 7 and a second drive element 8 in the circuit of the fifth embodiment shown in FIG. 28, wherein the second bias circuit 3 and the second drive element 8 are subjected to ON/OFF control by the same control signal $\phi$.

If the amplifier device is constructed in this way, since that amplifier device commonly has the both elements of the first and fifth embodiments shown in FIGS. 3 and 28, effects and/or advantages similar to the above can be provided as a matter of course. In addition, since the ratio at the time of enhancing the output current driving capability and the ratio at the time of reducing the output current driving capability are determined by both the bias circuits 2 and 3 and the output drive elements 7 and 8, it becomes easy to increase the ratio between when the output current driving capability is great and when that driving capability is small.

Figure 35:
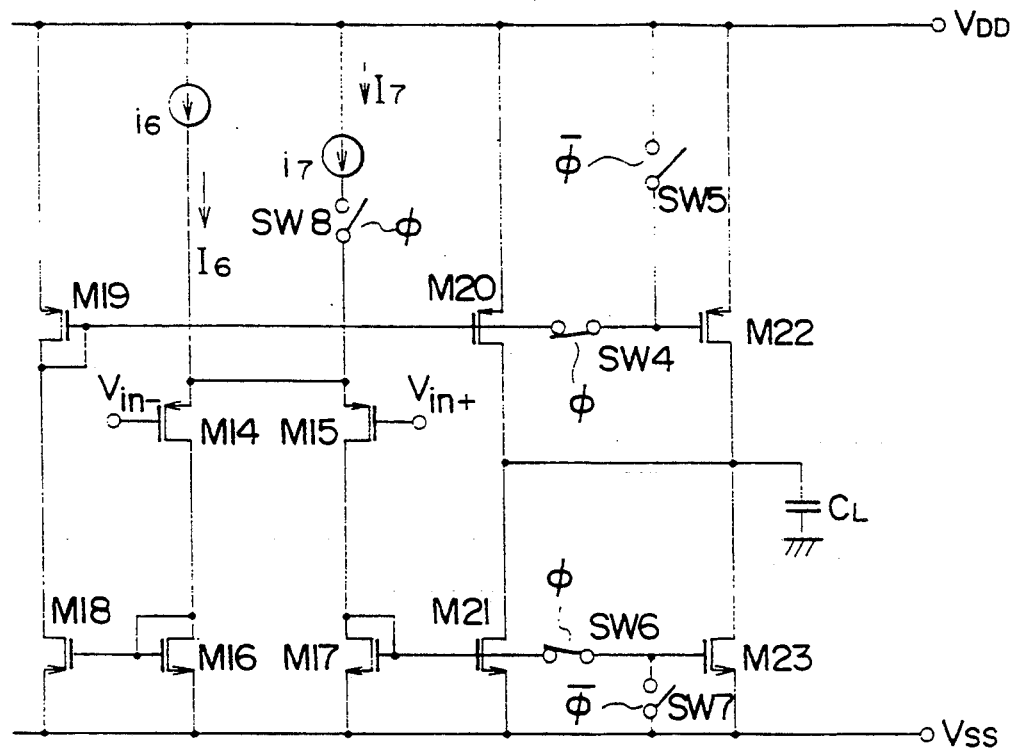
FIG. 35 is a circuit diagram showing a first actual example of an amplifier circuit according to the seventh embodiment shown in the block diagram of FIG. 34.

FIG. 35 is a circuit diagram showing a first actual example of the circuit of the seventh embodiment shown in FIG. 34.

The circuit of the seventh embodiment shown in FIG. 35 corresponds to the circuit in which the series circuit of the constant current circuit i7 and the switch SW8 constituting the second bias circuit 3 is connected in parallel with the constant current circuit i6 of the circuit shown in FIG. 28. The switch SW8 is subjected to ON/OFF control by the same control signal $\phi$. Additionally, reference numeral I7 denotes a bias current from the constant current circuit i7.

By constructing the amplifier device in this way, the maximum output current driving capability when the switches SW4, SW6 and SW8 are in the OFF state is shown in the above equation (1). Further, the maximum output current driving capability when the switches SW4, SW6 and SW8 are in ON state is given by the following equation:

$$(I6+I7) \cdot \{(W/L)_{M21}+(W/L)_{M23}\}/(W/L)_{M17} = (I6+I7) \cdot [(W/L)_{M18} \cdot \{(W/L)_{M20}+(W/L)_{M22}\}/\{(W/L)_{M16} \cdot (W/L)\}_{M19}] \quad (3)$$

Thus, since the relationship expressed as (1)<(3) is determined by not only the ratio between $(W/L)_{M21}$ and $(W/L)_{M23}$, and the ratio between $(W/L)_{M20}$ and $(W/L)_{M22}$ but also the ratio between I6 and I6+I7, if the same driving capability as that of the circuit of the fifth embodiment of FIG. 28 is assumed, it is possible to allow the sizes of the transistors to be smaller.

Figure 36:
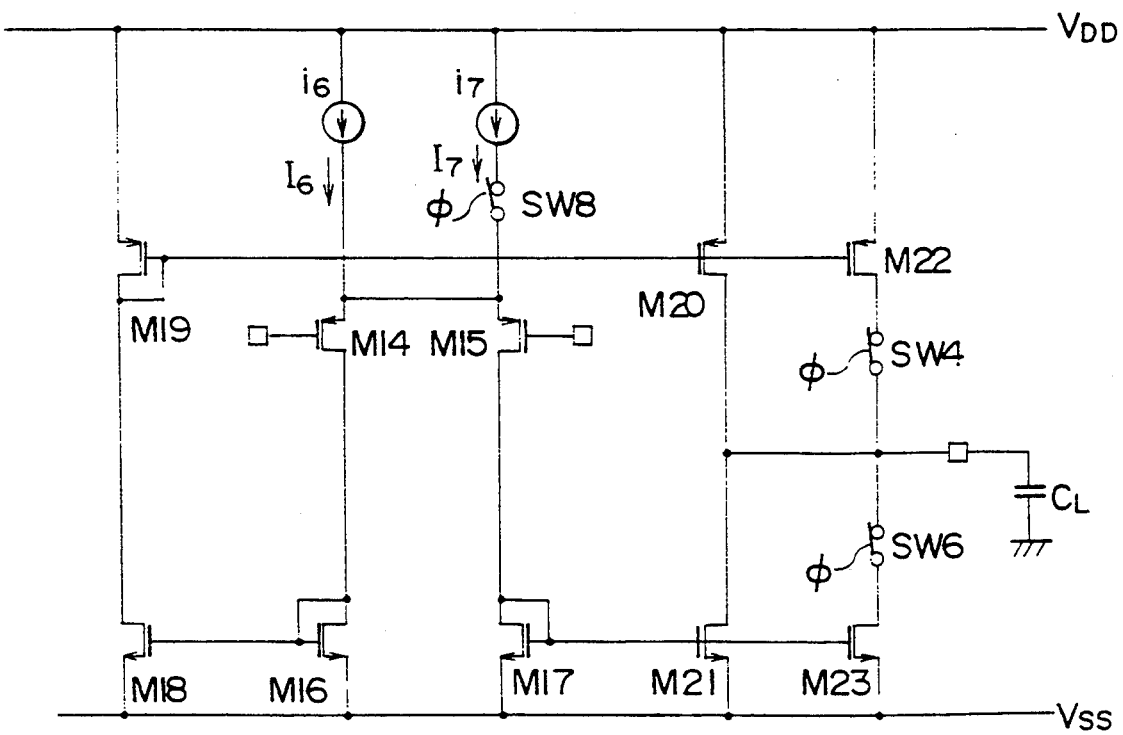
FIG. 36 is a circuit diagram showing a second actual example of the amplification circuit according to the seventh embodiment shown in the block diagram of FIG. 34.

FIG. 36 is a circuit diagram showing a second actual example of the circuit of the seventh embodiment shown in FIG. 34, wherein a second bias circuit is added to the circuit of the second actual example of the fifth embodiment shown in FIG. 30. Also by this circuit, effects and/or advantages similar to those of the first example of the seventh embodiment shown in FIG. 35 can be provided.

Figure 37:
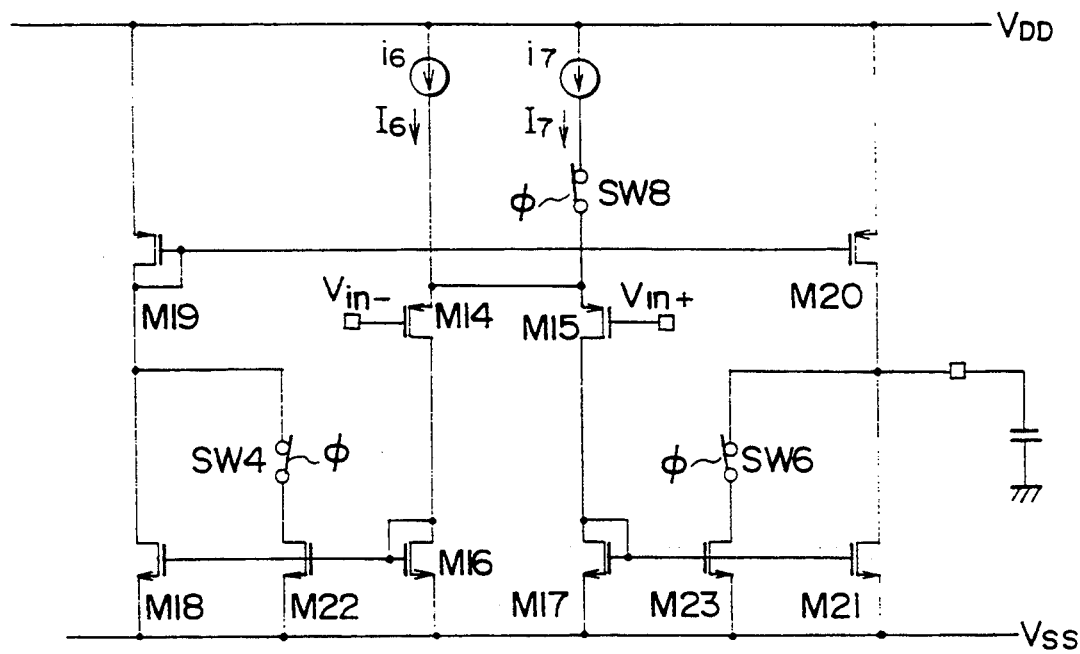
FIG. 37 is a circuit diagram showing a third actual example of an amplifier circuit according to the seventh embodiment shown in the block diagram of FIG. 34.

Further, FIG. 37 is a circuit diagram showing a third actual example of the circuit of the seventh embodiment shown in FIG. 34, wherein a second bias circuit is added to the circuit of the third actual example of the fifth embodiment shown in FIG. 31. Also by this circuit, effects and/or advantages similar to those of the first example of the seventh embodiment shown in FIG. 35 can be provided.

FIG. 38 is a circuit diagram showing an actual example of the current source circuit subjected to ON/OFF control by the control signal $\phi$ and constituting the second bias circuit.

Figure 38A:
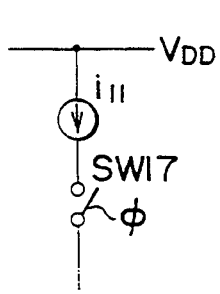
FIGS. 38A to 38E are circuit diagrams showing actual examples of the current source circuit constituting the second bias circuit.

FIG. 38A is a circuit diagram of a fourth actual example showing the above-mentioned constant current source circuit at the same level as that of FIGS. 4, 5 and 35, and FIGS. 38B to 38E show circuit configurations in a more practical sense, which correspond to the fifth to eighth actual examples, respectively.

Figure 38B:
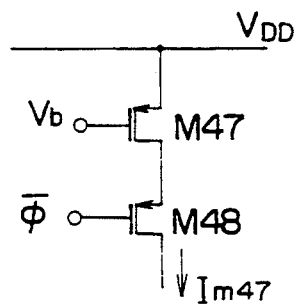

The constant current source circuit of the fifth embodiment shown in FIG. 38B is constituted by a series circuit including transistors M47 and M48 comprised of two p-channel FETs. A fixed bias voltage Vb is applied to the gate of the transistor M47 to prescribe the value of a current flowing when the transistor M48 is turned ON, and to apply an inverted signal of the control signal $\phi$ to the gate of the transistor M48. Thus, when the transistor M48 is turned ON, a constant current Im47 is provided from the transistor M47.

Figure 38C:
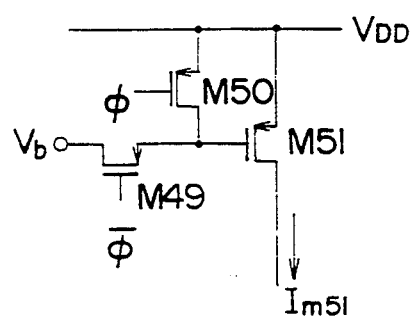

The circuit of a sixth actual example shown in FIG. 38C comprises transistors M49 to M51 comprised of three p-channel FETs. A constant voltage Vb is applied to the drain (or source) of the transistor M49, and an inverted signal of the control signal $\phi$ is applied to the gate thereof. The source (or drain) of the transistor M49 is connected to the gate of the transistor M51, and a voltage Vb is applied to the gate of the transistor M51 when the transistor M49 is turned ON. Thus, the transistor M51 is turned ON, so a constant current Im51 is provided from the transistor M51.

The source/drain of the transistor M50 are is connected to the source/gate of the transistor M51, and a control signal $\phi$ is applied to the gate of the transistor M50. Thus, the transistor M50 is turned ON when the transistor M49 is in OFF state. By allowing the transistor M49 to be turned ON, the gate of the transistor M51 is maintained at "H" (high level) by the power supply, so the transistor M51 is turned OFF.

FIGS. 38B and 38C show the circuits according to the fifth and sixth actual examples in which the switch SW17 is an analog switch comprised of transistors M48 and M49.

Figure 38D:
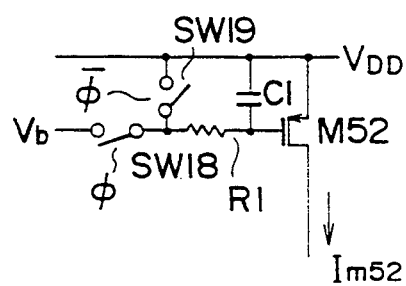

The circuit of the seventh actual example shown in FIG. 38D includes switches SW18 and SW19 corresponding to the switch SW17, a transistor M52 comprised of a p-channel FET, and a time constant circuit comprised of a resistor R1 and a capacitor C1.

A constant voltage Vb is applied to the gate of the transistor M52 through the resistor R1 and the switch SW18 in series, and the switch SW18 is subjected to the control signal $\phi$. The transistor M52 is turned ON when the switch SW18 is in the ON state, whereby a constant voltage Vb is applied to the gate of the transistor M52 through the resistor R1, so that transistor is turned ON. Thus, a constant current Im52 is provided from the transistor M52.

The capacitor C1 is connected between the source and the gate of the transistor M52, and the transistor M52 is turned ON and OFF in accordance with a time constant determined by the resistor R1 and the capacitor C1.

The switch SW19 is connected in parallel with the capacitor C1 with the resistor R1 located therebetween, and is subjected to ON/OFF control by an inverted signal of the control signal $\phi$. Thus, the switch SW19 is turned ON when the switch SW18 is in the OFF state. By allowing the switch SW18 to be turned ON, the gate of the transistor M52 is maintained at "H" by the power supply. Thus, the transistor M52 is turned OFF, so the current Im52 is interrupted.

In the circuit of the seventh actual example which has been described, since the rise and fall of the current Im52 obtained from the transistor M52 are allowed to be gentle by the time constant circuit, an employment of this circuit can prevent the output current driving capability of the buffer circuit from suddenly changing.

Figure 38E:
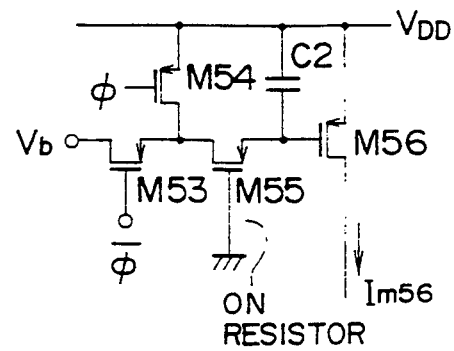

The circuit shown in FIG. 38E is directed to the eighth actual example where the switches SW18 and SW19 and the resistor R1 of the circuit of the seventh actual example shown in FIG. 38D are composed of transistors.

The circuit of the eighth actual example comprises transistors M53 to M56 comprised of a p-channel FET and a capacitor C2. The transistor M53 is constructed so that it is subjected to ON/OFF control by an inverted signal of the control signal $\phi$. This transistor M53 corresponds to the switch SW18. Further, the transistor M54 is constructed so that it is subjected to ON/OFF control by the control signal $\phi$. This transistor M54 corresponds to the switch SW19. The transistor M55 is such that its gate is connected to the ground to serve as an ON-resistance. This transistor M55 corresponds to the resistor R1. In addition, a voltage Vb is applied to the gate of the transistor M56 through the transistor M55. Thus, the transistor M55 is turned ON.

The capacitor C2 is connected between the source and the gate of the transistor M56, which corresponds to the capacitor C1. Thus, when the transistor M53 is turned ON, a current Im56 from the transistor M56 rises or falls in accordance with a time constant determined by the ON-resistance value of the transistor M55 and the capacitor C2.

The transistor M54 is connected in parallel with the capacitor C2 with the transistor M55 connected therebetween. This transistor M54 is turned ON when the transistor M53 is in the OFF state to allow the gate of the transistor M56 to be maintained at "H" by the power supply, thus causing the transistor M56 to be turned OFF.

Figure 39A:
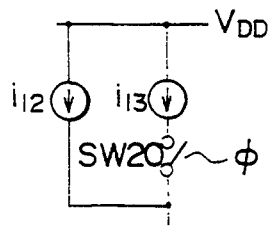
FIGS. 39A to 39C show actual examples of combination of the first and second bias circuits.
Figure 39B:
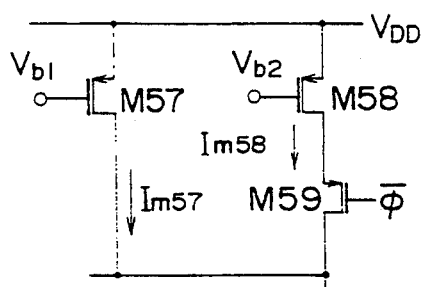
Figure 39C:
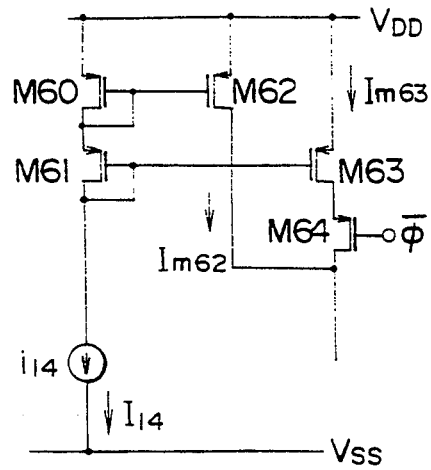

FIGS. 39A to 39C show the ninth to eleventh actual examples of the circuit in which the first and second bias circuits are combined.

FIG. 39A is a circuit diagram of the ninth actual example shown at the same level as that of FIGS. 4, 5 and 35, and FIGS. 39B and 39C show the circuits of the tenth and eleventh actual examples, respectively.

The circuit shown in FIG. 39B includes transistors M57 to M59 comprised of a p-channel FET. A constant voltage Vb1 is applied to the gate of the transistor M57, and a constant current Im57 is provided at all times from the transistor M57. A constant voltage Vb2 is applied to the gate of the transistor M58, and the transistor M59 is connected in series with the transistor M58. An inverted signal of the control signal $\phi$ is applied to the gate of the transistor M59, a constant current Im58 is provided only when the transistor M59 is turned ON. The transistor M57 constitutes a first bias circuit, and transistors M58 and M59 constitute a second bias circuit.

In accordance with this configuration, by varying W/L of the transistors M58 and M59 and the constant voltages Vb1 and Vb2, current source circuits having output current values different from each other can be realized.

The circuit shown in FIG. 39C includes transistors M60 to M64 comprised of a p-channel FET and a constant current source circuit i14. This circuit further includes a current mirror circuit in which the transistor M60 serves as the reference current input terminal and the transistor M62 serves as the output terminal, and a current mirror circuit in which the transistor M61 serves as the reference current input terminal and the transistor M63 serves as the output terminal. The transistors M60 and M61 are connected in series and are both supplied with a current I14 from the constant current source circuit i14 as the reference current.

The transistor M64 is connected in series with the transistor M63, and a series circuit thereof is connected in parallel with the transistor M62. Thus, a current Im62 is provided at all times from the transistor M62, and a constant current Im63 is provided from the transistor M63 when the switch M64 is turned ON.

An amplifier circuit according to an eighth embodiment of this invention will now be described with reference to FIG. 40.

Figure 40:
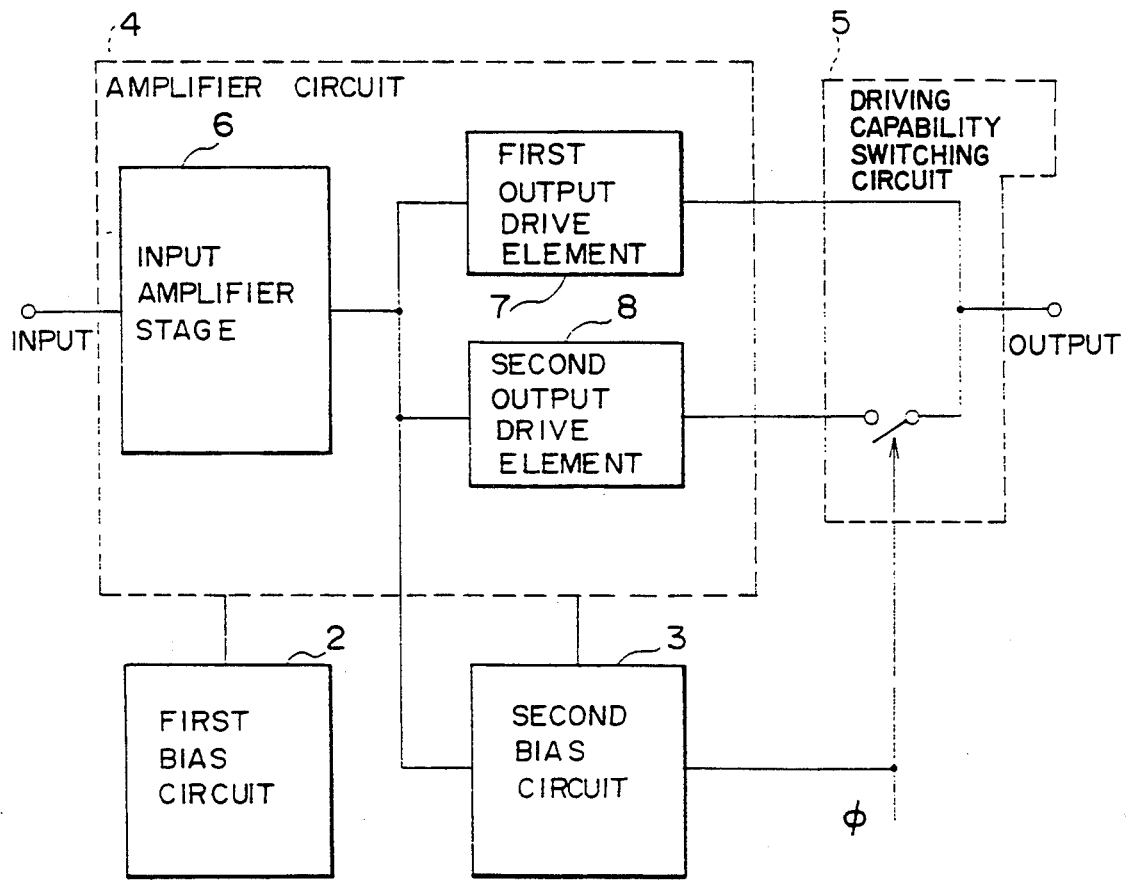
FIG. 40 is a block diagram showing an amplifier circuit according to an amplifier circuit according to an eighth embodiment, which is directed to an amplifier device according to the first aspect of this invention to control the second bias circuit by a control signal from the external and to determine a bias current from the second bias circuit by an output from the input amplifier stage.

FIG. 40 is a block diagram of an amplifier circuit of the eighth embodiment adapted to generate a bias current of the second bias circuit by using an output from the input amplifier stage 6 in the block diagram of the circuit according to the seventh embodiment of this invention shown in FIG. 34.

The circuit of the eighth embodiment shown in FIG. 40 is directed to the circuit in which a periodically changing signal is used as an input signal. This circuit comprises an amplifier circuit 4, a first bias circuit 2, a second bias circuit 3 adapted so that its bias current is determined by an output from the input amplifier stage 6 in the amplifier circuit 4, and the connection to the amplifier circuit 4 is subjected to ON/OFF control by an external control signal, and a driving capability switching circuit 5 for switching the connection between the second output drive elements in the amplifier circuit 4.

In the seventh embodiment of FIG. 34, since the control signal is given, e.g., at the timing where a periodically changing input signal varies by a periodic pulse synchronized with the input signal, even in the case where the potential change is small and therefore no enhancing was necessary, the output current driving capability was enhanced for a fixed time period controlled by the control signal.

In the circuit shown in FIG. 40, since the bias current of the second bias circuit 3 is determined in accordance with the magnitude of the change of the output potential or the output current of the input amplifier stage 6, in the case where the potential change of an input signal is small and it is therefore not necessary to enhance the output current driving capability for an entire time period of an external control signal given, since the output change of the input amplifier stage 6 is also small, the rate of enhancing the output current driving capability becomes small. Thus, a lower power consumption can be realized without unnecessarily enhancing the output current driving capability.

Figure 41:
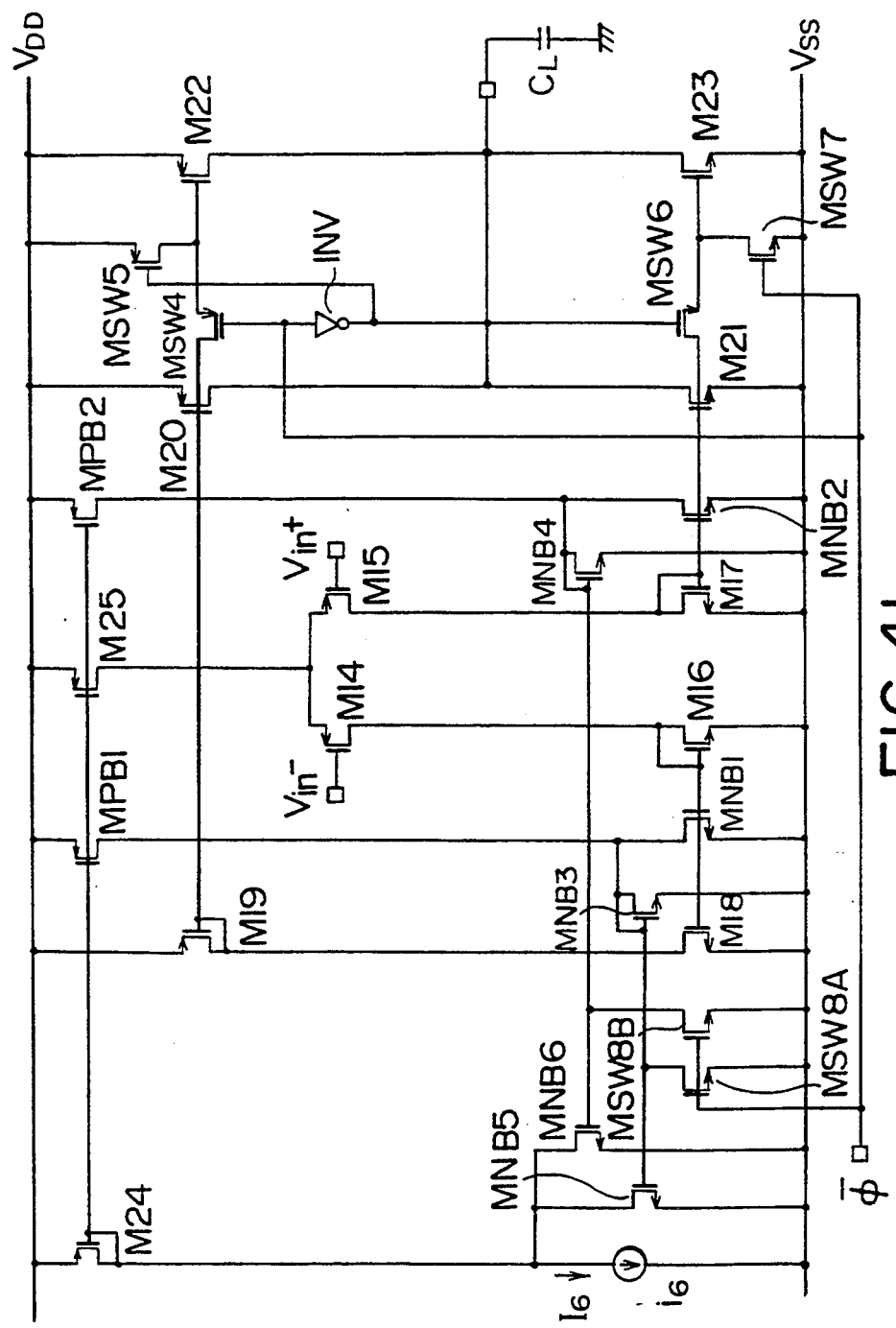
FIG. 41 is a circuit diagram showing an actual example of an amplifier circuit according to the eighth embodiment shown in the block diagram of FIG. 40.

FIG. 41 shows an actual example of the circuit of an eighth embodiment shown in FIG. 40.

The circuit shown in FIG. 41 is directed to the example of the eighth embodiment for determining a bias current of the second bias circuit shown in FIG. 34 by an output current of the input amplifier stage. The transistors SW4 to SW7 are comprised of transistors MSW4 to MSW7, respectively. The second bias circuit is comprised of transistors MPB1, MPB2, MNB1 to MNB6, MSW8A, and MSW8B. Respective (W/L) factors of the transistors are set as follows:

$$(W/L)_{MPB1}/(W/L)_{M25} \geq [(W/L)_{MNB1}/(W/L)_{M16}]/2, \text{ or}$$

$$(W/L)_{M25} \leq [(W/L)_{MNB2}/(W/L)_{M17}]/2$$

In the case where the transistors MSW8A and MSW8B are turned OFF by the control signal, when the potential Vin+ is lower than the potential Vin−, the drain potential of the transistor MNB2 becomes substantially equal to $V_{SS}$. As a result, no current flows in the transistors MNB4 and MNB6, but the drain current of the transistor MPB1 becomes larger than the drain current of the transistor MNB1. Thus, the bias current flows in the transistor MNB4 to a degree of an increase thereof. As a result, by the current mirror effect of the transistors MNB4 and MNB6, the above bias current is added to the bias current I6. Thus, the output current driving capability is increased. Also in the case where the potential Vin− is lower than Vin+, the output current driving capability is similarly increased. In both cases, when there results the state where the relationship expressed as Vin+=Vin− holds, the drain current of the transistor MPB1 and the drain current of the transistor MNB1, and the drain current of the transistor MPB2 and the drain current of the transistor MNB2 are equal to each other, respectively. As a result, no current flows in the transistors MNB3 and MNB4. Thus, there results only drain current I6 without undergoing addition, so there is no possibility that the output current is unnecessarily enhanced. Further, when the transistors MSW8A and MSW8B are turned ON by the control signal, the transistors MNB5 and MNB6 are in the OFF state at all times, so there is no possibility that the bias current increases. The operation of the transistors M22, M23, and MSW4 to MSW7 of the circuit shown in FIG. 41 is as described with reference to FIG. 29.

An amplifier circuit according to a ninth embodiment of this invention will now be described with reference to FIG. 42.

Figure 42:
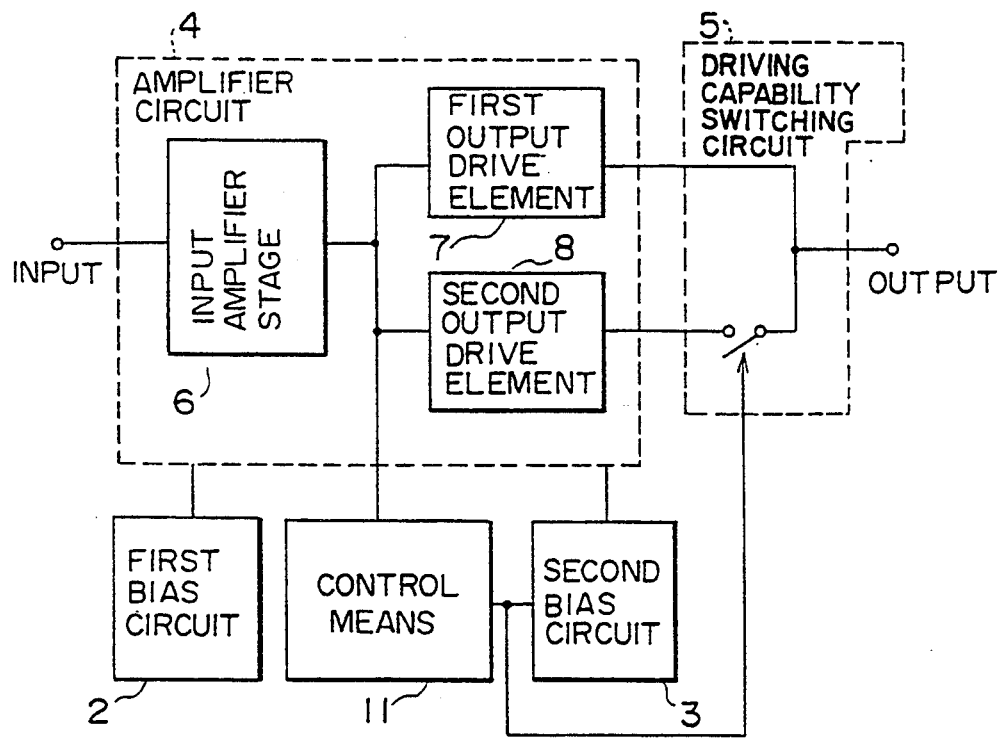
FIG. 42 is a block diagram showing an amplifier circuit according to a ninth embodiment, which is directed to an amplifier device according to the first aspect of this invention to control both the second bias circuit and the driving capability switching circuit by a control signal generated by using an output from the input amplifier stage.

FIG. 42 is a block diagram of the amplifier circuit according to the ninth embodiment adapted to control the output current driving capability by a control signal generated by using an output from the input amplifier stage according to this invention wherein, in the block diagram of the circuit of the sixth embodiment shown in FIG. 32, there is added a second bias circuit for delivering, to the switch 9, an output from the control means using an output from the input amplifier stage 6 and for adding a bias current to the amplifier circuit 4 by the output from the control signal generation means.

As described in the explanation of the circuit shown in FIG. 28, in the case where the potential change is small and it is therefore not necessary to enhance the output current driving capability, since the potential change or the current change of an output from the input amplifier stage 6, the amplifier circuit does not produce a control signal. Thus, a lower power consumption can be realized without unnecessarily enhancing the output current driving capability.

Figure 43:
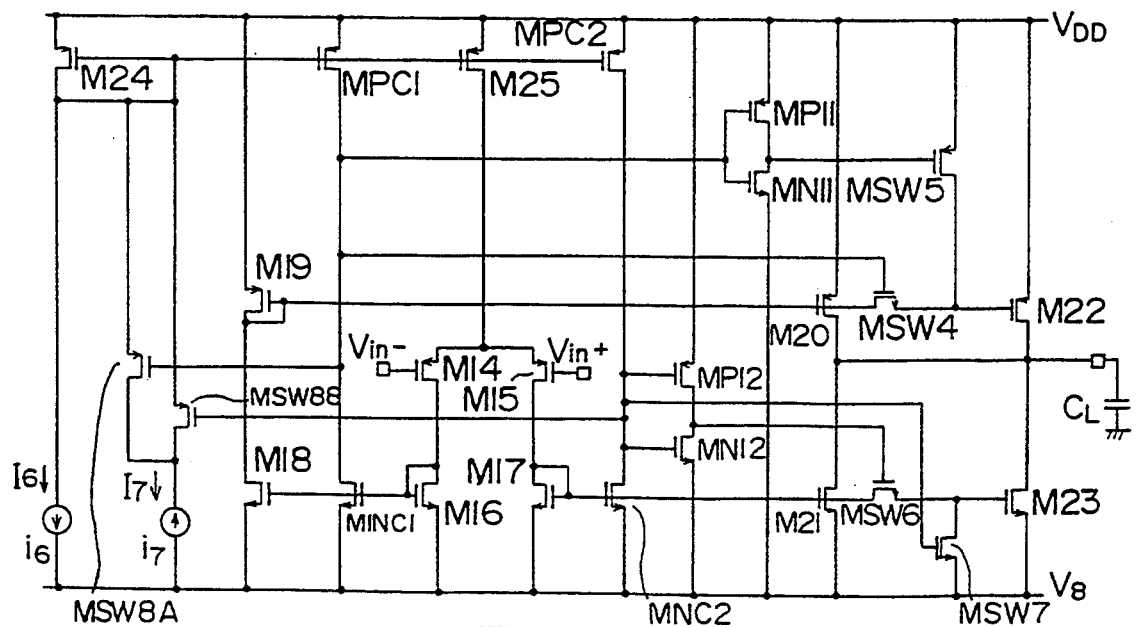
FIG. 43 is a circuit diagram showing a first actual example of an amplifier circuit according to the ninth embodiment shown in the block diagram of FIG. 42.

FIG. 43 shows an actual example of the circuit of the ninth embodiment shown in FIG. 42.

The circuit shown in FIG. 43 is directed to the example where a second bias circuit controlled by the control signal generation means is added in the circuit of the actual example of the sixth embodiment shown in FIG. 33. The second bias circuit is comprised of a current source i7 and transistors MSW8A and MSW8B. When the potential Vin− becomes higher than the potential Vin+ to some extent, the transistor MSW8A or MSW8B is turned OFF by a control signal generated by the control signal generation means comprised of transistors MPC1, MNc1, MPC2 and MNC2, thus to increase the bias current from I6 to I6+I7.

A tenth embodiment of this invention will now be described with reference to FIG. 44.

FIG. 44 is a block diagram showing a tenth embodiment in which the second bias circuit is constructed to determine a bias current by an output from the input amplifier stage 1a as in the eighth embodiment shown in FIG. 40.

By constructing the circuit as shown in this figure, the circuit commonly has the elements of the circuit of the ninth embodiment and the element of the circuit of the eighth embodiment shown in FIG. 40. Thus, a lower power consumption can be realized.

FIG. 45 shows an actual example of the circuit of the tenth embodiment shown in FIG. 44.

The circuit shown in this figure is directed to the actual example where, in the circuit shown in FIG. 43 taken as the actual example of the ninth embodiment, there is used a current source of which current value is determined by an output from the input amplifier stage 1a comprised of transistors M14 to M17 in place of the constant current source i7 as in the circuit of the eighth embodiment shown in FIG. 40. The current source of the second bias circuit is comprised of transistors MPC1, MPC2 and MNB1 to MNB6 as described in the explanation of the circuit shown in FIG. 41 taken as the actual example of the circuit of the eighth embodiment shown in FIG. 40. Thus, since this circuit commonly has the elements of the circuit of the ninth embodiment shown in FIG. 43 and the elements of the circuit of the eighth embodiment shown in FIG. 41, a lower power consumption can be realized.

Eleventh to ninteenth embodiments relating to an amplifier device for detecting a potential difference between the input and the output of the buffer circuit as the second aspect of this invention and several actual examples according to these embodiments will now be described in detail with reference to FIGS. 46 to 69.

FIG. 46.is a block diagram of a buffer circuit of the eleventh embodiment adapted to control the output driving capability by a potential difference between the input and the output according to the second aspect of this invention.

The buffer circuit of the eleventh embodiment shown in FIG. 46 is directed to the circuit in which a signal of which level non-periodically changes is used as an input signal. This circuit comprises an amplifier circuit 12 and a potential difference detection circuit 13.

The difference detection circuit 13 detects a potential difference between the input and the output of the amplifier circuit 12 to deliver a detection signal to the amplifier circuit. This potential difference detection signal acts to enhance the output current driving capability in a direction where the amplifier circuit 12 increases the output signal potential in accordance with the input signal potential when the input signal potential becomes larger than the output signal potential, and acts to enhance the output current driving capability in a direction where the amplifier 12 circuit decreases the output signal potential in accordance with the input signal potential when the input signal potential becomes smaller than the input signal potential.

Thus, when a scheme is employed such that when a difference between the input and the output is detected, the output current driving capability is increased, and when no potential difference between the out and the output is detected, the output current driving capability is decreased, and a buffer circuit having low power consumption and low slew rate can be realized.

Thus, in accordance with the buffer circuit of the eleventh embodiment, there is provided, as the means for increasing the operating current only when the level of an input signal varies, a simple circuit for detecting a potential difference between the input and the output such that when a potential difference between the input and the output exceeds a threshold value, it is turned ON to add its operating current to an output from the amplifier circuit 12, or to add that operating current to a bias current determining the current driving capability of the amplifier circuit 12. Thus, there is no possibility that the number of elements increases to a great degree and/or the circuit scale becomes large. Due to these results, the buffer circuit of this embodiment can be advantageously constructed as an IC.

FIG. 47 is a circuit diagram showing an actual configuration of the potential difference detection circuit shown in FIG. 46.

The potential difference detection circuit shown in this figure includes transistors M75 and M76.

The transistor M75 is comprised of an n-channel FET, and the transistor M76 is comprised of a p-channel FET. The gates of the both transistors M75 and M76 are connected to the input terminal of the amplifier circuit, and the sources thereof are connected to the output terminal of the amplifier circuit 12.

Thus, when a potential on the input terminal becomes higher than a potential on the output terminal, so the potential difference therebetween exceeds a threshold value between the gate and the source of the transistor 75, the transistor M75 is turned ON. On the other hand, when a potential on the input terminal becomes lower than a potential, so the potential difference therebetween exceeds a threshold value between the gate and the source of the transistor M76, the transistor M76 is turned ON. As a result, when the transistors M75 and M76 are turned ON, currents I75 and I76 corresponding to potential differences from the transistors M75 and M76, respectively.

When a potential on the input terminal becomes larger than a potential on the output terminal, so a potential difference therebetween is detected by the transistor M75, a current Im75 from the transistor M75 is added to an output current from the amplifier circuit. As a result, the output current driving capability is increased.

Furthermore, also in the case where a potential on the input terminal becomes lower than a potential on the output terminal, when a potential difference therebetween is detected by the transistor M76, a current Im76 from the transistor M76 is added to an output current from the amplifier circuit 12. As a result, the output current driving capability is increased.

As stated above, since a scheme is employed to increase the output current driving capability only when the potential difference between the input and the output is detected by the transistor M75 or M76, the buffer circuit having low power consumption and high slew rate characteristics can be provided.

FIG. 48 is a graphical representation of the slew rate characteristic. In this figure, reference symbol $W_1$ represents an input signal, reference symbol $W_2$ represents an output signal from the buffer circuit under the state of no control of the output driving capability based on detection of the potential difference, i.e., when only the amplifier circuit 12 is assumed to be provided, and reference symbol $W_3$ represents an output signal from the buffer circuit when the control according to the eleventh embodiment is carried out.

As indicated by $W_1$ in this figure, for a time period during which the potential difference voltage $V_{i0}$ between the input and the output is above the threshold voltage $V_{th1}$ as a result of the fact that the level of the input signal rises, the gradient of $W_3$ is greater than the gradient of $W_2$ by the action of the current Im75. on the other hand, when the voltage $V_{i0}$ falls below the threshold voltage $V_{ih1}$, the gradient of $W_3$ becomes equal to the gradient of $W_2$.

Similarly, for a time period during which the potential difference between the input and the output is above the threshold voltage $V_{th2}$ of the transistor M76 as a result of the fact that the level of the input signal falls, the gradient of $W_3$ is greater than the gradient of $W_2$ by the action of the current Im75. On the other hand, when the voltage $V_{i0}$ falls below the voltage $V_{th2}$, the gradient of $W_3$ becomes equal to the gradient of $W_2$.

FIG. 49 is a circuit diagram showing a second actual example in a more practical manner of the circuit shown in FIG. 47.

In FIG. 49, transistors M77 to M84 correspond to the amplifier circuit 12, and constitute a voltage-follower using a one stage operational amplifier.

The transistors M77 and M78 are comprised of a p-channel FET, and the gate of the transistor M77 is connected to the output terminal and the gate of the transistor M78 is connected to the input terminal.

The transistors M75 and M76 are such that their gates are connected commonly to the input terminal, i.e., the gate of the transistor M78, and their sources are connected commonly to the output terminal. Thus, this circuit serves to detect a potential difference between the input and the output as a gate between the gate and the source.

In the circuit of the second actual example of the eleventh embodiment thus constructed, when a potential difference between the input and the output is equal to zero, the transistors M75 and M76 are both in the OFF state. In this case, there results only a current consumption of the amplifier circuit 12 determined by the current I15. When the input potential exceeds the output potential, as long as the potential difference between the input and the output is above the threshold level of the transistor M75, the transistor M75 is turned ON. As a result, a current Im75 flowing therein is added to an output current from the amplifier circuit 12. The current thus obtained flows into the capacitive load CL. Thus, the rising of the output potential becomes faster accordingly.

On the other hand, when the input potential becomes lower than the output potential, as long as a potential difference between the input and the output is above the threshold level of the transistor M76, that transistor M76 is turned ON. As a result, a current Im76 flowing therein is added to an output current from the amplifier circuit 12, thus to hasten the capacitive load to be discharged. Accordingly, the falling of the output potential is quickened.

FIG. 50 is a circuit diagram showing a twelfth embodiment of a buffer circuit adapted so that a level-shifted input signal is applied to the transistors M75 and M76.

The circuit shown in this figure include level shift circuits v1 and v2 added to the circuit of the actual example of the eleventh embodiment shown in FIG. 47. The level shift circuit v1 is inserted in series between the input terminal and the gate of the transistor M75 with the positive terminal being in the gate side. Further, the level shift circuit V2 is inserted in series between the input terminal of the amplifier circuit 12 and the gate of the transistor M76 with the negative terminal being on the gate side.

Accordingly, input signals level-shifted by V1 and V2 are applied to the transistors M75 and M76, respectively. Thus, there results the state where the threshold levels of the transistors M75 and M76 are seemingly dropped.

Thus, even when the voltage $V_{i0}$ between the input and the output falls below the threshold voltage $V_{th1}$ or $V_{th2}$, the transistors M75 and M76 are in the ON state for a time period prolonged by a time period during which the input signal is level-shifted. As a result, the output current driving capability can be maintained in an enhanced state for a longer time by a time period corresponding to the above as compared to the circuit of FIG. 47.

FIG. 51 is a graphical representation of a curve of the twelfth embodiment. In this figure, reference symbol W4 represents a characteristic of an output signal according to the twelfth embodiment, and others correspond to those of FIG. 48, respectively.

As indicated by the curve W4, even if the voltage $V_{i0}$ falls below the threshold voltage $V_{th}$, the transistors M75 and M76 continue to be in the ON state for a longer time by a time period during which the input level is incrased by the level shift voltages V1 and V2. Thus, high slew rate is maintained for this time period.

As stated above, in accordance with the buffer circuit of the twelfth embodiment, an approach is employed to shift any of signal potentials of the input and output signals in a direction allowing the potential of the input signal to become close to the threshold value to apply the signal potential thus shifted to the potential difference detection circuit, thereby causing the threshold value to be seemingly small. As a result, the state where the potential difference between the input and the output is above the threshold value is maintained for a longer time accordingly. Thus, a higher slew rate can be provided.

FIG. 52 is a circuit diagram showing a first actual example of the circuit of the twelfth embodiment shown in FIG. 50.

The circuit shown in this figure corresponds to the circuit in which a transistor M87 comprised of an n-channel FET, a transistor M88 comprised of a p-channel transistor, and constant current source circuits i17 and i18 are added to the circuit of the actual example of the eleventh embodiment shown in FIG. 49.

The transistor M87 and the constant current source circuit i17 correspond to the level shift circuit v1 shown in FIG. 47, and the transistor M88 and the constant current source circuit i18 correspond to the level shift circuit v2.

Namely, the gate/drain of the transistor M87 are connected commonly to the constant current source circuit i17, and are connected to the transistor M75 in parallel with the constant current source circuit i17. The source of the transistor M87 is connected to the input terminal. Thus, an input signal is input to the gate of the transistor M75 through the gate/source of the transistor M87 in series. The input signal thus input is level-shifted in a higher potential direction by the voltage between the gate and the source of the transistor M87, and is then applied to the transistor M75.

Further, the gate/drain of the transistor M88 are connected commonly to the constant current source circuit i18, and is connected to the transistor M76 in parallel with the constant current source circuit i18. The source of the transistor M88 is connected to the input terminal. Thus, an input signal is input to the gate of the transistor M76 through the gate/source of the transistor M88 in series. The input signal thus input is level-shifted in a lower potential direction by the voltage between the gate and the source of the transistor M88, and is then applied to the transistor M76.

Thus, even if the voltage $V_{i0}$ between the input and the output falls below the threshold voltages $V_{th1}$ and $V_{th2}$, the transistors M75 and M76 maintain the ON state for a longer time in proportion to the degree of the level shift of the voltages VGS87 and VGS88. As a result, a high slew rate can be provided.

FIG. 53 is a circuit diagram showing a second actual example of the circuit of the twelfth embodiment.

The circuit shown in FIG. 53 corresponds to the circuit in which a transistor M88 comprised of an n-channel FET, a transistor M87 comprised of a p-channel transistor, and constant current source circuits i17 and i18 are added to the circuit of the circuit shown in FIG. 49.

The transistor M87 and the constant current source circuits i17 and i18 correspond to the level shift circuit v1 shown in FIG. 50, and the transistor M88 and the constant current source circuit i18 correspond to the level shift circuit v2.

The drain of the transistor M87 is connected to the ground terminal GND, the source thereof is connected to the constant current source circuit i17, and the gate thereof is connected to the input terminal. Further, the gate of the transistor M75 is connected to the source of the transistor M87. Thus, an input signal is input to the gate of the transistor M75 through the gate/source of the transistor M87 in series, The input signal thus input is level-shifted in a higher potential direction in proportion to the voltage VGS87 between the gate and the source of the transistor M87, and is then applied to the transistor M75.

Further, the drain of the transistor M88 is connected to the power supply terminal VDD, the source thereof is connected to the the constant current source circuit i18, and the gate thereof is connected to the input terminal. Further, the gate of the transistor M76 is connected to the source of the transistor M88. Thus, an input signal is input to the gate of the transistor M76 through the gate/source of the transistor M88 in series. The input signal thus input is level-shifted in a lower potential direction in proportion to the voltage between the gate and the source of the transistor M88, and is then applied to the transistor M76.

Thus, even if the voltage $V_{i0}$ between the input and the output falls below the threshold voltages $V_{th1}$ and $V_{th2}$, the transistors M75 and M76 maintain the ON state for a longer time in proportion to the degree of the level shift of the voltages VGS87 and VGS88. As a result, a high slew rate can be provided.

FIG. 54 is a circuit diagram showing a thirteenth embodiment of a buffer circuit constructed to apply a level-shifted input signal to the transistors M75 and M76.

The circuit of the thirteenth embodiment shown in FIG. 54 includes two constant voltage source circuits v3 and v4. These constant voltage source circuits form a series circuit in which the negative terminal of the constant voltage source circuit v3 and the positive terminal of the constant voltage source circuit v4 are commonly connected.

An input signal is input to the gate of the transistor M75 as it is. The positive terminal of the constant voltage source circuit v3 is connected to the gate of the transistor M75, the common junction of the constant voltage source circuit v3 and the constant voltage source circuit v4 is connected to the input terminal of the amplifier circuit 12, and the negative terminal of the constant voltage source circuit v4 is connected to the gate of the transistor.

By constructing the circuit in this way, a signal level-shifted in a lower potential direction in proportion to a value obtained by subtracting the voltage V3 from the potential Vi of the input signal is input to the input terminal of the amplifier circuit 12. Thus, the output potential of the amplifier circuit 12 will follow the difference voltage (Vi−V3).

On the contrary, since the potential Vi of the input signal is applied to the gate of the transistor M75 as it is, a level shift of the voltage V3 will be given as the voltage between the gate and the source of the transistor M75.

Further, since a signal level-shifted in a lower potential direction by a voltage obtained by subtracting the sum of the voltages V3 and V4 of the constant voltage source circuits v3 and v4 from the potential Vi is applied to the transistor M76, a level shift expressed as (Vi−V3)−(Vi−V3−V4)=V4 will be given as the voltage between the gate and the source of the transistor M76.

While there is employed in the circuit of the thirteenth embodiment shown in FIG. 54 the circuit configuration that an input is applied to the positive side of the constant current source circuit v3, if there is employed a circuit configuration such that an input is applied to the negative side of the constant current source V4, similar effects and/or advantages can be provided.

FIG. 55 is a circuit diagram showing an actual example of the circuit shown in FIG. 54.

The circuit shown in this figure corresponds to the circuit in which a transistor comprised of an n-channel FET, a transistor comprised of a p-channel FET, and a constant current source circuit i16 are added to the circuit of the second actual example of the eleventh embodiment shown in FIG. 49.

The transistor M85 corresponds to the constant voltage source circuit v3 of FIG. 54 and the transistor M86 corresponding to the constant voltage circuit v4 of the same figure.

The gate of the transistor M85 is connected to the input terminal, and the source thereof is connected to the gate of the transistor M78 constituting the input terminal of the amplifier circuit 12. An input signal level-shifted in a lower potential direction by a voltage obtained by subtracting the voltage VGS85 between the gate and the source of the transistor M85 from the potential Vi of the input signal is input to the gate of the transistor M78.

The gate of the transistor M75 and the gate of the transistor M85 are connected commonly to the input terminal, and an input potential Vi is inputted as it is.

Further, the gate and the drain of the transistor M85 are connected commonly to the gate of the transistor M76, and the source of the transistor M86 is connected to the source of the transistor M85. An input signal level-shifted in a lower potential direction by voltages VGS85 and GS86 between the gate and the source of the transistors M85 and M86 is input to the gate of the transistor M76.

Thus, the output potential corresponding to the gate potential of the transistor M77 follows the potential (Vi−VGS85). As a result, the gate potential of the transistor M75 becomes equal to Vi, and the gate potential of the transistor 76 becomes equal to (Vi−VGS85−VGS86). For this reason, a voltage level-shifted in a higher potential direction by the voltage VGS85 from the potential Vi is given as the voltage between the gate and the source of the transistor M75, and a voltage level-shifted in a lower potential direction by the voltage VGS86 with respect to the potential Vi is given as the voltage between the gate and the source.

FIG. 56 is a circuit diagram showing a fourteenth embodiment of a buffer circuit constructed so that the drain current is used as the second output of the transistors M75 and M76.

Attention is now drawn to the most elementary circuit of the eleventh embodiment shown in FIG. 56. In the circuit shown in this figure, source currents of the respective transistors M75 and M76 are used as the output. In the circuit shown in FIG. 56, not only the source current is added as an output current from the amplifier circuit 12, but also the drain current is added to a bias current determining the output current driving capability of the amplifier circuit.

In accordance with this configuration, since the output current driving capability of the amplifier circuit 12 increases in dependency upon a potential difference between the input and the output, the output current driving capability can be further improved.

FIG. 57 is a circuit diagram showing a first actual example of the circuit of the fourteenth embodiment shown in FIG. 56.

In this circuit, transistors M89 to M96 constitute an amplifier circuit 12 using the known operational amplifier of the two-stage structure as the voltage-follower.

The drain of the transistor M75 is connected to the bias current input terminal determining the output current driving capability of the amplifier circuit 12 of the transistor. Thus, when the transistor M75 is turned ON, the drain current is also added to the bias current I19 determining the output current driving capability of the amplifier circuit 12. The current thus obtained is delivered to the transistor M94.

Further, transistors M971 and M981 constitute a current mirror circuit in which the transistor M971 serves as the reference input terminal and the transistor M981 serves as the output terminal, and the drain current of the transistor M76 is delivered to the transistor M971 as a reference current. The drain of the transistor M981 is connected to the bias current input terminal of the transistor M94. When the transistor M76 is turned ON, its drain current Im76 (=Im981) is also added the bias current I19 determining the output current driving capability of the amplifier circuit 12. The current thus obtained is delivered to the transistor M94.

The circuit of the first actual example thus constructed operates as follows.

First, in the case where the relationship expressed as Vi>V0 holds and the potential difference between the input and the output is above the threshold level of the transistor M75, the transistor M75 is turned ON. As a result, its drain current is added to the bias current I19. The current thus obtained is delivered to the transistor M94. Thus, the output current driving capability is enhanced accordingly. Since it is of course that the source current Im75 of the transistor is also added to the output current, the output current driving capability of the amplifier circuit 12 is increased or enhanced to such an extent that the drain current of the transistor M75 is used as compared to the configuration in which the drain current of the transistor M75 is not used. Further, in the case where the relationship expressed as Vi<V0 holds and the potential difference $V_{i0}$ is above the threshold level of the transistor M76, the transistor M76 is turned ON. Its drain current is turned back as the drain current Im981 by the current mirror circuit comprised of transistors M971 and M981 and is added to the bias current I19. The current thus obtained is delivered to the transistor M94. Thus, the output current driving capability of the amplifier circuit 12 increases in accordance with the current Im98 being enhanced. Since it is of course that the source current Im76 of the transistor M76 is also added to the output current, the output current driving capability is enhanced to such an extent that the drain current of the transistor M76 is used, as compared to the configuration of FIG. 45 in which the drain current of the transistor M76 is not used.

FIG. 58 is a circuit diagram showing a second actual example of the circuit of the fourteenth embodiment shown in FIG. 56.

In the circuit shown in this figure, the drain of the transistor M76 and the drain of the transistor M89 are commonly connected.

In the circuit shown in this figure, the drain current of the transistor M76 is caused to flow into the drain of the transistor M89 through the current mirror circuit comprised of transistors M971 and M981 and the current mirror circuit comprised of transistors M94 and M93.

The fourteenth embodiment is characterized in that an approach is employed to directly add the drain current of the transistor M76 at the drain of the transistor M89. In this case, the current mirror circuit comprised of transistors M971 and M981 may be omitted.

FIG. 59 is a graphical representation showing the operation of the circuit shown in FIG. 58 wherein reference symbol W5 represents an input signal waveform diagram, reference symbol W6 represents an output signal waveform of the circuit of the section only corresponding to the amplifier circuit 12, and reference symbol W7 represents an output signal waveform when the means for enhancing the output current driving capability is added to the amplifier circuit 12.

FIG. 60 is a circuit diagram showing a fifteenth embodiment of a buffer circuit for delivering a level-shifted input signal to the potential difference detection circuit.

The circuit shown in this figure shows the example where the level shift means as shown in FIG. 52 is added to the circuit shown in FIG. 56. Also by this circuit, effects and/or advantages equivalent to those of the circuit shown in FIG. 52 can be provided. In addition, the output current driving capability is further improved to such an extent that the driving capability of the amplifier circuit 12 is enhanced.

FIG. 61 is a circuit diagram showing a first actual example of the fifteenth embodiment shown in FIG. 60. It is to be noted that this circuit is of the type corresponding to the circuit of the thirteenth embodiment shown in FIGS. 54 and 55.

In FIG. 61, transistors M97 and M98 constitute level shift means. The transistor M97 is comprised of an n-channel FET, and the transistor M98 is comprised of a p-channel FET.

An input signal dropped by the voltage VGS97 between the gate and the source of the transistor M97 is applied to the gate of the transistor M89 constituting the input terminal of the amplifier circuit 12, and the potential $V_0$ of the output signal of the amplifier circuit 12 follows a voltage ($V_i$−VGS97) obtained by subtracting the voltage VGS97 from the potential $v_i$ of the input signal.

Since the potential $V_i$ of the input signal is applied to the transistor M75 as it is, a level shift of the voltage VGS97 is given as the voltage between the gate and the source of the transistor M75.

Further a voltage dropped by the voltage (VGS97+VGS98) obtained by adding the voltage VGS97 and the voltage VGS98 between the gate and source of the transistor M98 is applied to the transistor M76. For this reason, a level shift expressed as ($V_i$−VGS97)−($V_i$−VGS97−VGS98)=VGS98 is applied as the voltage between the gate and the source of the transistor M76.

FIG. 62 is a circuit diagram showing a second actual example of the circuit of the fifteenth embodiment shown in FIG. 60.

The circuit shown in this figure shows the circuit in which the rising characteristic is more improved as compared with the second actual example of the fourteenth embodiment shown in FIG. 58.

Attention is drawn to FIG. 59, showing the response characteristic of the circuit shown in FIG. 58. The rise waveform is different from the fall waveform, i.e., the state where the output current driving capability is enhanced does not last where a long time at the rise time as compared to the case at the hole time.

The reason therefor is as follows. At the rise time, current from the transistors M89 and M76 are charged and held by the phase compensation capacitor Cc. As a result the gate potential of the transistor M96 becomes high as compared to the normal case where there is no transistor M76, so the transistor M76 is turned OFF. When the current from the transistor M76 becomes equal to zero, the time change of a voltage across the capacitor Cc becomes slow. Accordingly, the rise of the gate potential of the transistor M96 becomes slow, the gate potential of the transistor M96 is maintained for a longer time at a high potential as compared to the ordinary case where there is no transistor M76. Thus the transistor M96 falls at a faster rate as compared to the case where there is no transistor M76.

On the contrary, at the fall time, a current obtained by adding of the drain current of the transistor M75 and the bias current I20 flows flows from the phase compensation capacitor Cc into the drain of the transistor M91 via the transistors M93, M90, M92 and M91. As a result, the gate potential of the transistor M96 immediately becomes close to a value in the vicinity of the ground potential. For this reason, the change of the output potential is equal to only the change of a voltage across the capacitor Cc. When transistor M75 is turned OFF, a current flowing from the capacitor Cc into the drain of the transistor M91 is reduced. The current thus reduced appears as the time change of the rise of the output potential as it is.

In view of this, in the circuit of a second actual example of the fifteenth embodiment shown in FIG. 62, a transistor M99 and a capacitor C1 are added as shown.

Namely, the transistor M99 is comprised of a p-channel FET, and is inserted between the gate of the transistor M94 and the transistors M93 and M95. In addition, its gate is connected to the ground line. Thus, the transistor M99 constitutes the ON resistance.

The capacitor C1 is connected in parallel with the transistor M99, and forms a time constant circuit together with the transistor M99.

In accordance with the above-mentioned configuration, the gate potentials of the transistors M93 and M95 determined by the drain current from the transistor M75 are held by the capacitor C1 only for a time period determined by the resistance value of the transistor M99. As a result, even if the transistor M75 is turned OFF, the voltages between the gate and the source of the transistors M95 and M93 are maintained at a high level accordingly. Thus, as indicated by $W_8$ in FIG. 63, the rising characteristic can be improved to a degree similar to that at the falling time.

FIG. 64 is a circuit diagram showing a third example of the fifteenth embodiment in the case where a known operational amplifier of the push-pull structure shown in FIG. 65 is used as the amplifier circuit 12.

In FIG. 65, transistors MA0 to MA9 constitute the operational amplifier wherein the transistors MA0 to MA3 thereof constitute a first drive stage, the transistors MA4 to MA7 constitute a second amplifier stage, and transistors MA8 and MA9 serve as an output drive element and constitute an output stage.

The constant current source circuit i24 biases the first amplifier stage, and the constant current source circuit i25 biases the second amplifier stage.

In such a configuration, when the relationship of the potential between the input and the output is expressed as $V_i V_0$, the transistor MA1 is turned ON and the transistor MA0 is turned OFF at the first amplifier stage, and the transistor MA5 is turned ON and the transistor MA6 is turned OFF at the second amplifier stage.

Thus, a current ImB1 from the transistor MB1 flows into the transistor MA1 side, and the gate potential of the transistor MA9 drops. As a result, the transistor MA9 is turned OFF.

Further, a current ImB3 from the transistor MB3 flows in the transistor MA5. In addition, the gate potential of the transistor MA8 drops, i.e., the gate-source voltage of the transistor MA8 becomes large. As a result, the transistor MA8 is turned ON.

Thus, a current from the transistor MA8 flows into the capacitive load CL, so the output potential rises.

On the other hand, when the relationship between the input and the output is expressed as $V_i < V_0$, the transistor MA0 is turned ON and the transistor MA1 is turned OFF at the first amplifier stage, and the transistor is turned ON and the transistor MA5 is turned OFF at the second amplifier stage.

Thus, a current from the transistor MB1 flows into the transistor MA0 side. As a result, the transistor MA9 is turned ON.

Further, a current ImB3 from the transistor MB3 flows into the transistor MA6. As a result, the transistor MA8 is turned OFF.

Thus, since the current flowing in the transistor MA9 promotes the capacitive load to be discharged, the output potential drops.

In FIG. 64, the transistors MB0 and MB1 and the constant current source circuit i22 constitute a bias circuit for the first amplifier stage, and the transistors MB2 and Mb3 and the constant current source circuit i23 constitute a bias circuit for the second amplifier stage.

Further, transistors MB4 to MB7 constitute means for detecting a potential difference between the input and the output.

When the relationship of the potential between the input and the output is expressed as $V_i > V_0$, in the case where the potential difference $V_{i0}$ between the input and the output is above the threshold level of the transistors MB4 and MB5, both transistors MB4 and MB5 are turned ON. As a result, both source currents thereof are added to an output current. Thus, the output current driving capability is enhanced.

Further, the drain current of the transistor MB5 flows into the capacitor C2. As a result, the voltage VGSA8 between the gate and the source of the transistor MA8 rises. Thus, the output current driving capability is enhanced.

In addition, the drain current of the transistor MB4 is added to the bias current of the first amplifier stage. As a result, the gate potential of the transistor MA9 is dropped fast, and the transistor MA9 is turned OFF quickly. Thus, the time period during which a through-current uselessly flows from the transistor MA8 to the transistor MA9 is shortened.

When the relationship of the potential between the input and the output is expressed as $V_i < V_0$, in the case where the potential difference $V_{i0}$ between the input and the output is above the threshold level of the transistors MB6 and MB7, both transistors MB6 and MB7 are turned ON. As a result, both source currents thereof are added to the output current. Thus, the output current driving capability is enhanced.

Further, the drain current of the transistor MB7 flows into the capacitor Cc. As a result, the voltage VGSA8 between the gate and the source of the transistor MA9 rises. Thus, the output current driving capability is enhanced. In addition, the drain current of the transistor MB6 is added to the bias current of the second amplifier stage. As a result, the gate voltage of the transistor MA8 is dropped fast, and the transistor MA8 is turned OFF quickly. Thus, the time period during which a through-current uselessly flows from the transistor MA8 to the transistor MA9 is shortened.

While it has been described in the above-described embodiments that the amplifier device is comprised of FET, the amplifier device according to this invention may be comprised of a controlled bipolar transistor as in the sixteenth embodiment shown in FIGS. 66 to 69.

The elementary circuit of the sixteenth embodiment shown in FIG. 66 has the same function as that of the circuit of the eleventh embodiment shown in FIG. 47.

Namely, the transistor Tr1 is comprised of bipolar npn type transistor, the base thereof is connected to the input terminal of the amplifier circuit 12, and the emitter thereof is connected to the output terminal of the amplifier circuit 12.

The transistor Tr2 is comprised of a bipolar pnp type transistor. The base thereof is connected to the input terminal of the amplifier circuit 12, and the emitter thereof is connected to the output terminal of the amplifier circuit 12.

In this configuration, when the input potential becomes larger than the output potential, so the potential difference between the input and the output exceeds the voltage between the base and the emitter (ordinarily approximately 0.6 to 0.7), the transistor Tr1 is turned ON. As a result, its emitter current is added to the output current. Thus, the output current driving capability is enhanced.

On the other hand, when the input potential becomes lower than the output potential, so the potential difference between the input and the output exceeds the voltage between the base and the emitter (ordinarily approximately 0.6 to 0.7) of the transistor Tr2, the transistor Tr2 is turned ON. As a result, its emitter current is added to the output current. Thus, the output current driving capability is enhanced.

The circuit of a seventeenth embodiment shown in FIG. 67 corresponds to the circuit of the twelfth embodiment shown in FIG. 50 wherein potential shift means v1 is inserted between the base of the transistor Tr1 and the input terminal 12, and potential shift means v2 is inserted between the base of the transistor Tr2 and the input terminal of the amplifier circuit 12.

The circuit of an eighteenth embodiment shown in FIG. 68 corresponds to the circuit of the fourteenth embodiment shown in FIG. 56 wherein collector currents of the transistors Tr1 and Tr2 are delivered as a control current for the amplifier circuit 12. The collector current of the transistor Tr1 acts in a manner that when the input potential rises above the output potential, the driving capability of the amplifier circuit 12 is enhanced, and the collector current of the transistor Tr2 acts in a manner that when the input potential falls below the output potential, the driving capability is enhanced.

The circuit of a nineteenth embodiment shown in FIG. 69 corresponds to the circuit of the fifteenth embodiment shown in FIG. 60. Namely, potential shift means v1 is inserted between the base of the transistor Tr1 and the input terminal of the amplifier circuit 12 of the eighteenth embodiment shown in FIG. 68, and potential shift means v2 is inserted between the base of the transistor Tr2 and the input terminal of the amplifier circuit 12.

The buffer circuit of a twentieth embodiment shown in FIG. 70 corresponds to the buffer circuit of the thirteenth embodiment shown in FIG. 54. The potential detection circuit is comprised of two bipolar transistors Tr1 and Tr2. This potential detection circuit further includes two constant voltage source circuits v3 and v4. These constant voltage source circuits form a series circuit in which the negative terminal of the constant voltage source circuit v3 and the positive terminal of the constant voltage source circuit v4 are commonly connected.

Since the operation of this circuit is similar to that of the corresponding thirteenth embodiment shown in FIG. 54 on the assumption that MOS transistors M75 and M76 are replaced by bipolar transistors Tr1 and Tr2, respectively, the description thereof will be omitted.

What is claimed is:

1. An amplifier, comprising:

current amplifier means, including an input amplifier stage and an output stage, for amplifying an input signal and generating an output current which is delivered to a capacitive load in accordance with changes in voltage of said input signal, said current amplifier means generating said output current for driving said capacitive load in response to a control bias current;

a terminal for receiving an external control signal having an ON state and an OFF state;

first bias means for continuously delivering to said current amplifier means a first bias current having a fixed value; and second bias means connected to said terminal for receiving said external control signal and connected in parallel with said first bias means for adding a second bias current to said first bias current as said control bias current when said external control signal is in said ON state, and said control bias current being only said first bias current when said external control signal is in said OFF state, wherein said external control signal enhances the output driving capability of said capacitive load.

2. The amplifier according to claim 1, wherein said second bias means responds to said external control signal to output said second bias current, and inputs a state of change of an output from said input amplifier stage in said current amplifier means to control a value of said second bias current by a change in potential in said input signal.

3. An amplifier, comprising:

current amplifier means, including an input amplifier stage and an output stage, for amplifying an input signal and generating an output current which is delivered to a capacitive load in accordance with changes in voltage of said input signal, said current amplifier means generating said output current for driving said capacitive load in response to a control bias current;

first bias means for continuously delivering to said current amplifier means a first bias current having a fixed value;

second bias means connected in parallel with said first bias means for adding a second bias current to said first bias current by an ON/OFF operation such that said control bias current, including said first and second bias current, is delivered to said current amplifier means and varies in magnitude in response to an internal control signal; and control means for receiving a state of change of an output from said input amplifier stage of said current amplifier means, and for generating said internal control signal in response thereto.

4. The amplifier according to claim 3, wherein said second bias means inputs said internal control signal and the state of change of the output from said input amplifier stage to control a value of said second bias current by the state of change of the output from said input amplifier stage.

5. An amplifier, comprising:

current amplifier means for amplifying an input signal and generating an output current in accordance with changes in voltage of said input signal, said current amplifier means including an input amplifier stage and a plurality of first to n-th, where n is an integer greater than or equal to 2, output stage drive elements each receiving a signal output from said input amplifier stage;

first bias means for continuously delivering a first bias current having a fixed value to said current amplifier means, an output current driving capability for said capacitive load being controlled by a control bias current including said first bias current;

a terminal for receiving an external control signal having an ON state and an OFF state; and driving capability switching means connected to said terminal for receiving said external control signal, said driving capability switching means carrying out switching between outputs from said plurality of output stage drive elements in said current amplifier means based upon whether said external control signal is in said ON state or said OFF state, thereby controlling the output current driving capability for said capacitive load to allow the output driving capability for said capacitive load of said output signal to have an improved slew rate and thereby controlling said current amplifier means;

wherein said driving capability switching means is operative to switch one or more of said plurality of output stage drive elements to drive said capacitive load in response to said external control signal.

6. The amplifier according to claim 5, wherein said amplifier device further comprises second bias means connected in parallel with said first bias means and connected to said terminal for adding a second bias current to said first bias current as said control bias current when said external control signal is in said ON state.

7. The amplifier according to claim 6, wherein said signal output from said input amplifier stage is delivered to said plurality of output stage drive elements and to said second bias means, thereby controlling a value of said second bias current by a change of said signal output from said input amplifier stage.

8. An amplifier, comprising:

current amplifier means for amplifying an input signal and generating an output current in accordance with changes in voltage of said input signal, said current amplifier means including an input amplifier stage and a plurality of first to n-th, where n is an integer greater than or equal to 2, output stage drive elements each receiving a signal output from said input amplifier stage;

first bias means for continuously delivering a first bias current having a fixed value to said current amplifier means such that said current amplifier means generates said output current for driving said capacitive load in response to a control bias current;

driving capability switching means for switching between outputs from said plurality of output stage drive elements in said current amplifier means, thus controlling, in an ON/OFF manner, the output current for driving said capacitive load; and control means for receiving a state of change of said signal output from said input amplifier stage to control said driving capability switching means to allow an output driving capability for said capacitive load of said output current to have an improved slew rate, thereby controlling said current amplifier means;

wherein said control means generates an internal control signal having an ON state and an OFF state, for allowing said driving capability switching means to switch one or more of said output drive elements to said capacitive load based on said ON state and said OFF state in accordance with the state of changes of said input signal of said input amplifier stage.

9. The amplifier according to claim 8, further comprising second bias means connected in parallel to said first bias means for delivering a second bias current included in said control bias current in cooperation with said first bias current when said internal control signal is in said ON state, to said current amplifier means.

10. The amplifier according to claim 9, wherein said signal output from said input amplifier stage is supplied to said plurality of output stage drive elements, said control means and said second bias means, thereby controlling a value of said second bias current by a change of said signal output from said input amplifier stage.

11. An amplifier, comprising:

a buffer circuit for amplifying an input signal and generating an output signal delivered to a capacitive load in accordance with changes in voltage of said input signal, said output signal changing according to a level change of said input signal; and potential difference detection means for determining a state of change of said input signal, and for delivering to said buffer circuit a bias current of different levels depending upon the state of change of said input signal to allow an output driving capability for said capacitive load of said output signal to have an improved slew rate, said potential difference detection means detecting whether or not a potential difference between said input and output signal is more than a predetermined threshold level.

12. The amplifier according to claim 11, wherein said potential difference detection means is comprised of a field effect transistor (FET) adapted to receive an input signal at a gate thereof and to receive an output signal at a source thereof, wherein when a potential difference between said input and output signal is more than said predetermined threshold level, said FET is turned ON for adding a source current to said output signal from said buffer circuit.

13. The amplifier according to claim 12, wherein a drain current of said FET is added to a bias current for determining the output current driving capability.

14. The amplifier according to claim 13, further comprising level shift means for shifting any one of a potential of said input signal and a potential of said output signal in a direction for allowing a difference in potential between said input signal and said output signal to become close to said predetermined threshold level and to deliver said difference in potential to said potential difference detection means.

15. The amplifier according to claim 11, wherein said potential difference detection means is comprised of a bipolar transistor having a base receiving an input signal and an emitter receiving an output signal, wherein when a potential difference between said input and output signal is greater than said predetermined threshold level, said bipolar transistor is turned ON for adding an emitter current to said output signal.

16. The amplifier according to claim 15, wherein a collector current of said bipolar transistor is added to a bias current for determining the output current driving capability of said buffer circuit.

17. The amplifier according to claim 16, wherein said buffer circuit comprises level shift means for shifting any one of a potential of said input signal and a potential of said output signal in a direction for allowing the potential of said input signal to become close to said predetermined threshold level to deliver said potential of said input signal to said potential difference detection means.

18. An amplifier, comprising:

current amplifier means, including an input amplifier stage and an output stage, for amplifying an input signal and generating an output current which is delivered to a capacitive load in accordance with changes in voltage of said input signal, said current amplifier means generating said output current for driving said capacitive load in response to a control bias current;

first bias means for continuously delivering to said current amplifier means a first bias current having a fixed value;

second bias means connected in parallel with said first bias means for adding a second bias current to said first bias current by an ON/OFF operation such that said control bias current, including said first and second bias current, is delivered to said current amplifier means and varies in magnitude in response to an internal control signal; and control means for receiving a state of change of an output from said input amplifier stage of said current amplifier means, and for generating said internal control signal in response thereto, wherein said second bias current is added to said first bias current and a sum of said first and second bias current is output as the control bias current only when a state of change of the output from said input amplifier stage is greater than a predetermined value.

19. The amplifier according to claim 1, wherein said input signal is sampled once for every fixed period of time, and said external control signal is in said ON state for a time duration corresponding to said fixed period of time.

20. The amplifier according to claim 5, wherein said driving capability switching means has a fixed period corresponding to a sampling period of said input signal.

* * * * *